(12) United States Patent
Ando et al.

(10) Patent No.: US 10,020,448 B2
(45) Date of Patent: Jul. 10, 2018

(54) METHOD FOR MANUFACTURING ORGANIC LIGHT-EMITTING DEVICE AND METHOD OF MANUFACTURING DISPLAY UNIT

(71) Applicant: JOLED INC., Tokyo (JP)

(72) Inventors: Makoto Ando, Tokyo (JP); Jun Yamaguchi, Tokyo (JP); Masanobu Tanaka, Tokyo (JP); Tomoo Fukuda, Tokyo (JP); Ryo Yasumatsu, Tokyo (JP); Toshio Fukuda, Tokyo (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/910,193

(22) PCT Filed: Sep. 3, 2014

(86) PCT No.: PCT/JP2014/073180
§ 371 (c)(1),
(2) Date: Feb. 4, 2016

(87) PCT Pub. No.: WO2015/041053
PCT Pub. Date: Mar. 26, 2015

(65) Prior Publication Data
US 2016/0181532 A1 Jun. 23, 2016

(30) Foreign Application Priority Data
Sep. 19, 2013 (JP) .................. 2013-194362

(51) Int. Cl.
*H01L 51/00* (2006.01)
*H01L 51/50* (2006.01)
(Continued)

(52) U.S. Cl.
CPC ...... *H01L 51/0019* (2013.01); *H01L 27/3211* (2013.01); *H01L 27/3246* (2013.01);
(Continued)

(58) Field of Classification Search
CPC ......... H01L 51/00; H01L 51/50; H01L 51/56; H01L 21/00; H01L 21/02; H01L 21/0019;
(Continued)

(56) References Cited

U.S. PATENT DOCUMENTS 6,690,109 B2 * 2/2004 Tada .................. H01L 27/3211
313/503
2003/0059975 A1 * 3/2003 Sirringhaus ............ B82Y 30/00
438/99
(Continued)

FOREIGN PATENT DOCUMENTS

| JP | 2005-078911 | 3/2005 |
| JP | 2006-156752 | 6/2006 |

(Continued)

OTHER PUBLICATIONS

International Search Report received in PCT/JP2014/073180, dated Nov. 25, 2014 (3 pages).
(Continued)

*Primary Examiner* — Chuong A Luu
(74) *Attorney, Agent, or Firm* — K&L Gates LLP

(57) ABSTRACT

There is provided a method of manufacturing an organic light-emitting device including: forming a first organic material layer on a substrate; and forming a mask in a first region on the first organic material layer, and then selectively removing the first organic material layer to form a first organic layer in the first region.

9 Claims, 59 Drawing Sheets

(51) Int. Cl.
  *H01L 27/32* (2006.01)
  *H01L 51/56* (2006.01)

(52) U.S. Cl.
  CPC ...... *H01L 51/0004* (2013.01); *H01L 51/0005* (2013.01); *H01L 51/0016* (2013.01); *H01L 51/504* (2013.01); *H01L 51/5012* (2013.01); *H01L 51/56* (2013.01); *H01L 2227/323* (2013.01); *H01L 2251/558* (2013.01)

(58) Field of Classification Search
  CPC ....... H01L 21/306; H01L 51/52; H01L 51/10; H01L 51/32; H01L 51/0016
  USPC .......................................................... 438/46
  See application file for complete search history.

(56) References Cited

U.S. PATENT DOCUMENTS

| | | | |
|---|---|---|---|
| 2007/0231467 A1 | 10/2007 | Takashima et al. | |
| 2008/0063851 A1* | 3/2008 | Jackman | B82Y 10/00 428/220 |
| 2010/0173553 A1 | 7/2010 | Tanaka et al. | |
| 2011/0171584 A1* | 7/2011 | Suh | H01L 51/0016 430/319 |
| 2012/0223633 A1 | 9/2012 | Yoshinaga et al. | |
| 2012/0276484 A1 | 11/2012 | Izumi et al. | |
| 2013/0126833 A1 | 5/2013 | Endo et al. | |
| 2013/0153873 A1* | 6/2013 | Watanabe | H01L 51/0007 257/40 |
| 2013/0187132 A1 | 7/2013 | Ando et al. | |
| 2013/0199445 A1 | 8/2013 | Sonoda et al. | |
| 2013/0323928 A1* | 12/2013 | Tanaka | G03F 1/24 438/694 |
| 2014/0212633 A1* | 7/2014 | Hwang | B41N 1/00 428/195.1 |
| 2014/0346533 A1* | 11/2014 | Andrews | H01L 25/0753 257/88 |
| 2015/0188098 A1* | 7/2015 | Kim | H01L 51/0016 438/34 |

FOREIGN PATENT DOCUMENTS

| | | |
|---|---|---|
| JP | 2007-257898 | 10/2007 |
| JP | 2010158799 | 7/2010 |
| JP | 2012-186021 | 9/2012 |
| JP | 2012-238580 | 12/2012 |
| JP | 2013-109920 | 6/2013 |
| JP | 2013-161670 | 8/2013 |
| WO | 2012/053402 | 4/2012 |

OTHER PUBLICATIONS

Japanese Office Action dated Jun. 20, 2017 in corresponding Japanese Application No. 2015-537635.

* cited by examiner

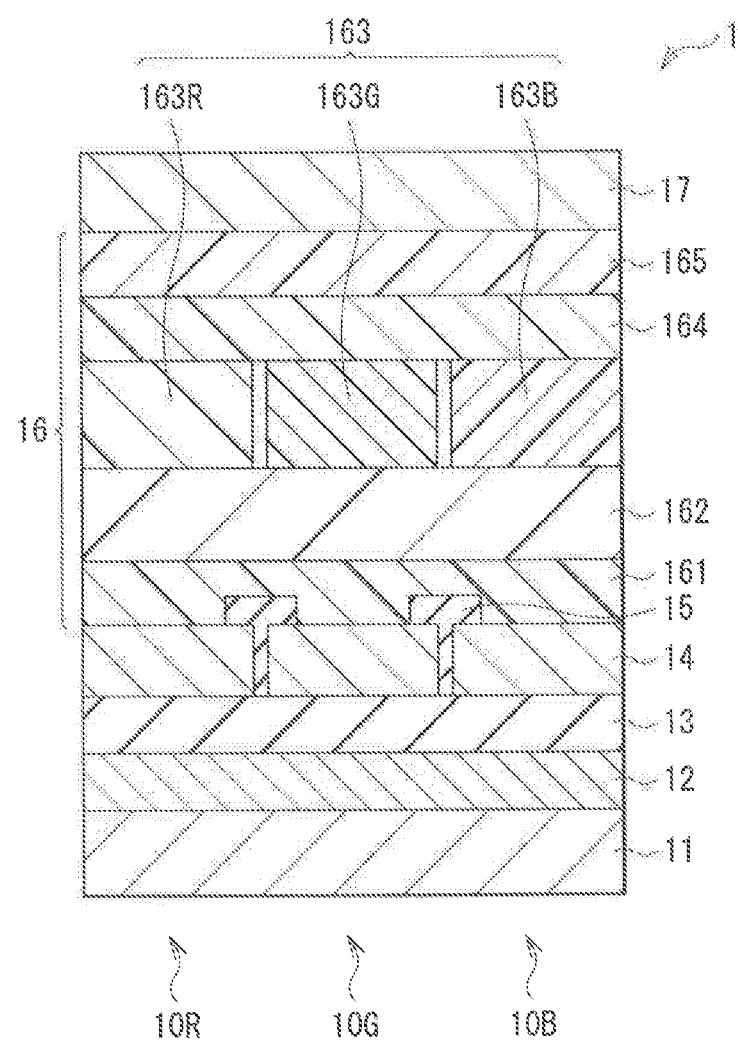

[FIG. 2]
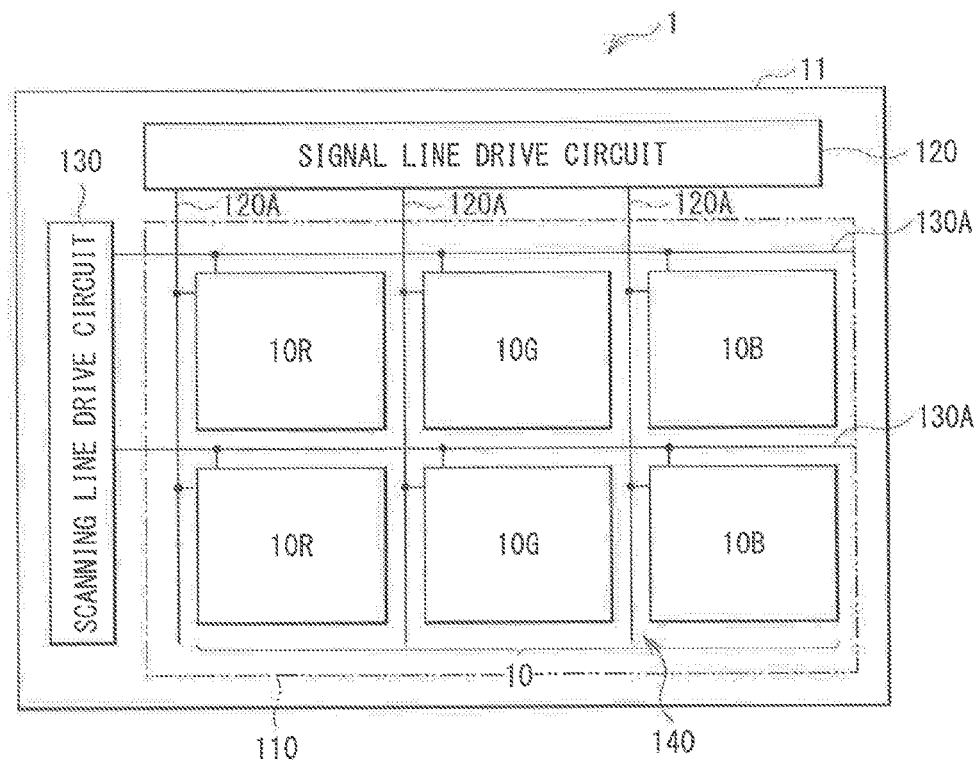
[FIG. 3]
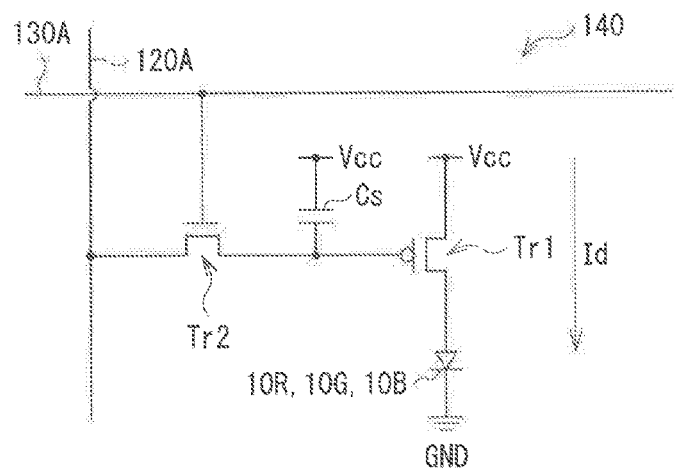

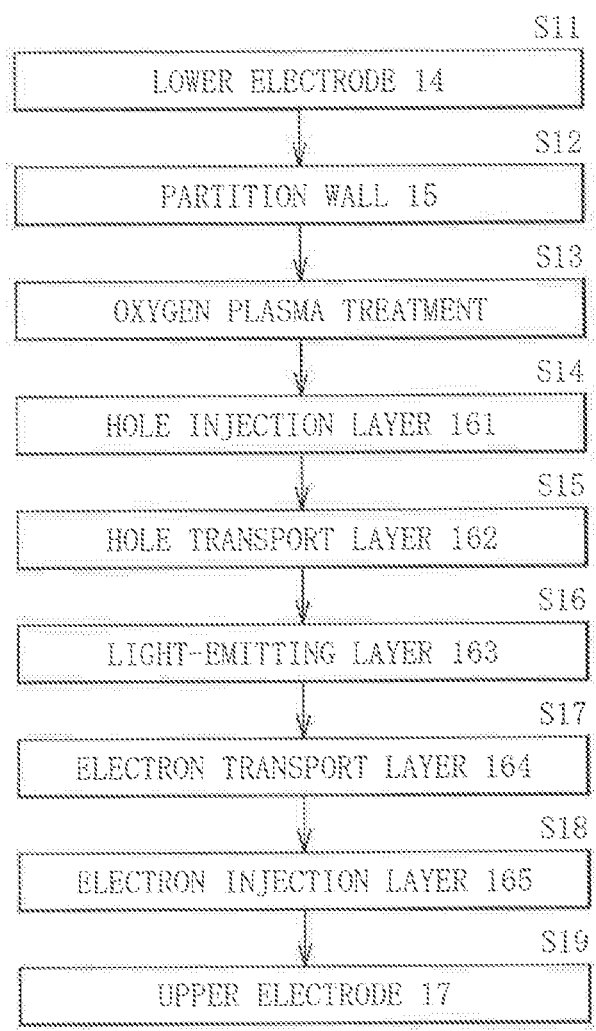

[FIG. 5A]
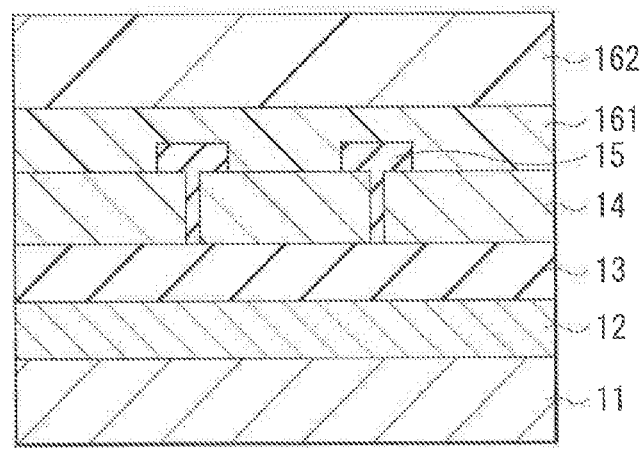
[FIG. 5B]
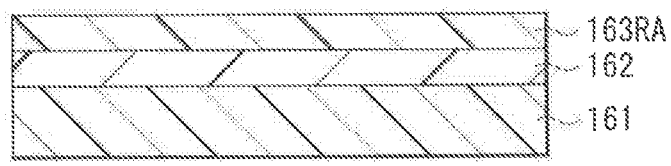
[FIG. 5C]
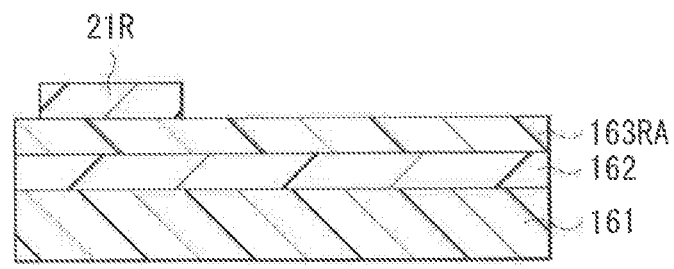
[FIG. 5D]
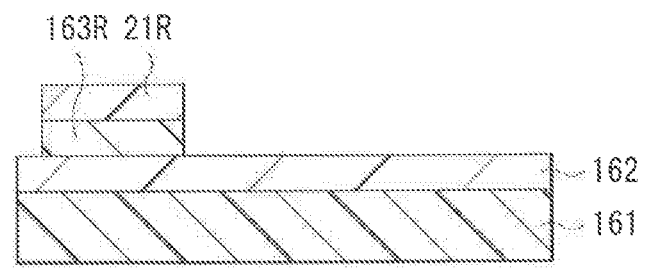

[ FIG. 6A ]
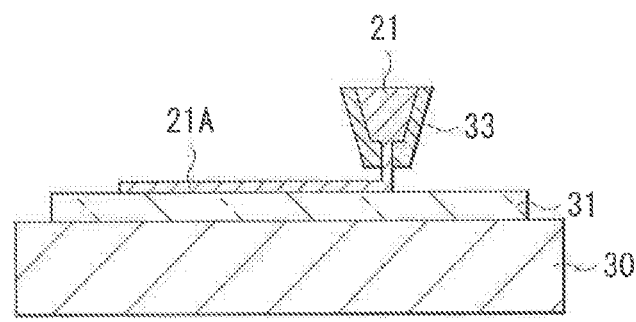
[ FIG. 6B ]
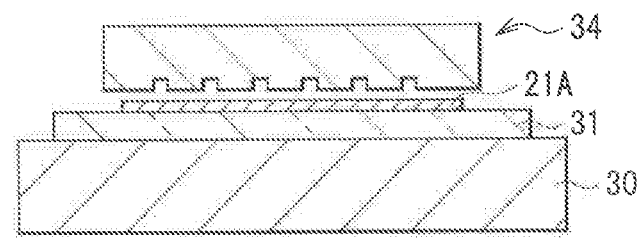
[ FIG. 6C ]
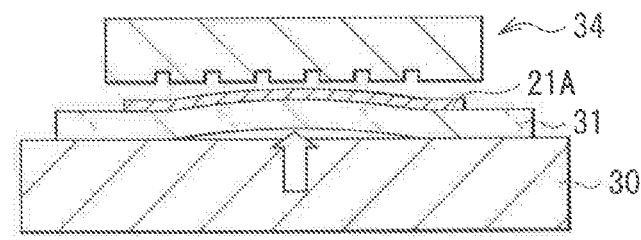

[ FIG. 7A ]
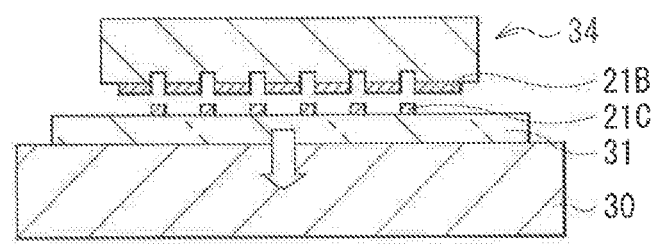
[ FIG. 7B ]
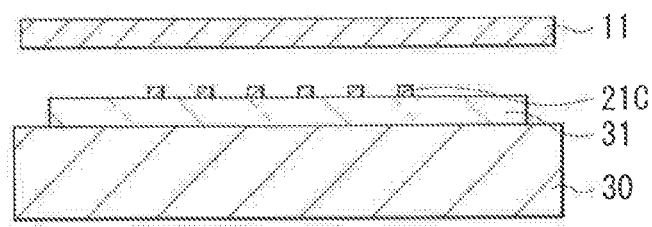
[ FIG. 7C ]
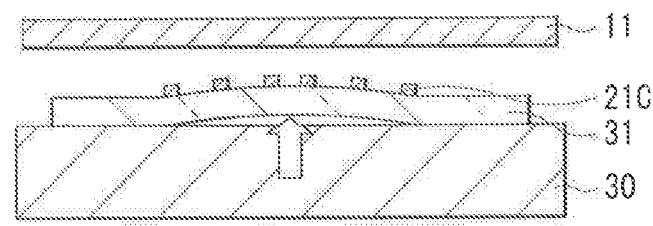
[ FIG. 7D ]
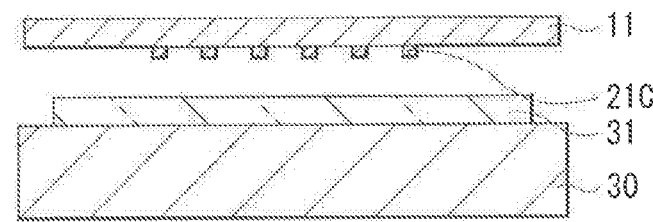

[FIG. 8A]
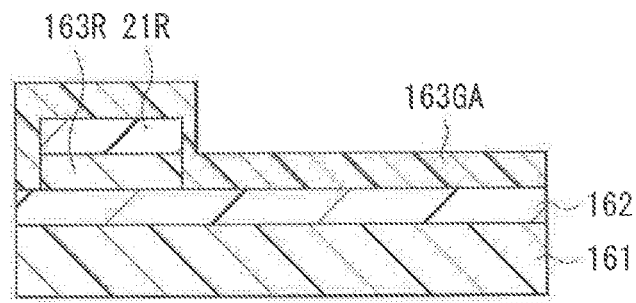
[FIG. 8B]
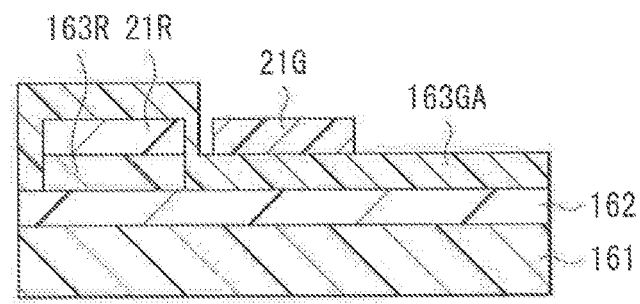
[FIG. 8C]
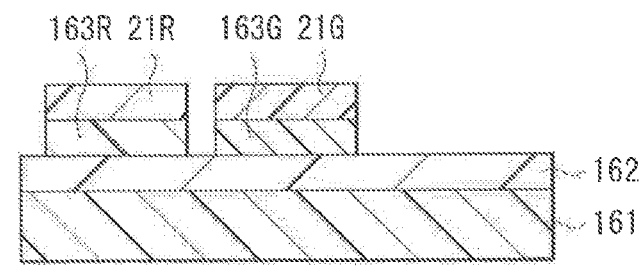
[FIG. 8D]
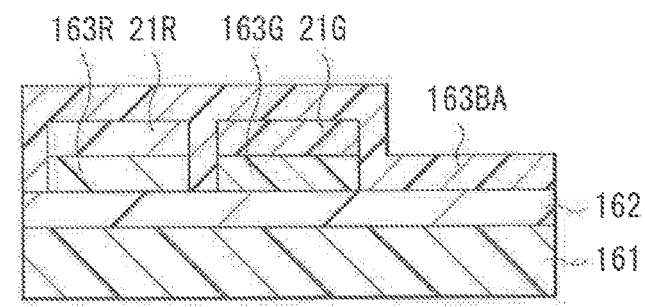

[ FIG. 9A ]
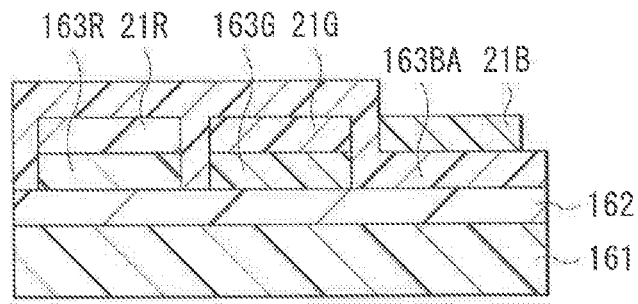
[ FIG. 9B ]
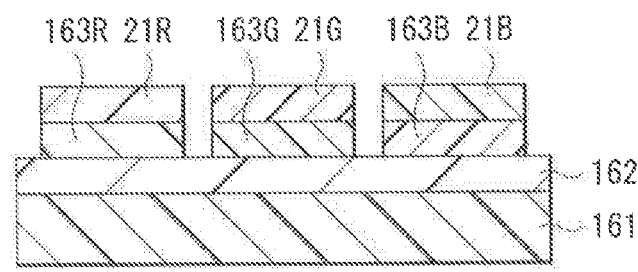
[ FIG. 9C ]
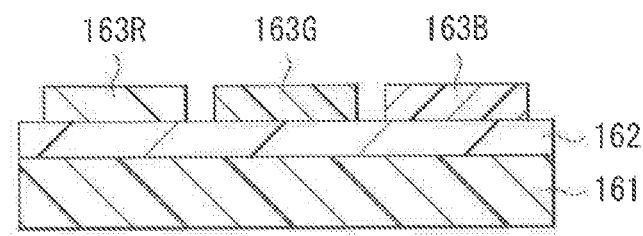

[FIG. 10A]
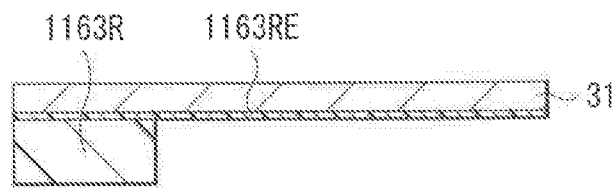
[FIG. 10B]
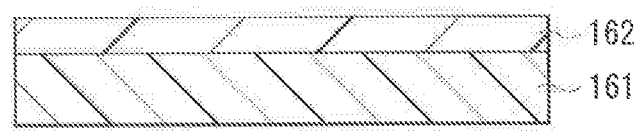
[FIG. 10C]
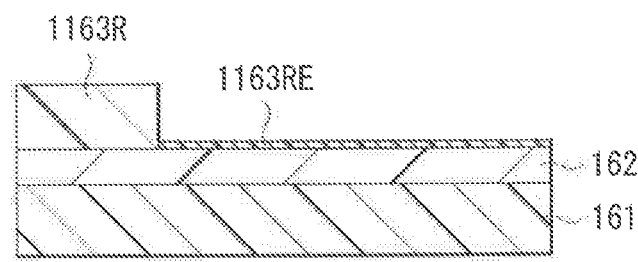
[FIG. 10D]
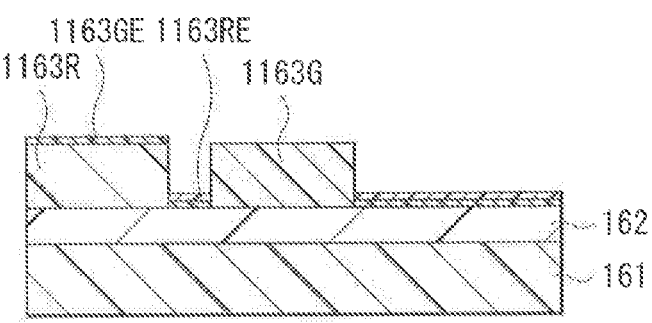

[FIG. 11]
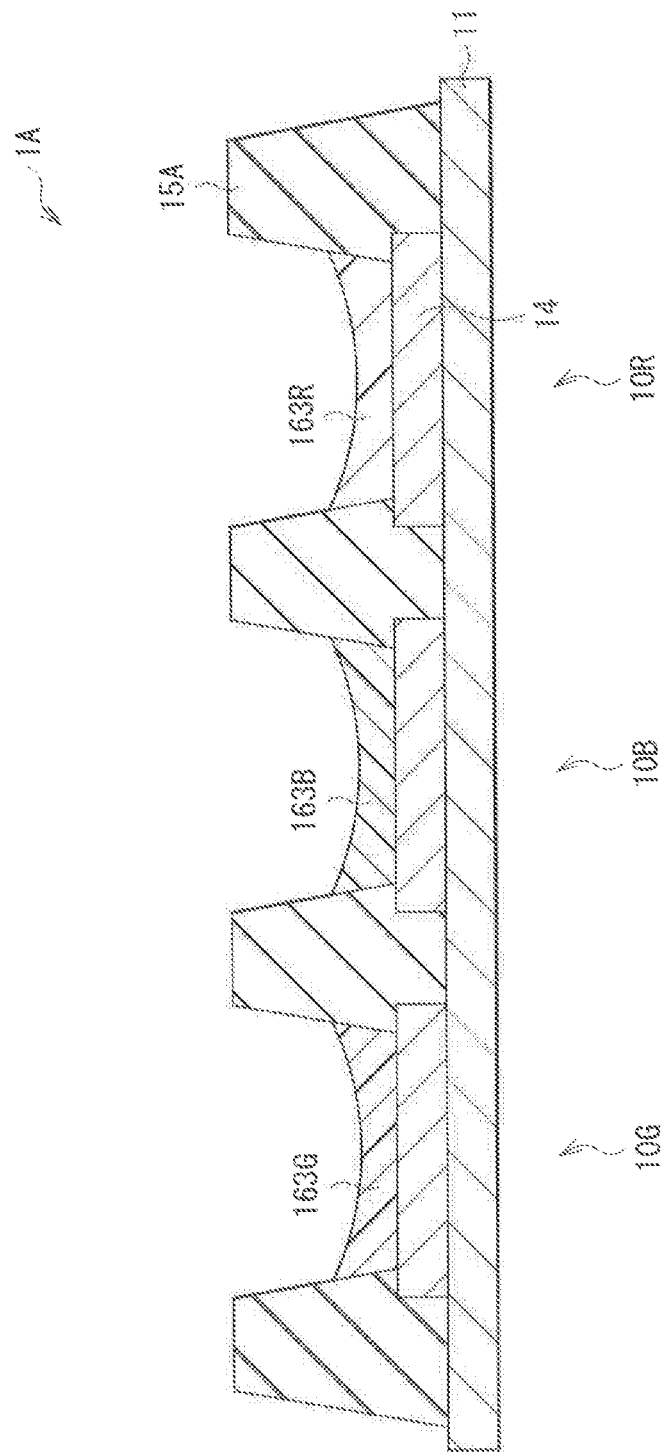

[ FIG. 12A ]
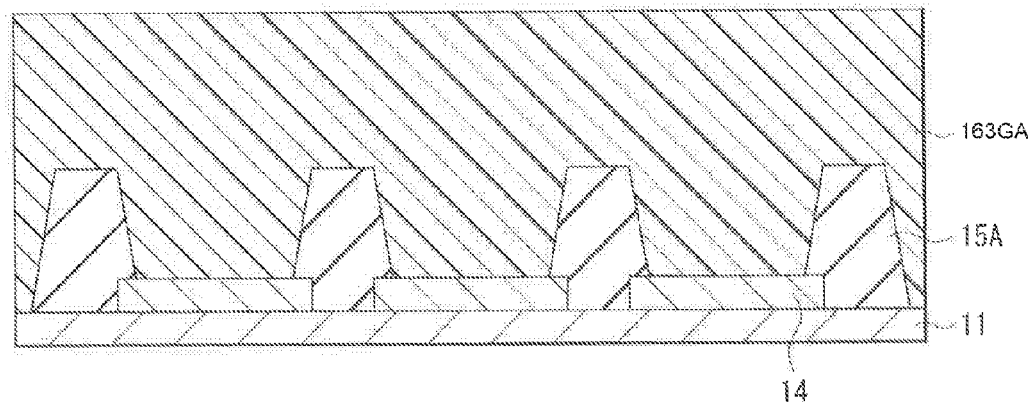
[ FIG. 12B ]
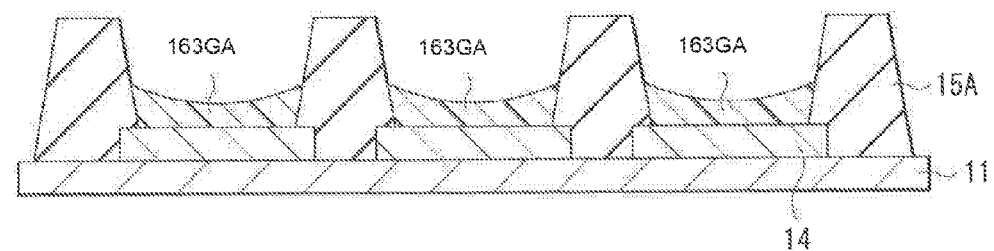
[ FIG. 12C ]
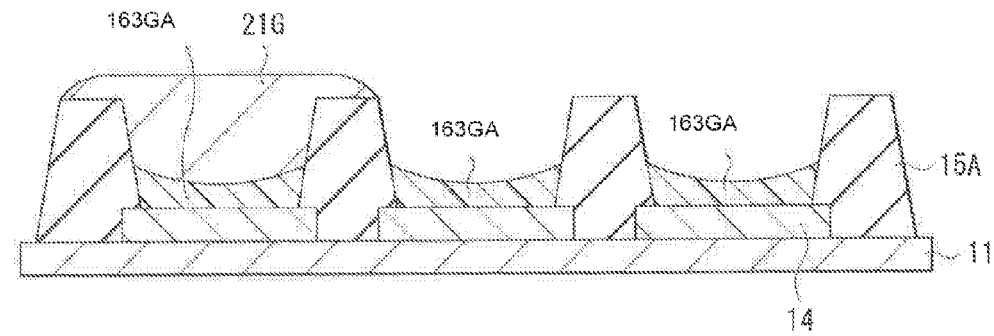

[ FIG. 13A ]
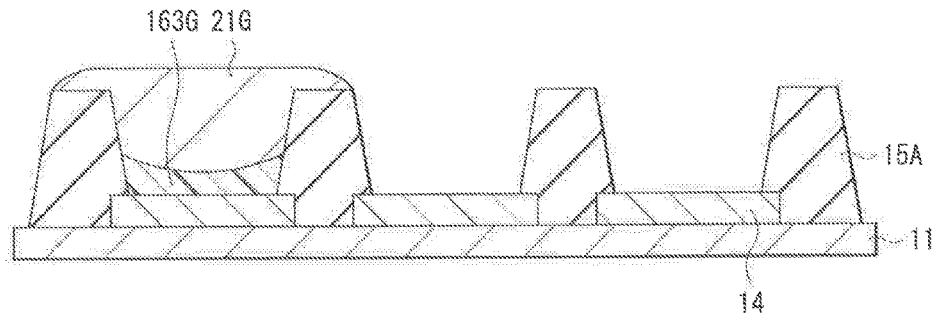
[ FIG. 13B ]
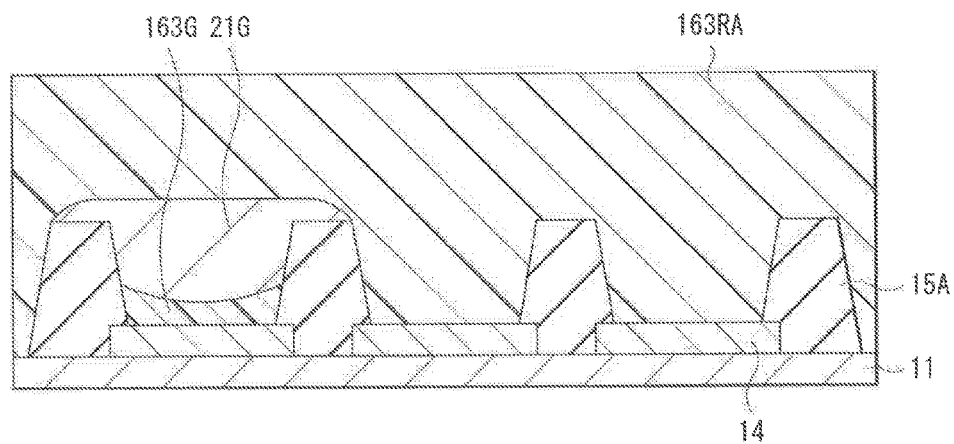
[ FIG. 13C ]
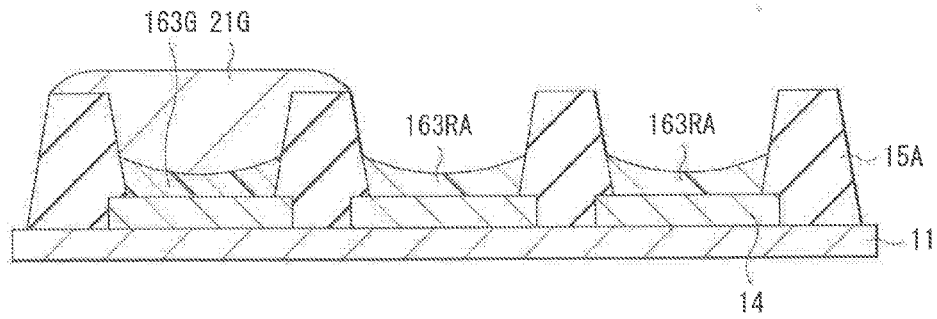

[ FIG. 14A ]
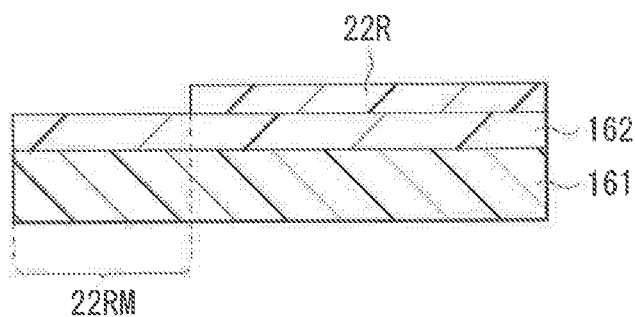
[ FIG. 14B ]
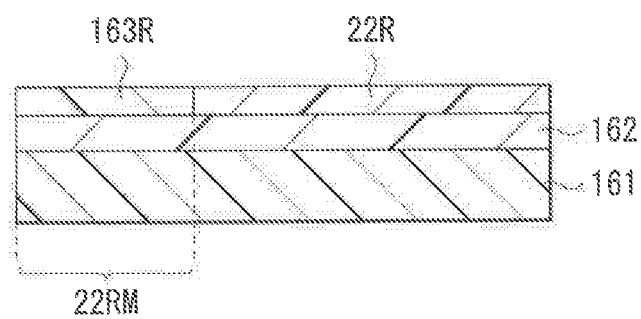
[ FIG. 14C ]
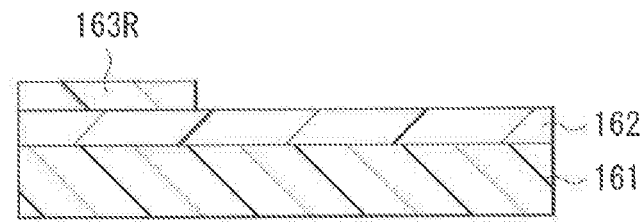

[ FIG. 15A ]
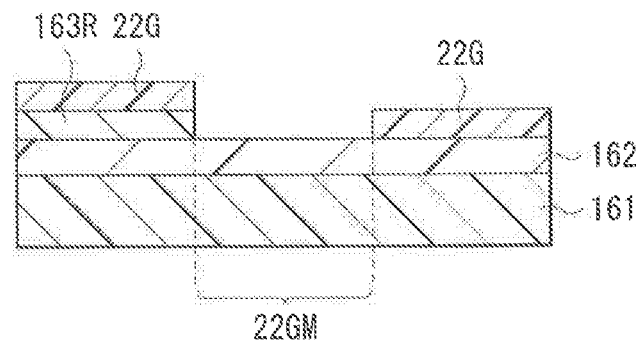
[ FIG. 15B ]
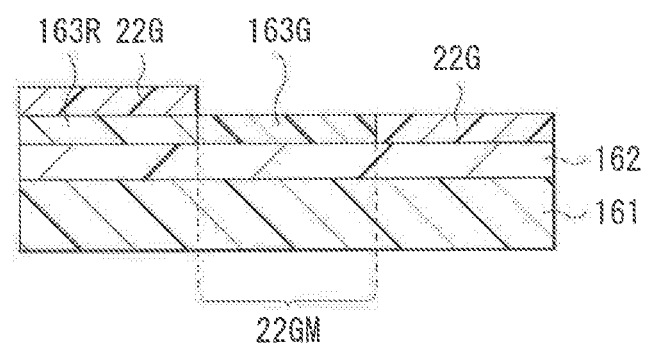
[ FIG. 15C ]
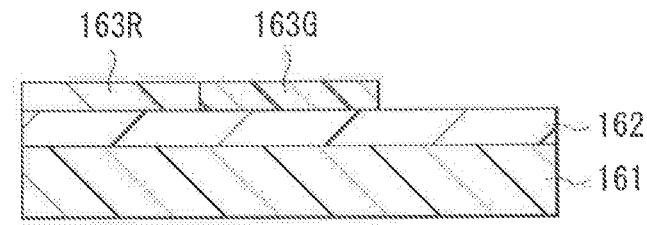

[ FIG. 16A ]
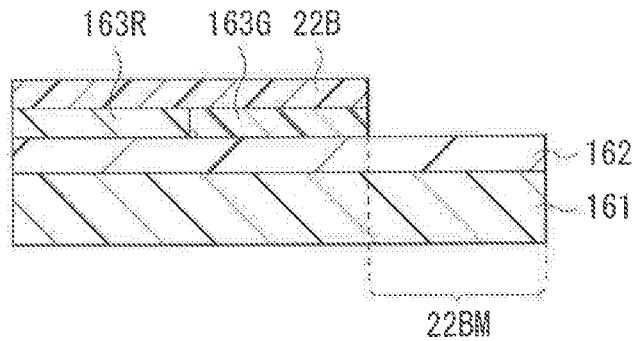
[ FIG. 16B ]
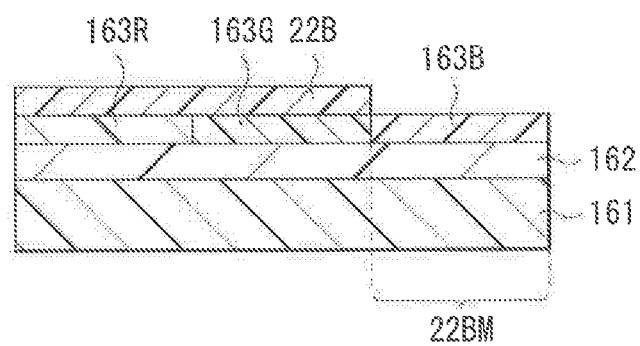
[ FIG. 16C ]
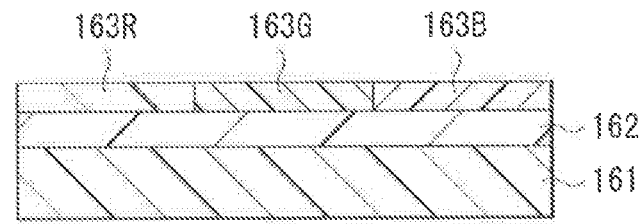

[ FIG. 17A ]
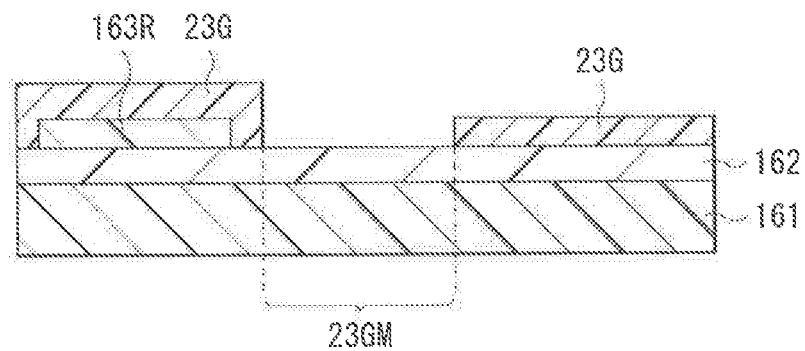
[ FIG. 17B ]
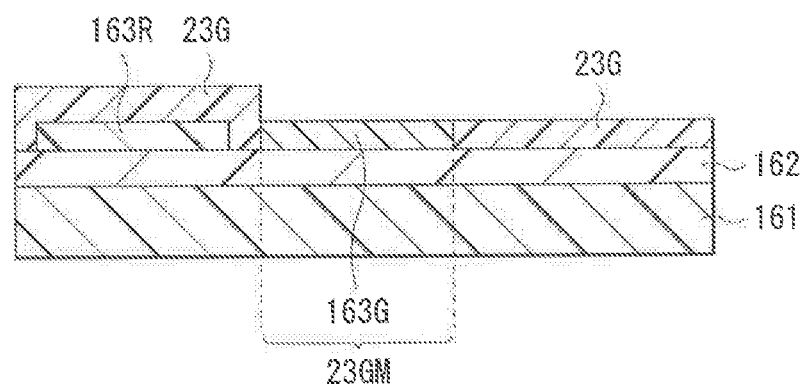
[ FIG. 17C ]
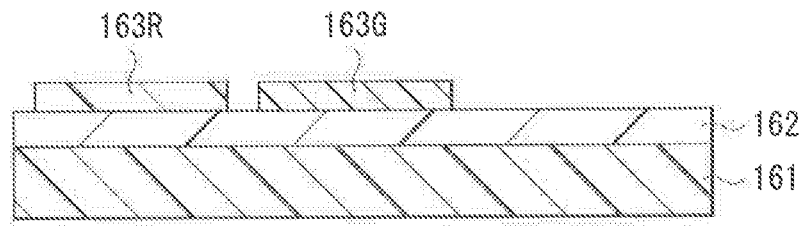

[ FIG. 18A ]
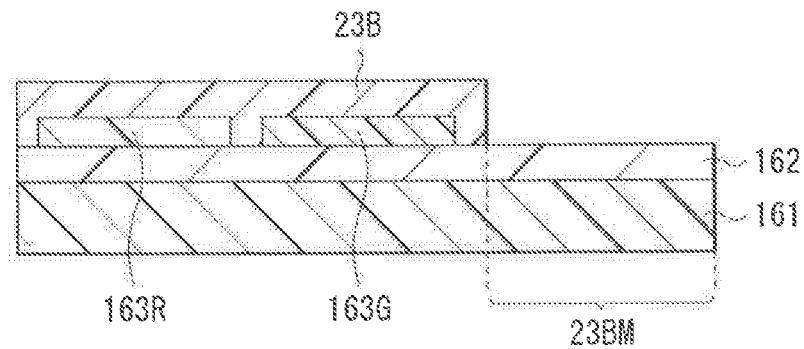
[ FIG. 18B ]
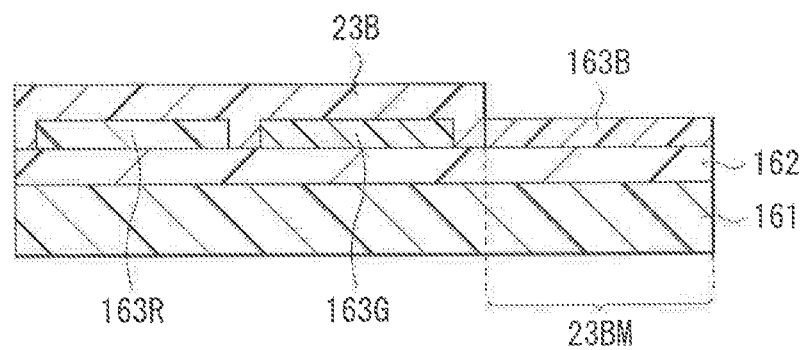
[ FIG. 18C ]
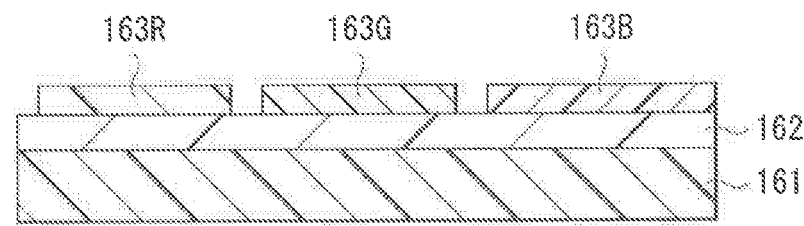

[FIG. 19]
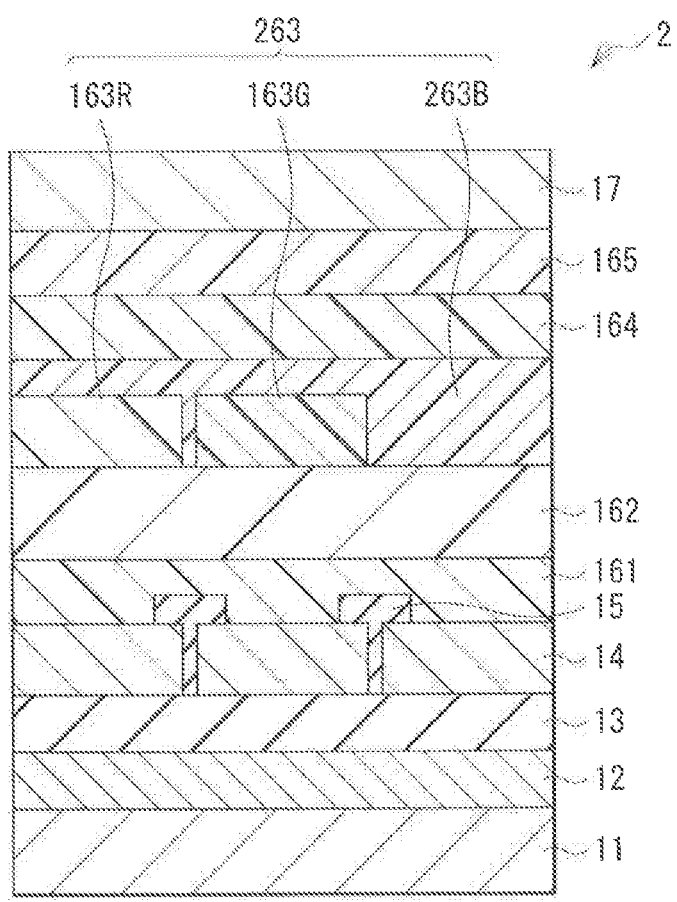

[FIG. 20A]
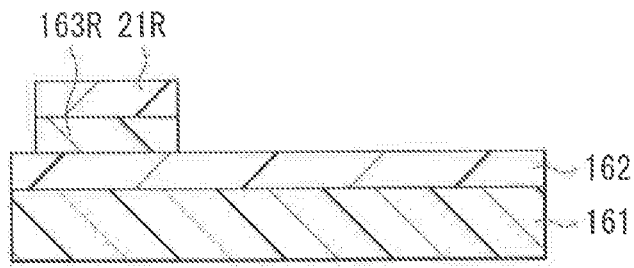
[FIG. 20B]
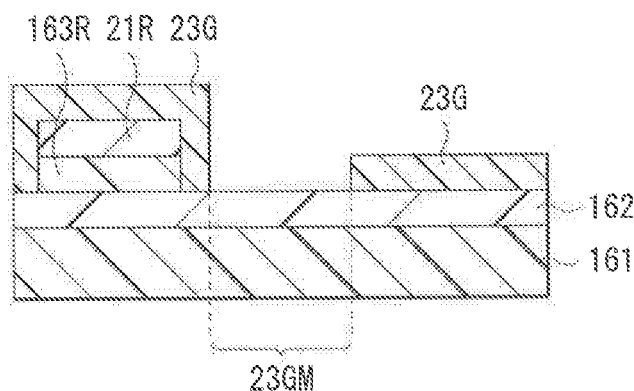
[FIG. 20C]
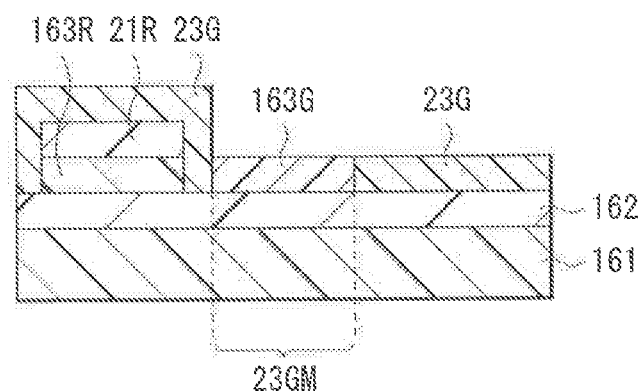
[FIG. 20D]
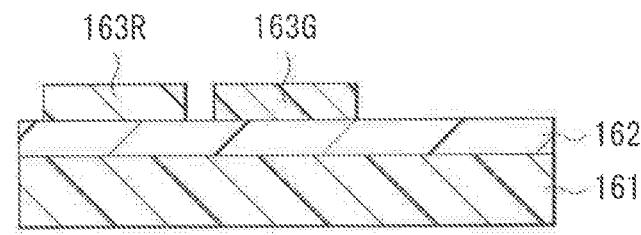

[FIG. 21]
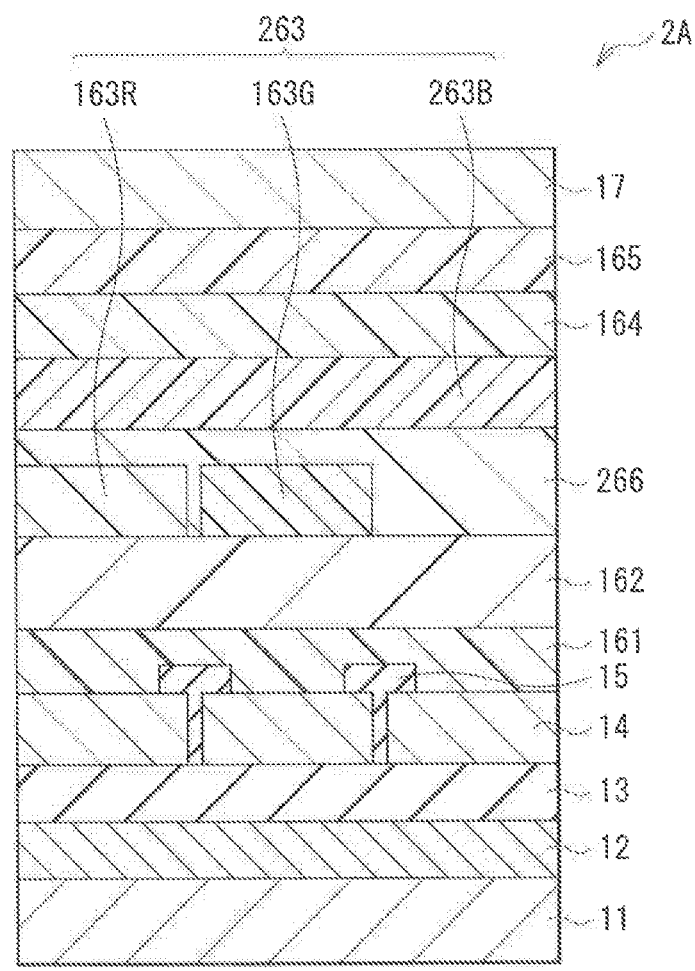

[ FIG. 22A ]
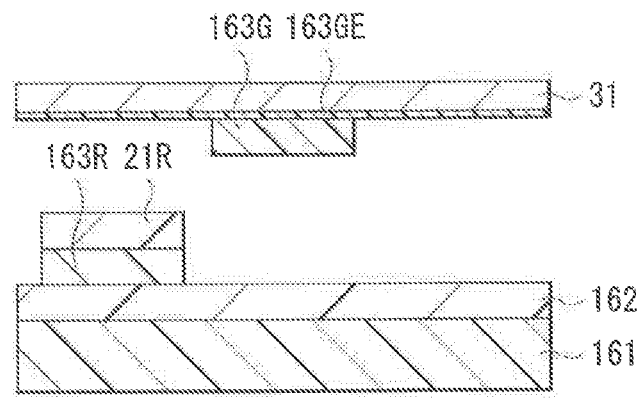
[ FIG. 22B ]
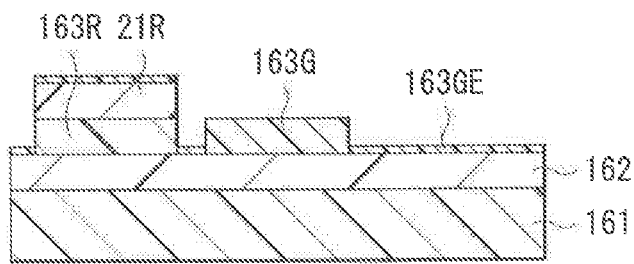

[ FIG. 23A ]
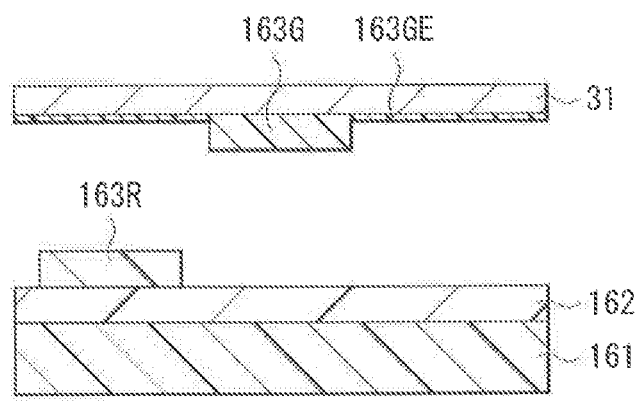
[ FIG. 23B ]
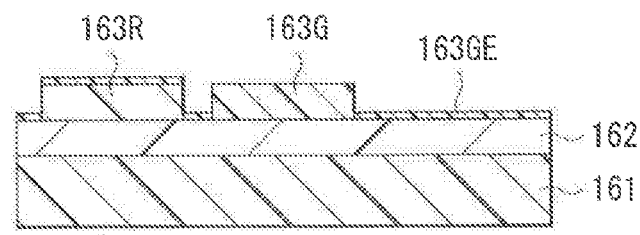

[ FIG. 24A ]
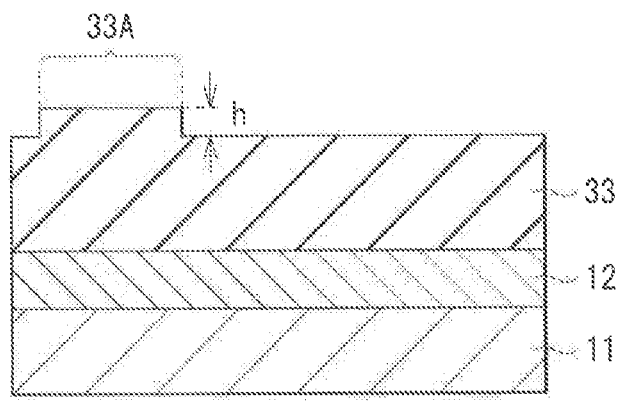
[ FIG. 24B ]
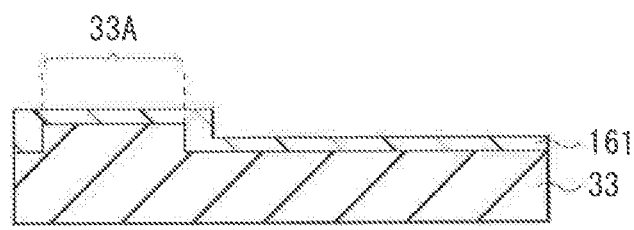
[ FIG. 24C ]
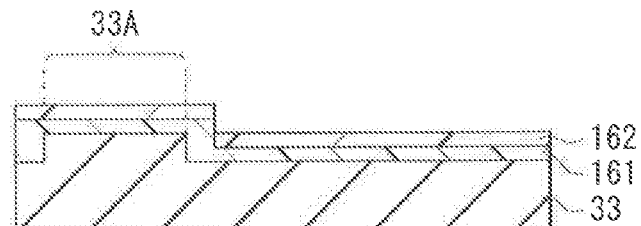
[ FIG. 24D ]
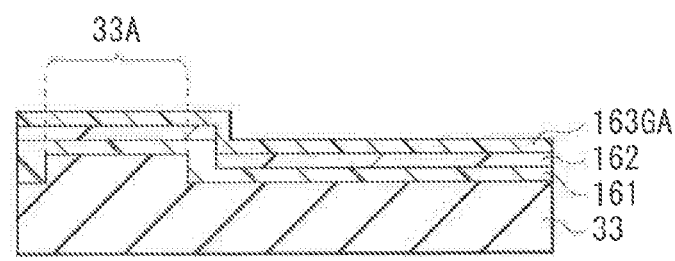

[ FIG. 25A ]
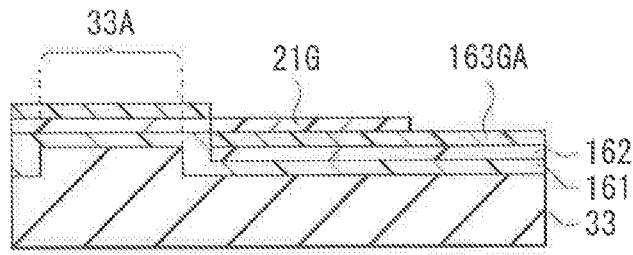
[ FIG. 25B ]
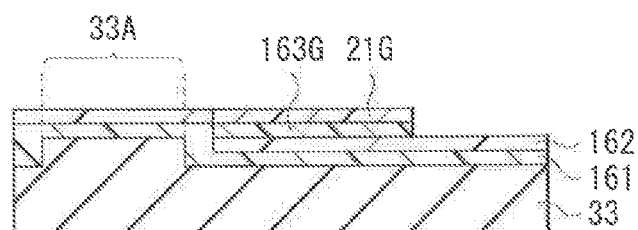
[ FIG. 25C ]
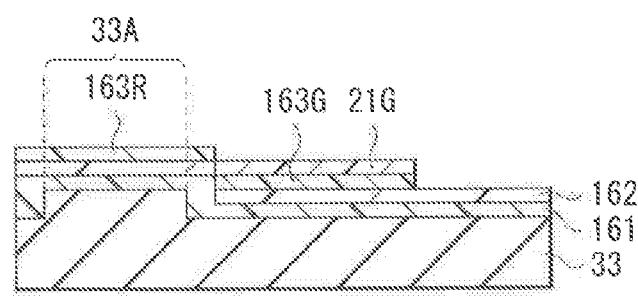
[ FIG. 25D ]
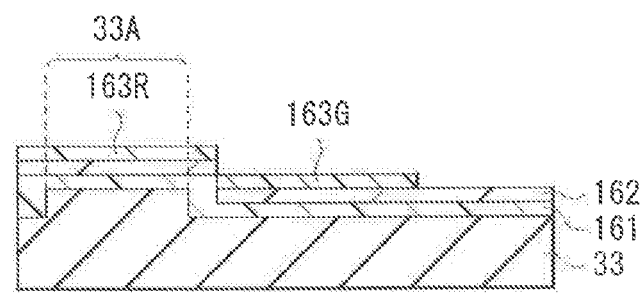

[FIG. 26A]
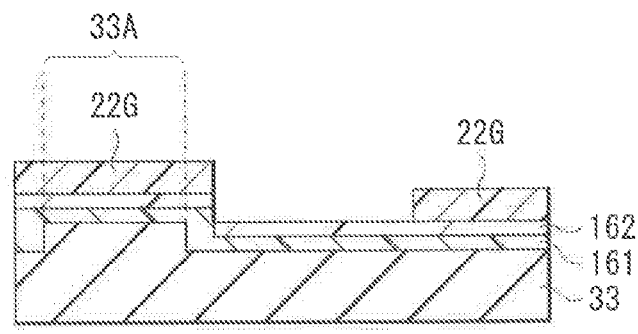
[FIG. 26B]
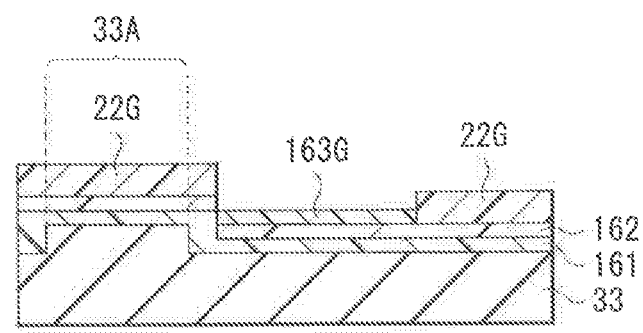
[FIG. 26C]
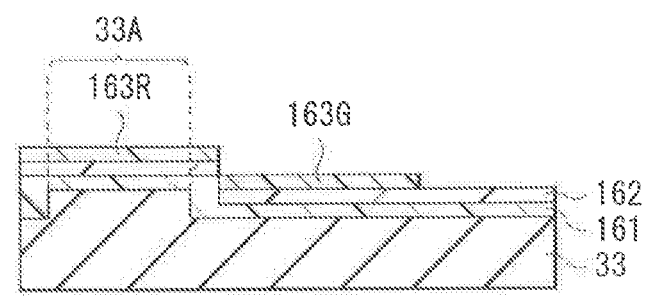

[ FIG. 27 ]
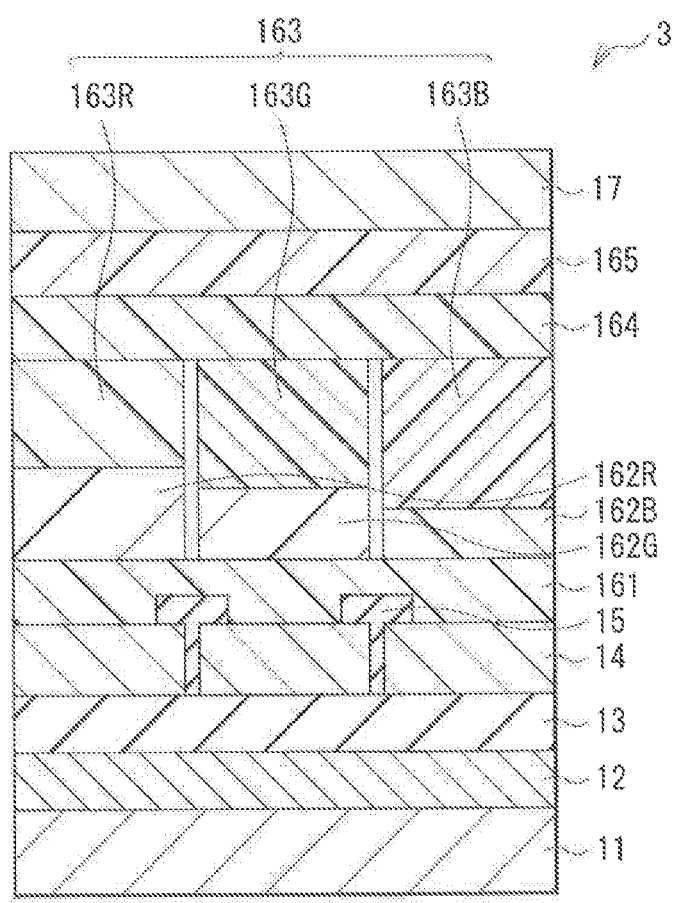

[FIG. 28A]
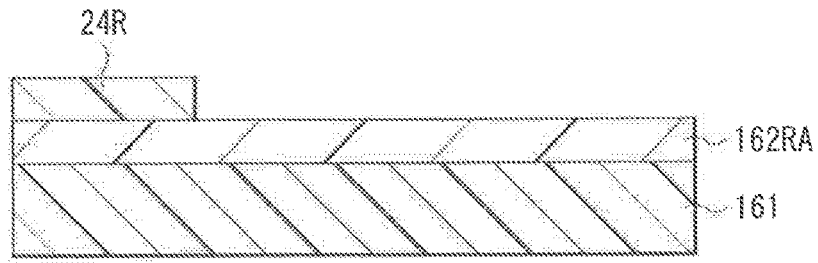
[FIG. 28B]
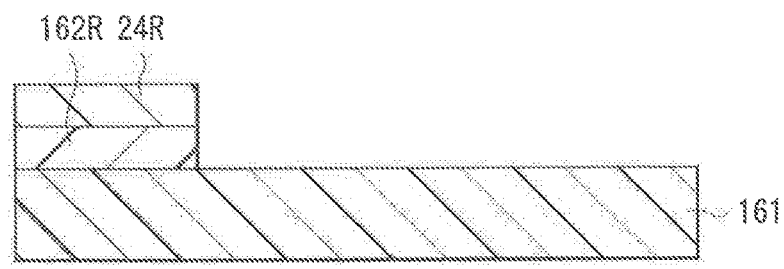
[FIG. 28C]
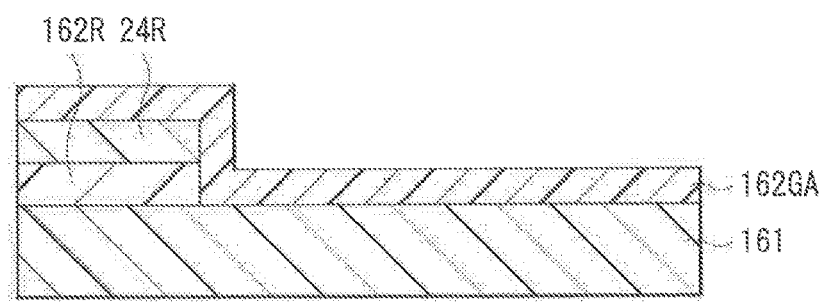
[FIG. 28D]
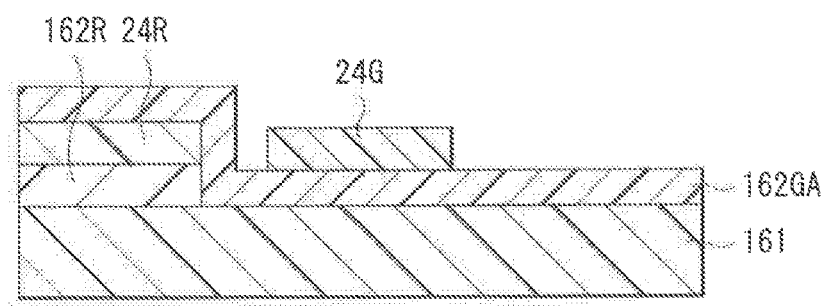

[ FIG. 29A ]
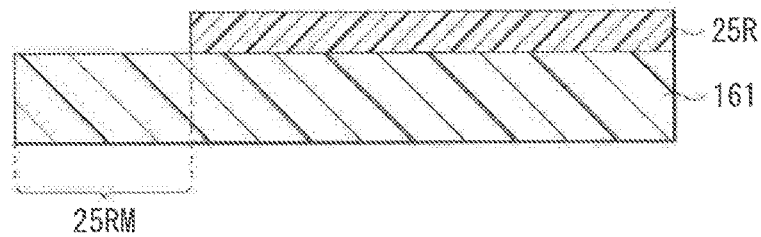
[ FIG. 29B ]
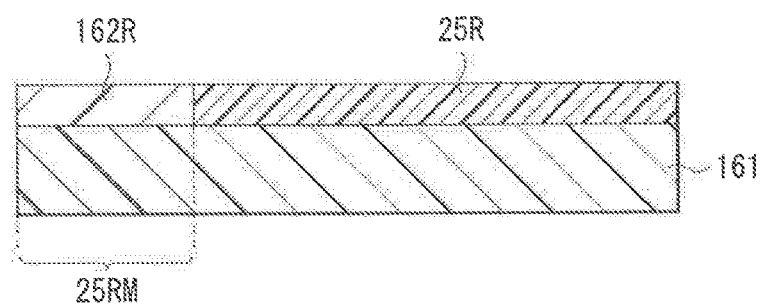
[ FIG. 29C ]
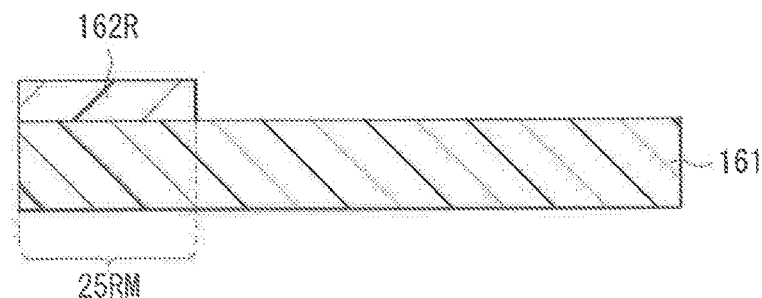
[ FIG. 29D ]
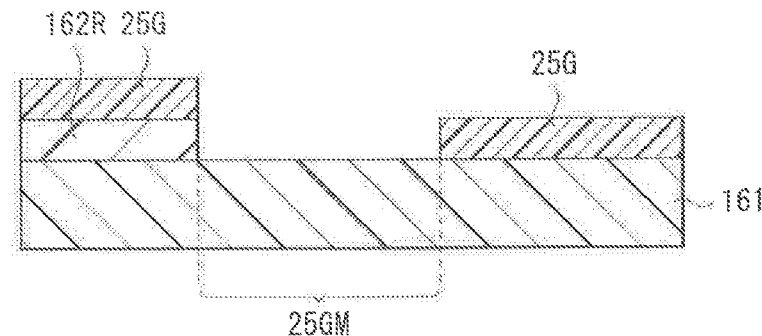

[FIG. 30]
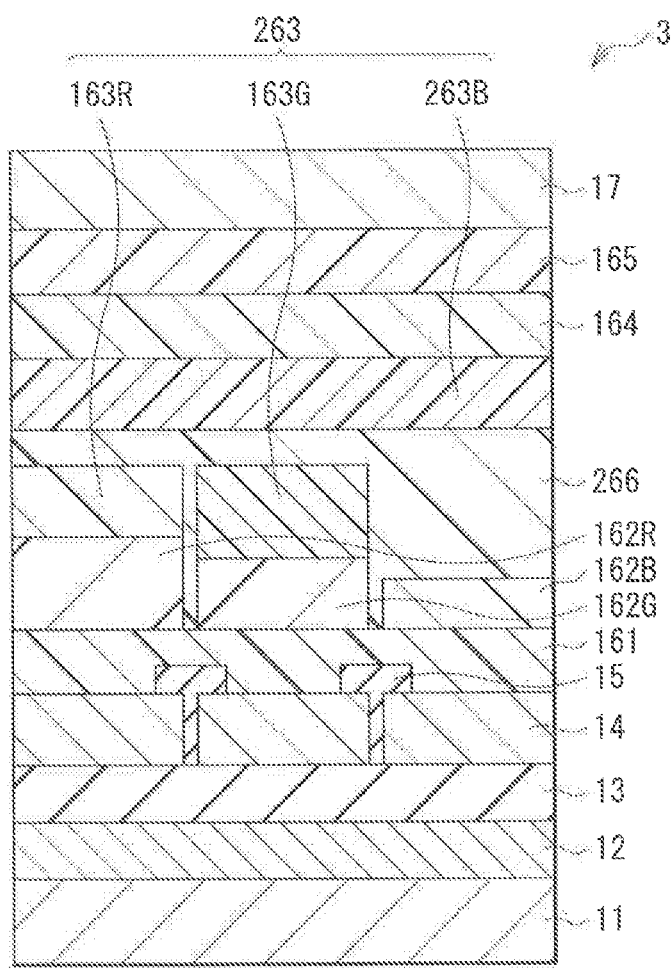

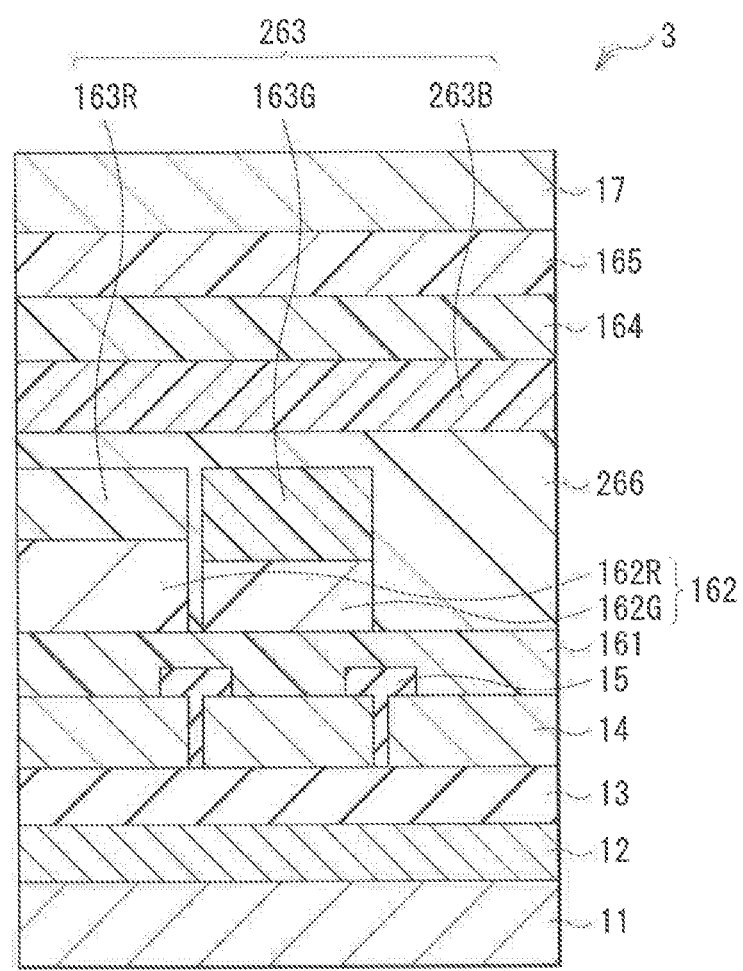
[FIG. 31]

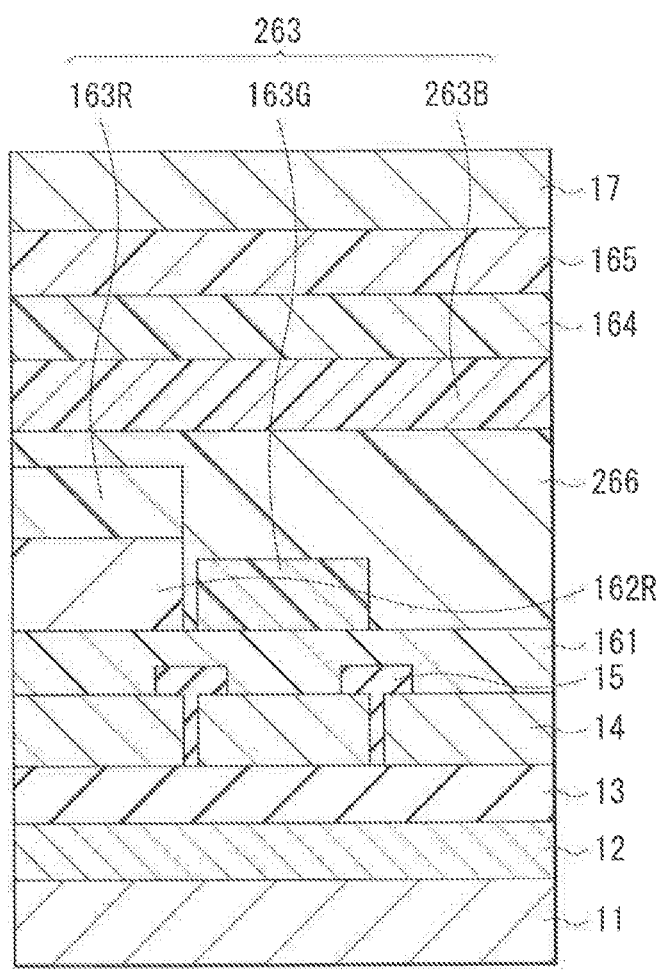
[FIG. 32]

[FIG. 33A]
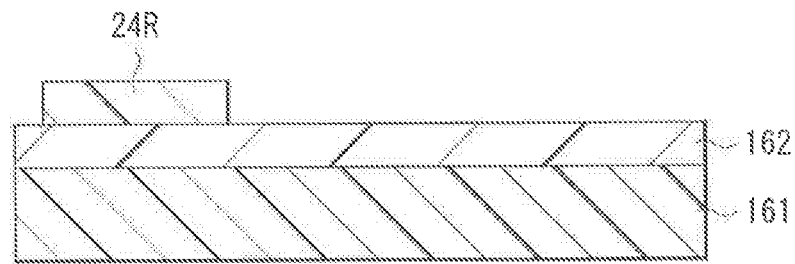
[FIG. 33B]
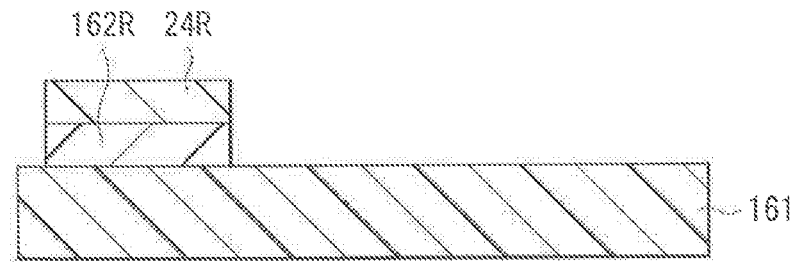
[FIG. 33C]
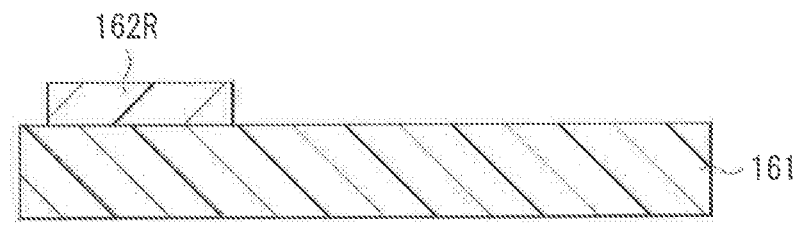
[FIG. 33D]
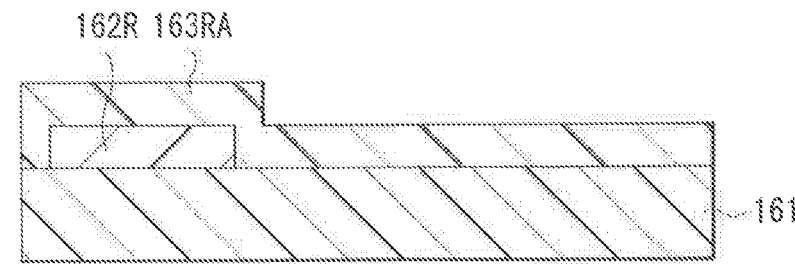

[FIG. 34A]
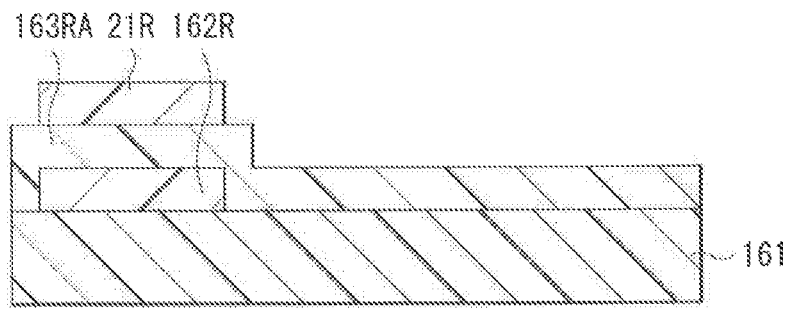
[FIG. 34B]
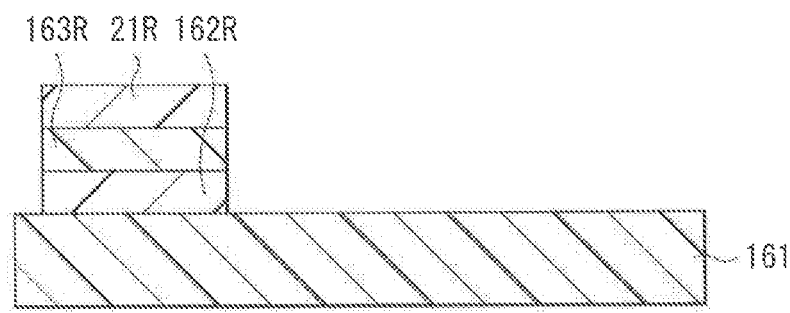
[FIG. 34C]
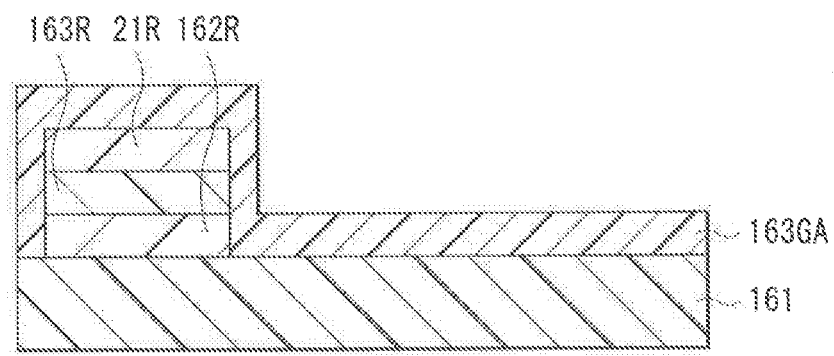

[FIG. 35A]
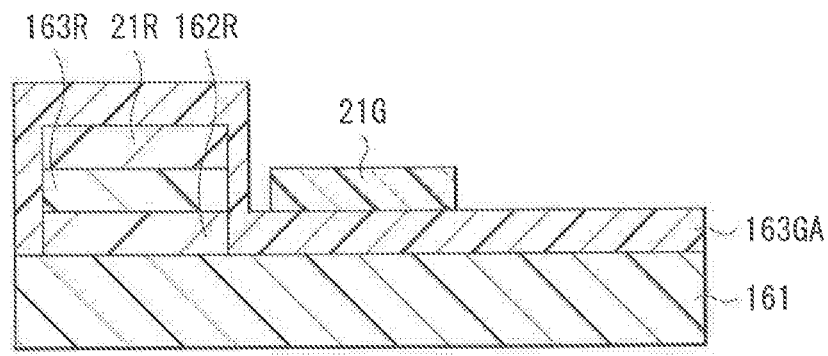
[FIG. 35B]
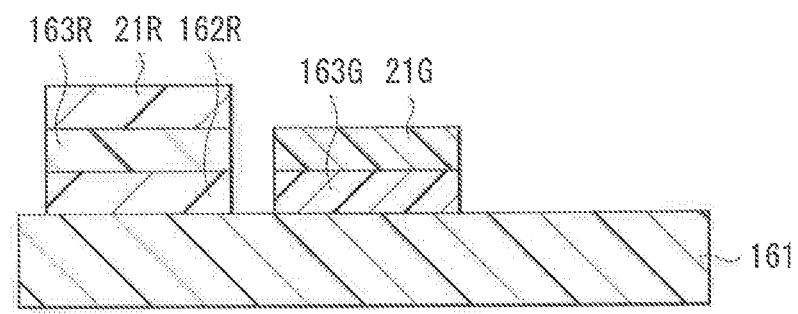
[FIG. 35C]
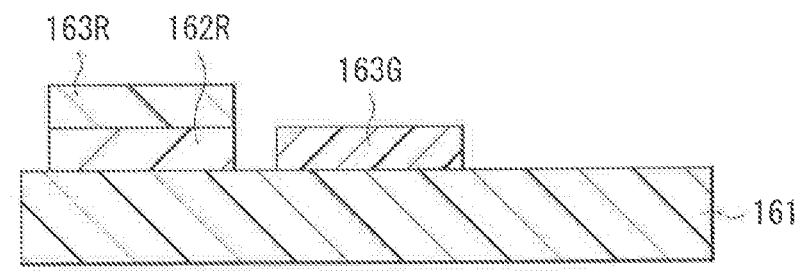

[FIG. 36A]
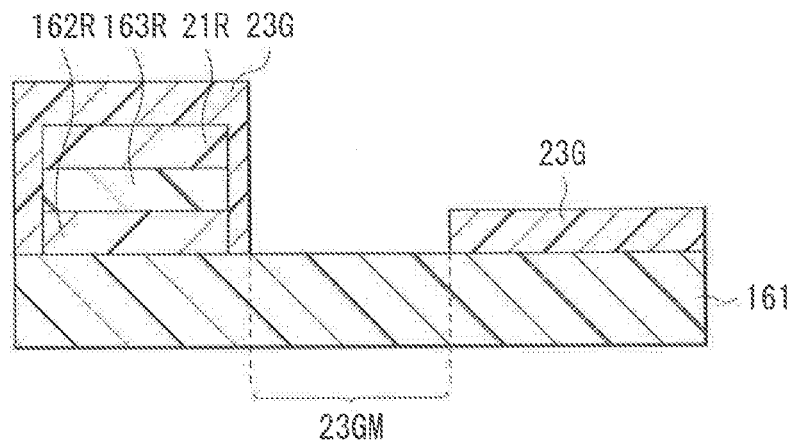
[FIG. 36B]
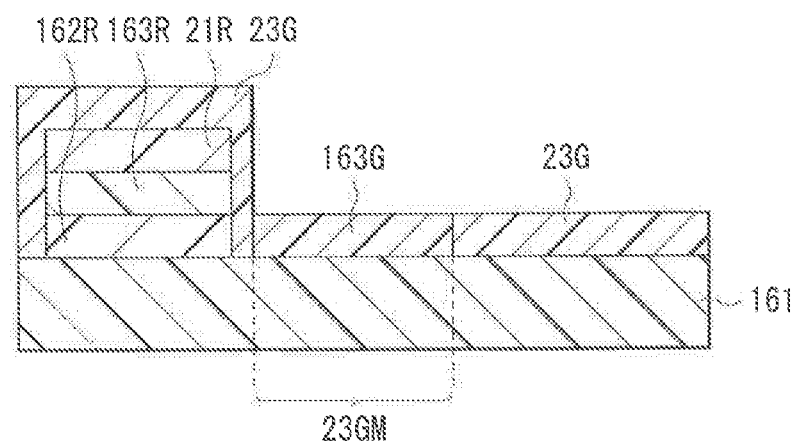
[FIG. 36C]
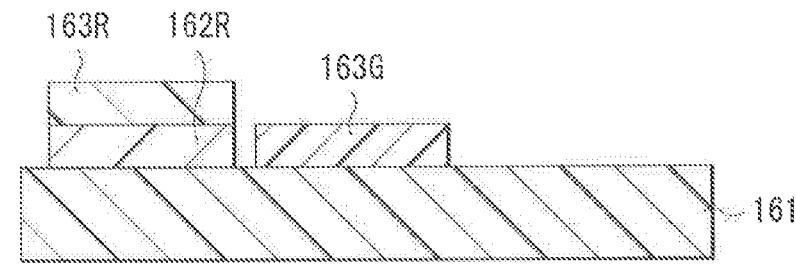

[FIG. 37A]
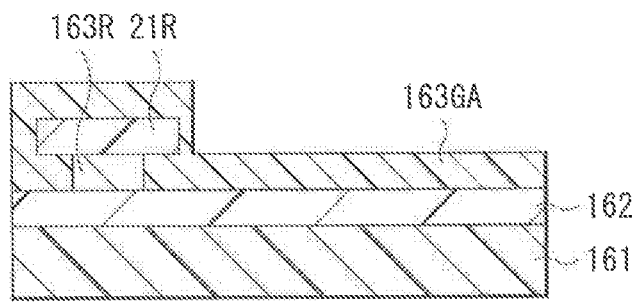
[FIG. 37B]
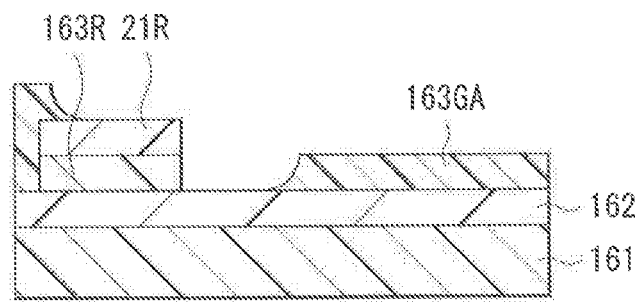
[FIG. 37C]
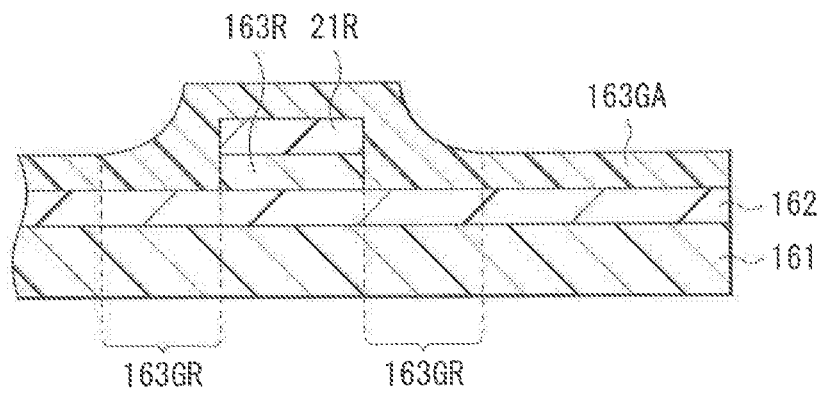

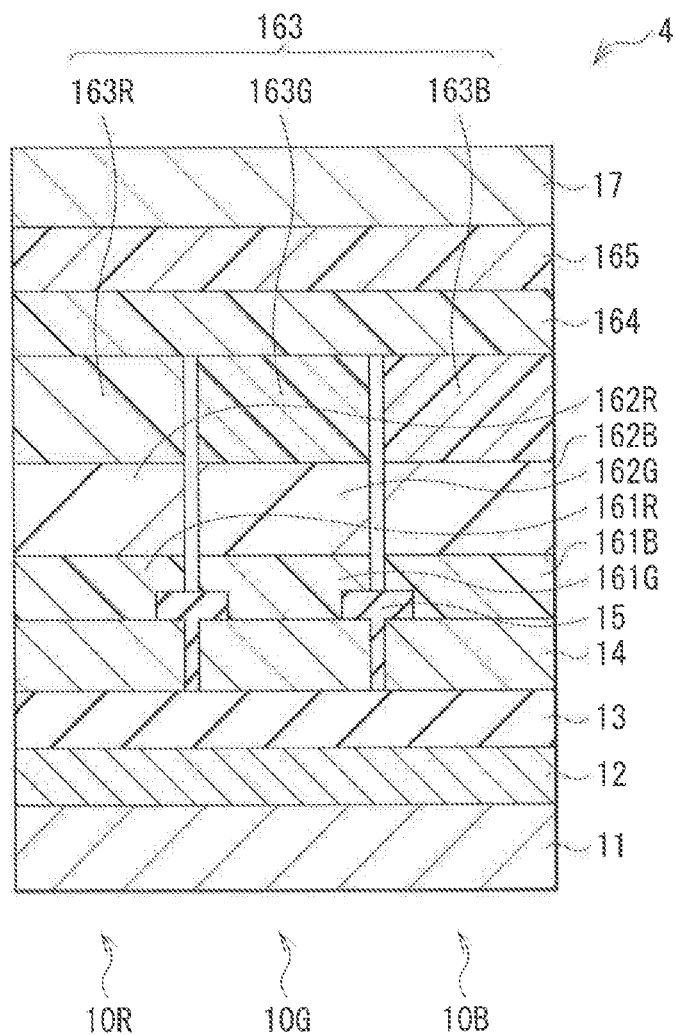
[FIG. 38]

[ FIG. 39A ]
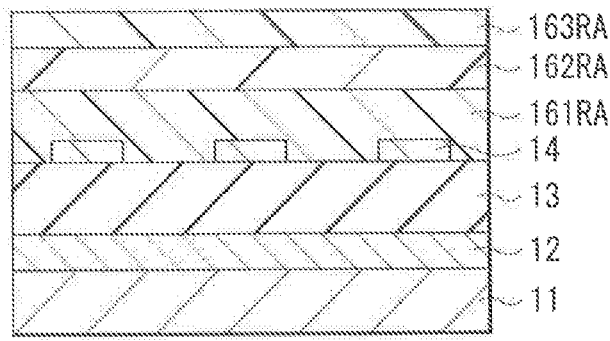
[ FIG. 39B ]
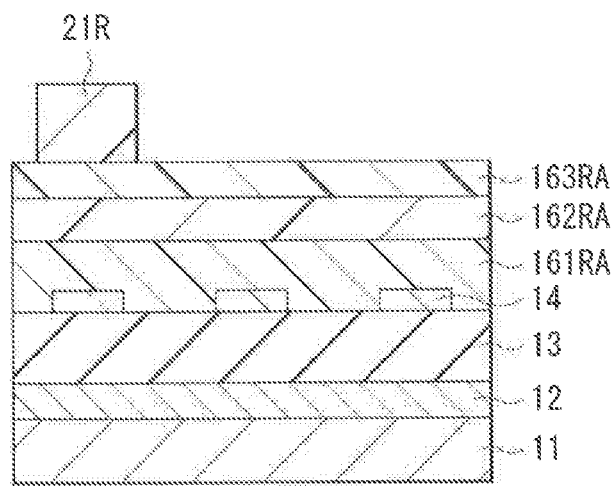
[ FIG. 39C ]
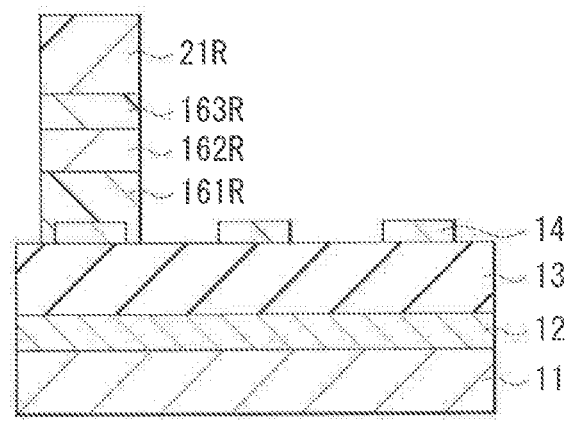

[FIG. 40A]
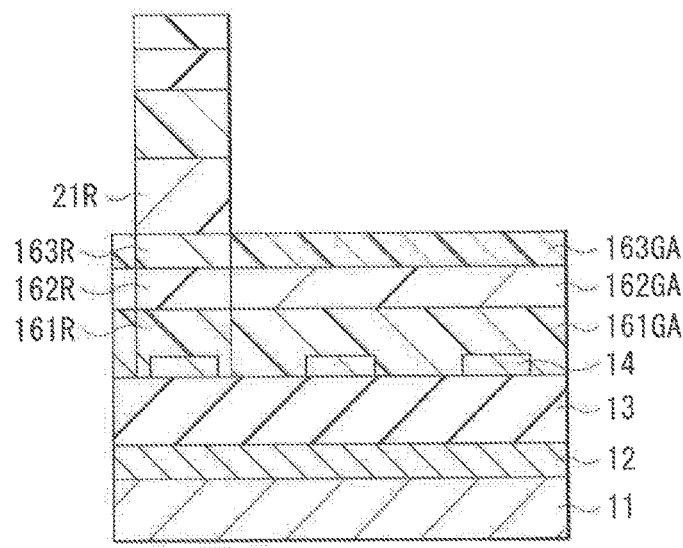
[FIG. 40B]
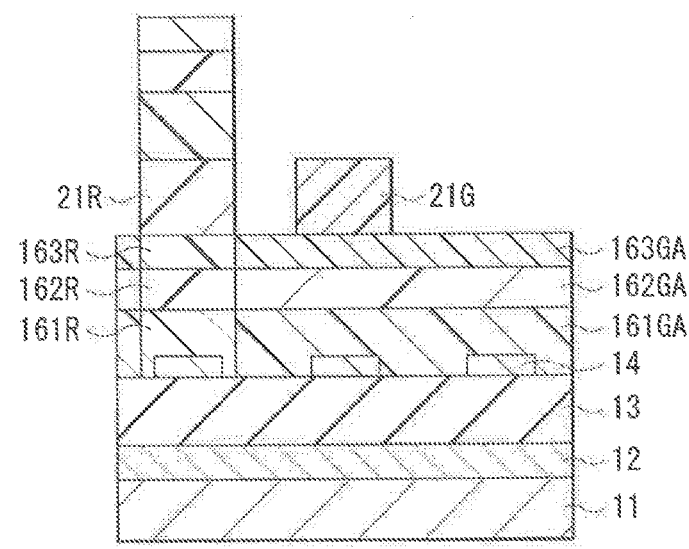
[FIG. 40C]
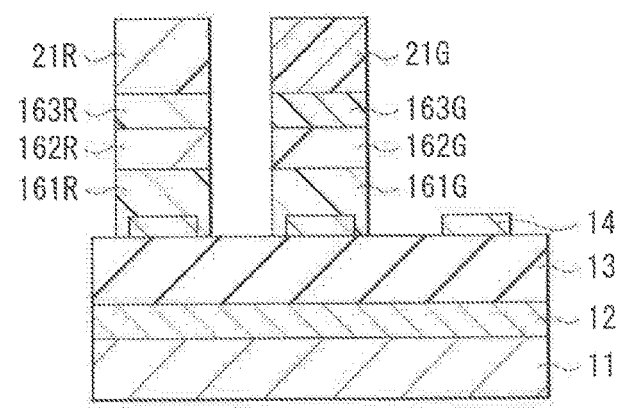

[ FIG. 41A ]
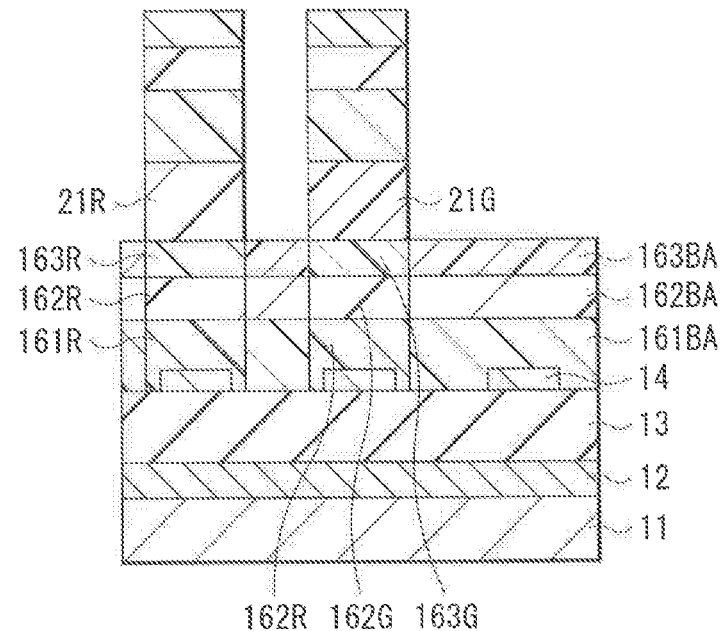
[ FIG. 41B ]
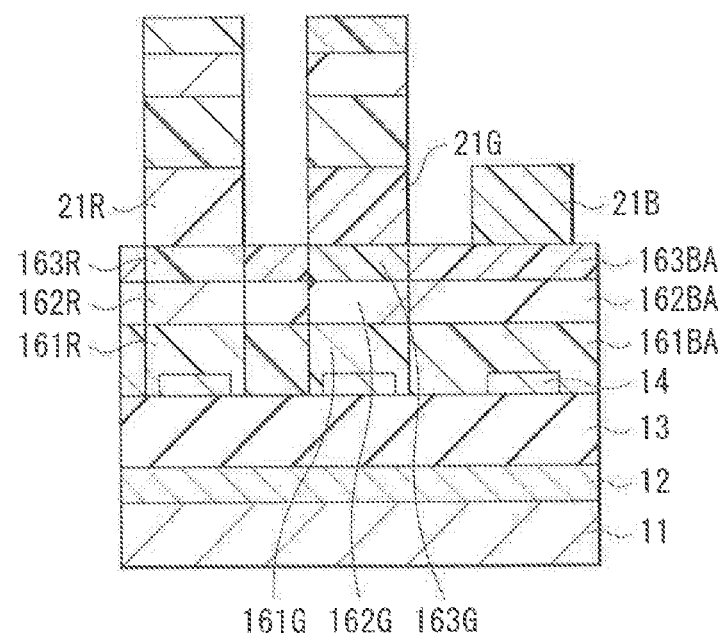

[ FIG. 41C ]
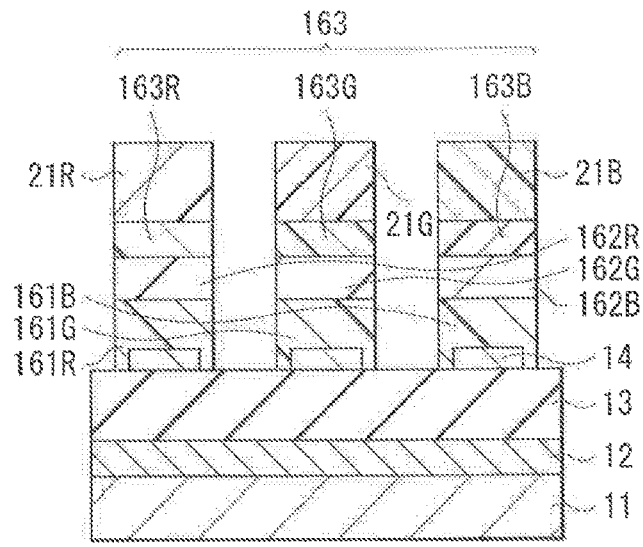
[ FIG. 42 ]
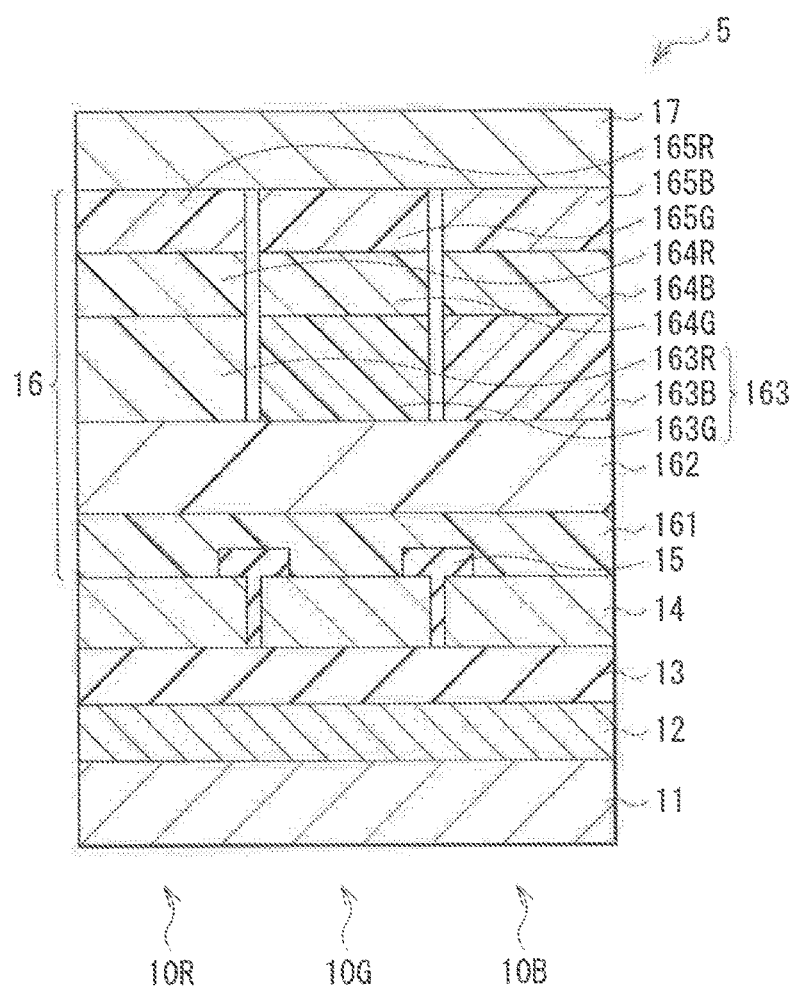

[FIG. 43A]
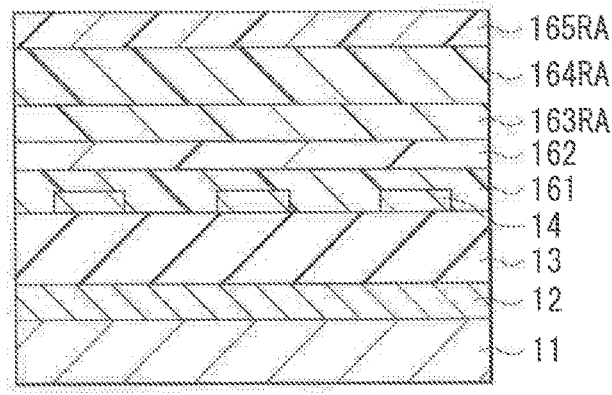
[FIG. 43B]
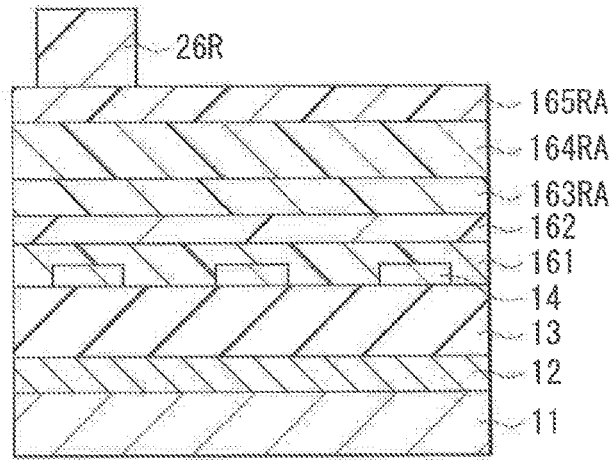
[FIG. 43C]
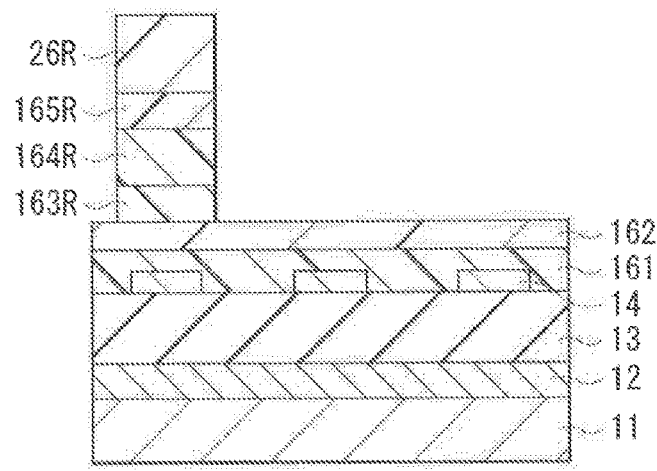

[ FIG. 44A ]
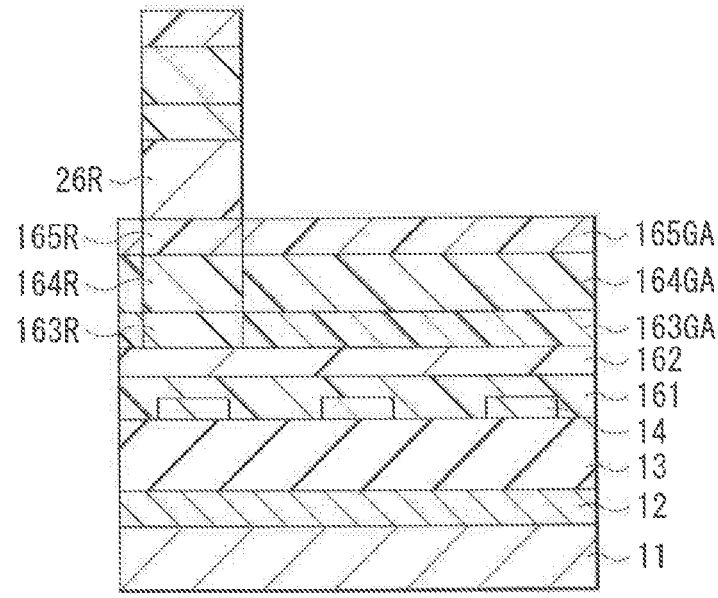
[ FIG. 44B ]
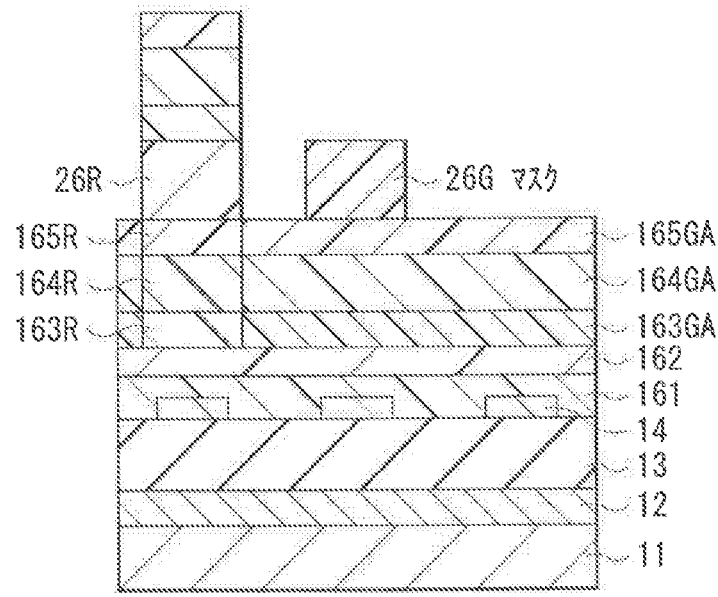

[ FIG. 44C ]
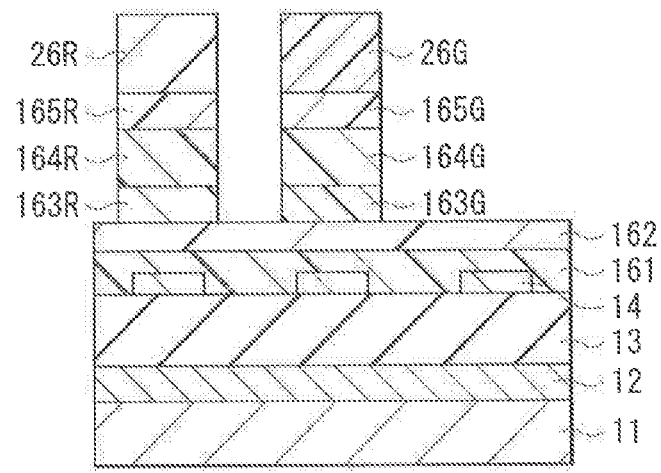
[ FIG. 45A ]
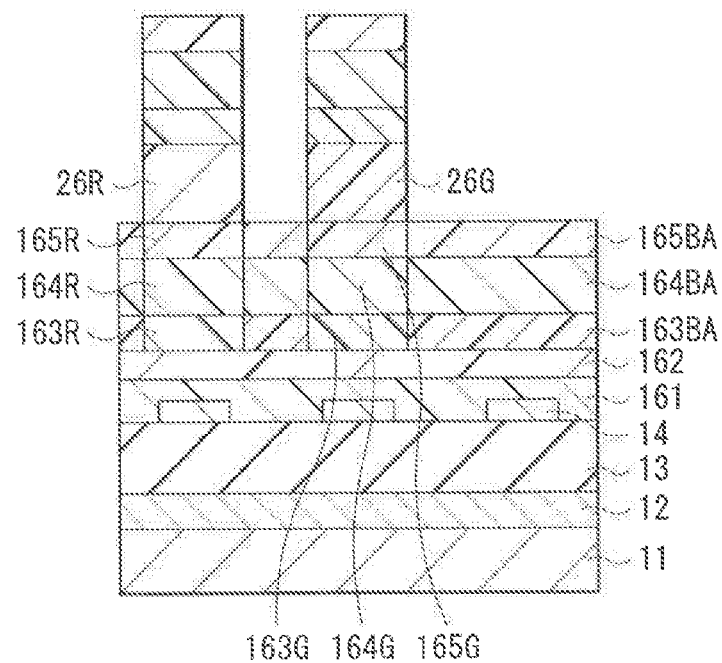

[ FIG. 45B ]
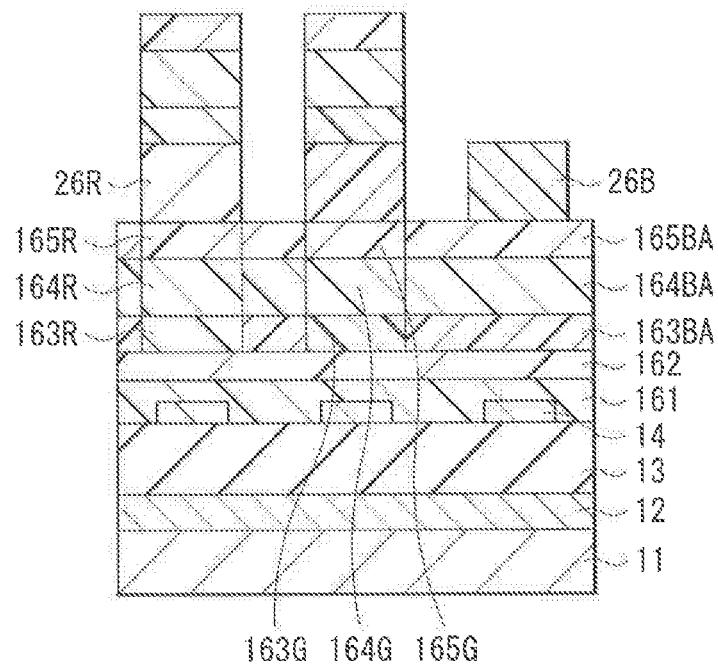
[ FIG. 45C ]
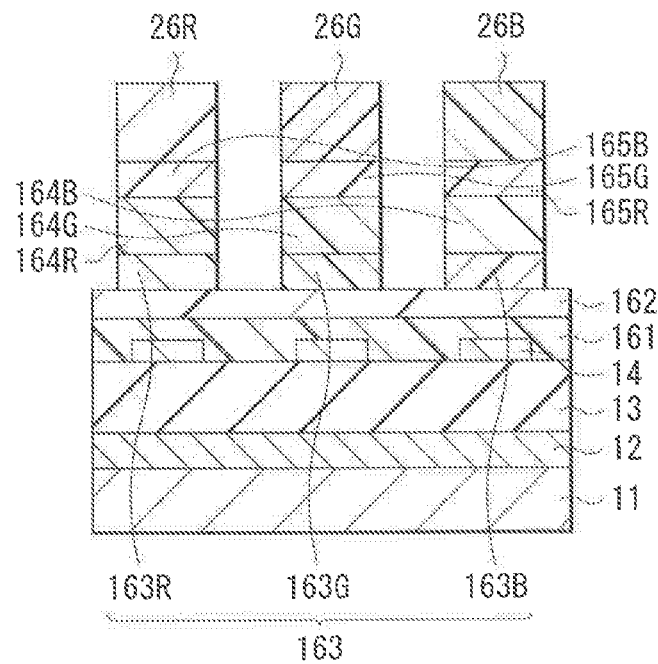

[FIG. 46]
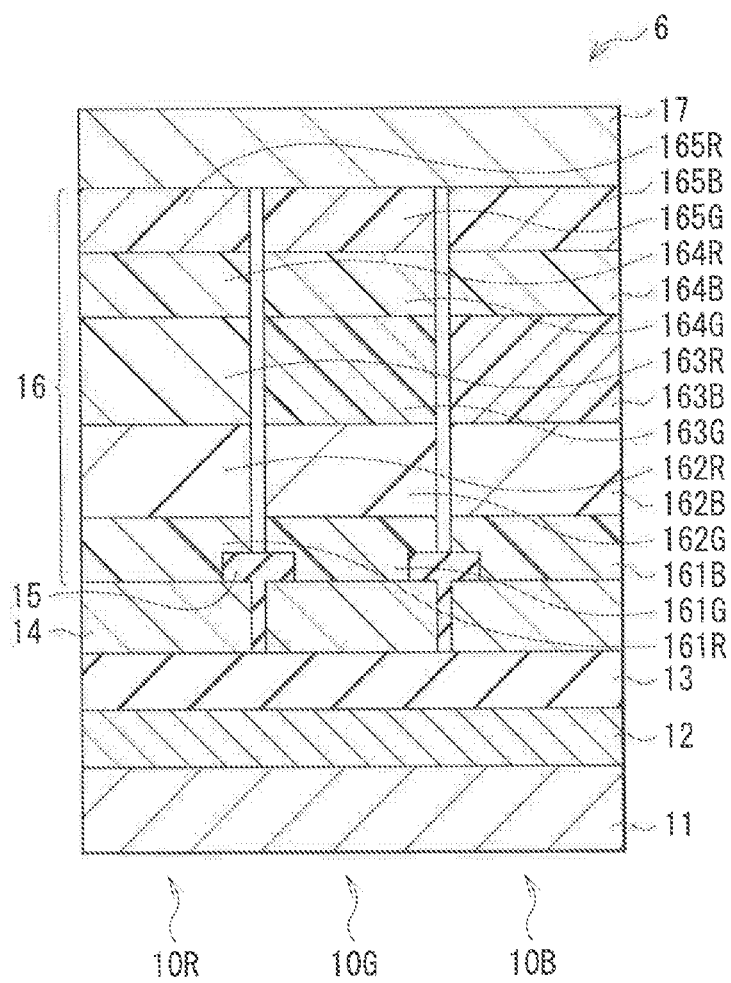

[ FIG. 47A ]
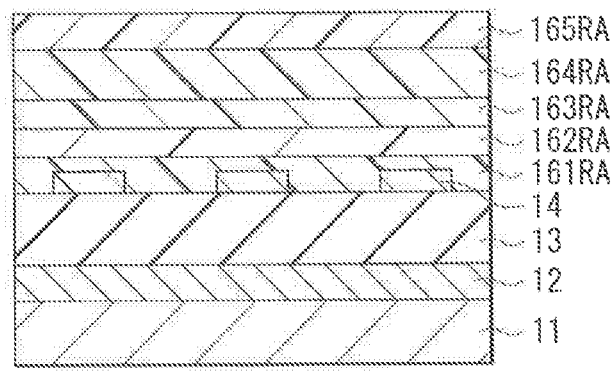
[ FIG. 47B ]
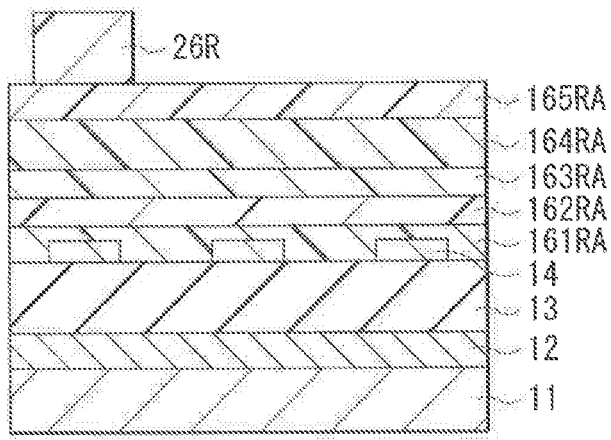
[ FIG. 47C ]
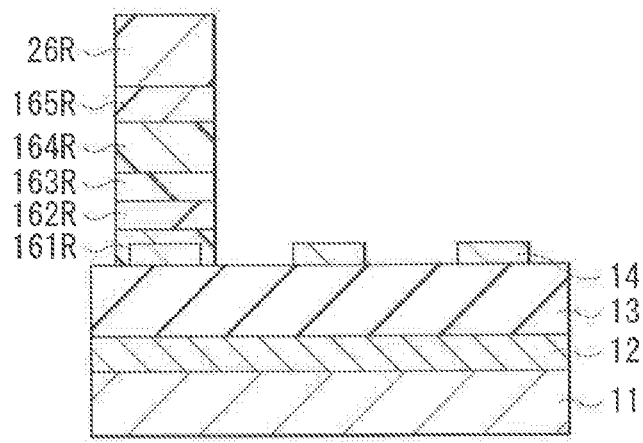

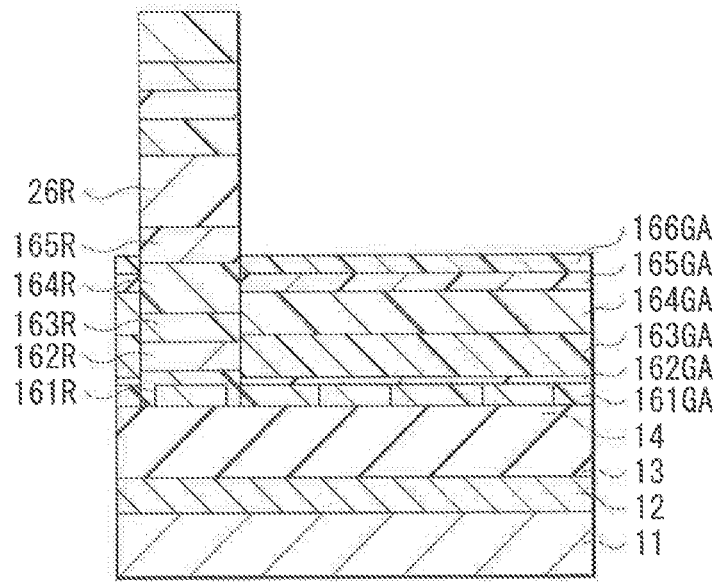
[ FIG. 48A ]
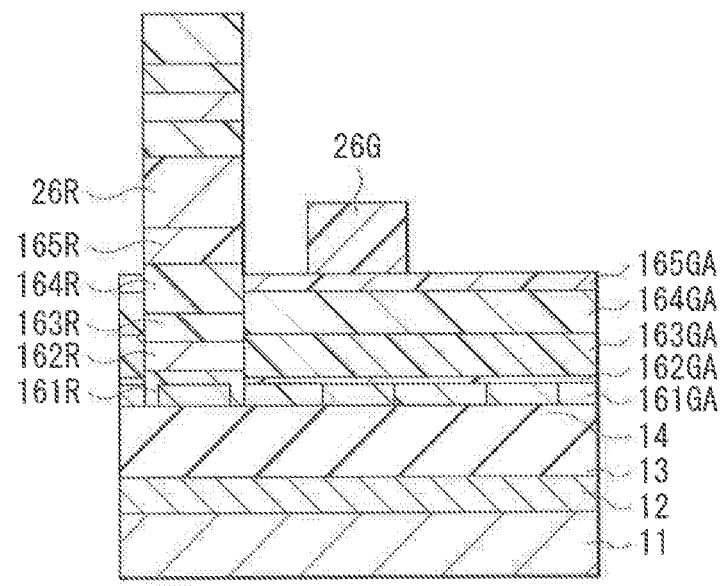
[ FIG. 48B ]

[ FIG. 48C ]
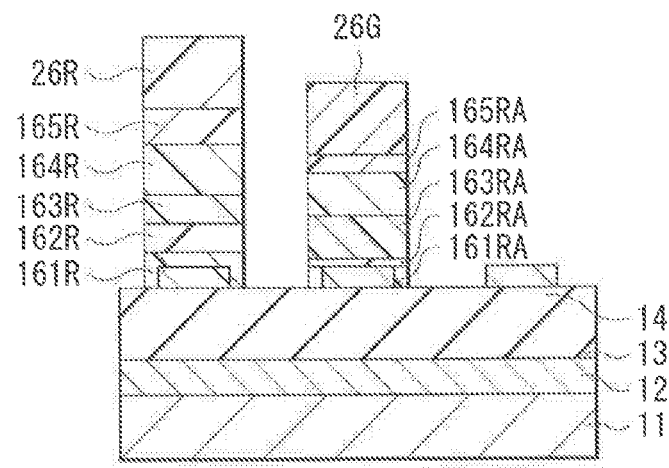
[ FIG. 49A ]
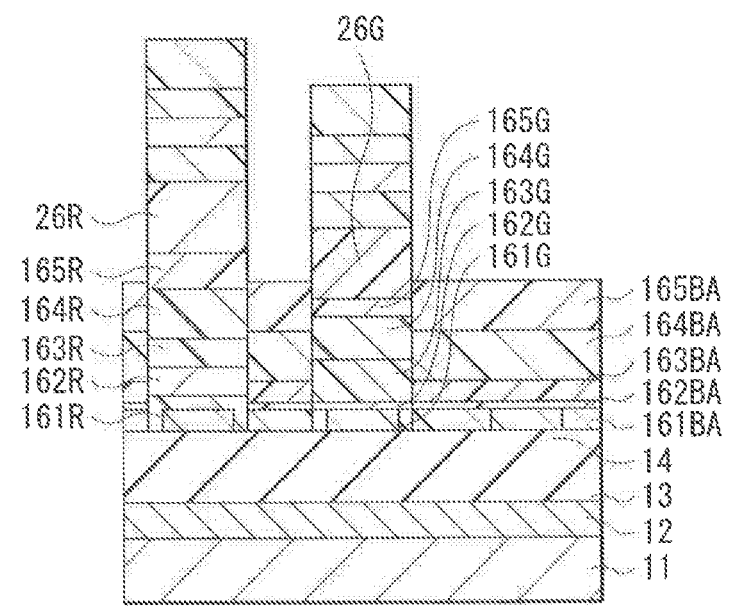

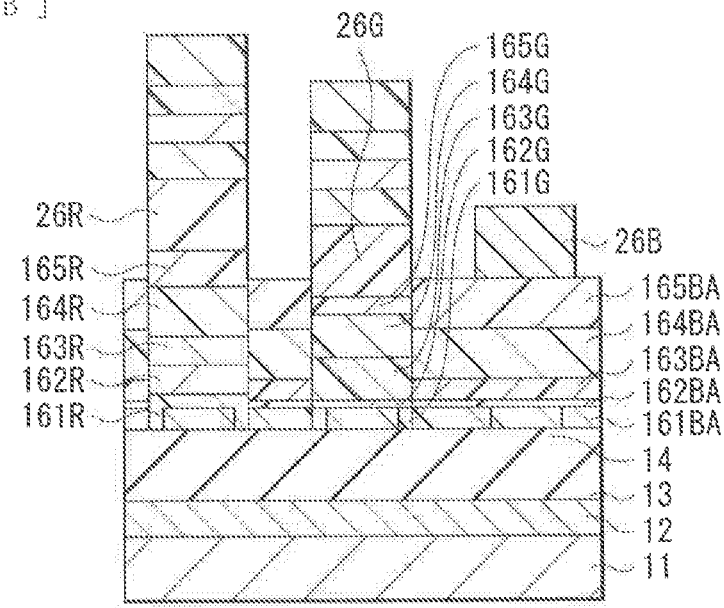
[ FIG. 49B ]
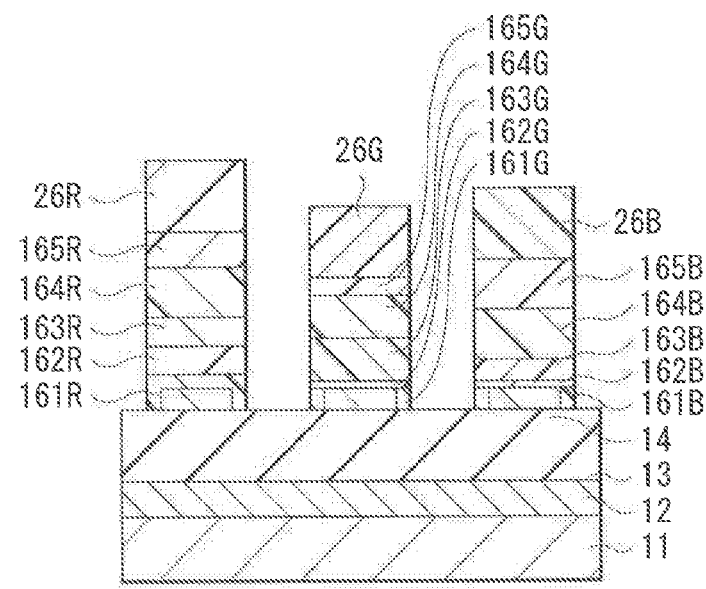
[ FIG. 49C ]

[ FIG. 50 ]
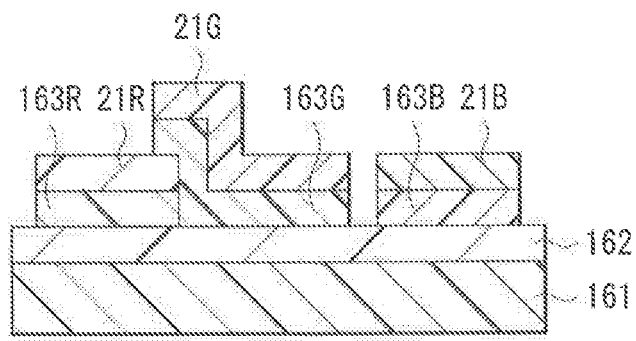
[ FIG. 51 ]
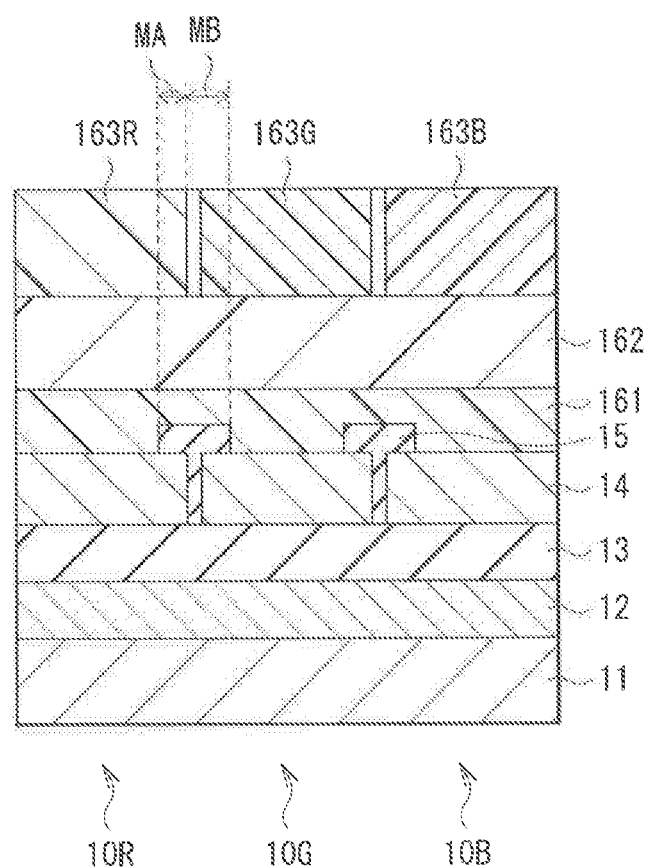

[ FIG. 52A ]
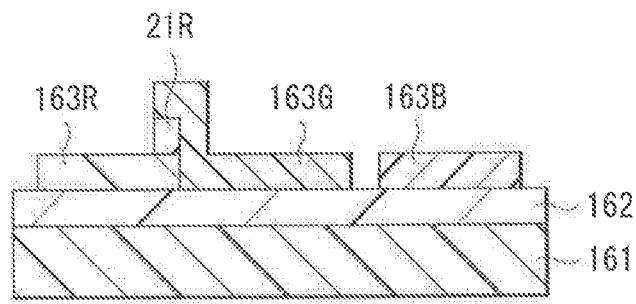
[ FIG. 52B ]
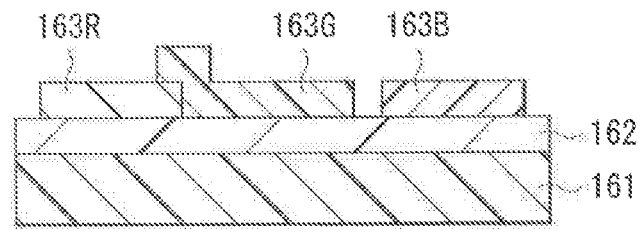
[ FIG. 52C ]
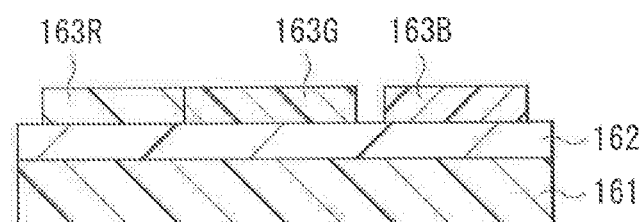

[FIG. 53]
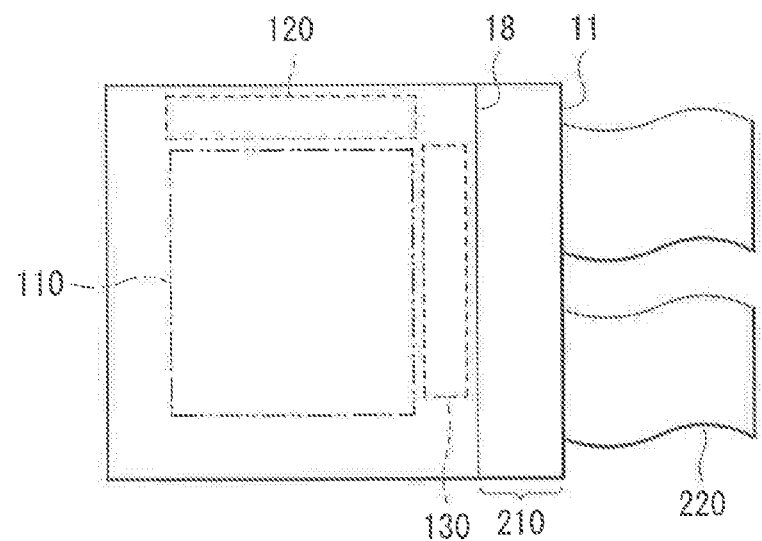
[FIG. 54]
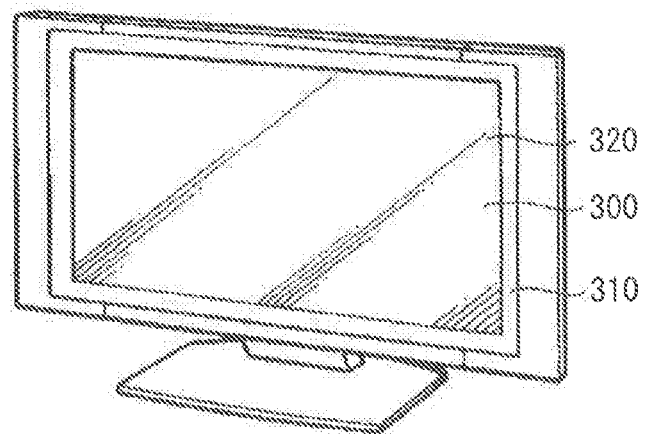

[ FIG. 55A ]
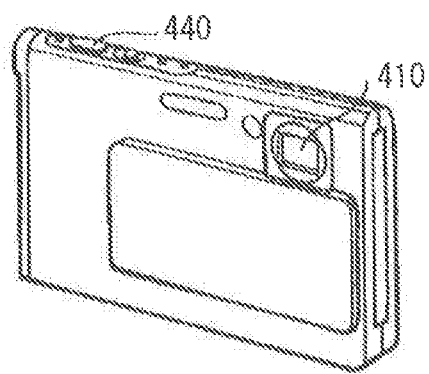
[ FIG. 55B ]
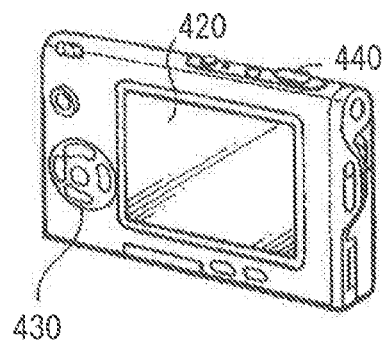

[ FIG. 56 ]
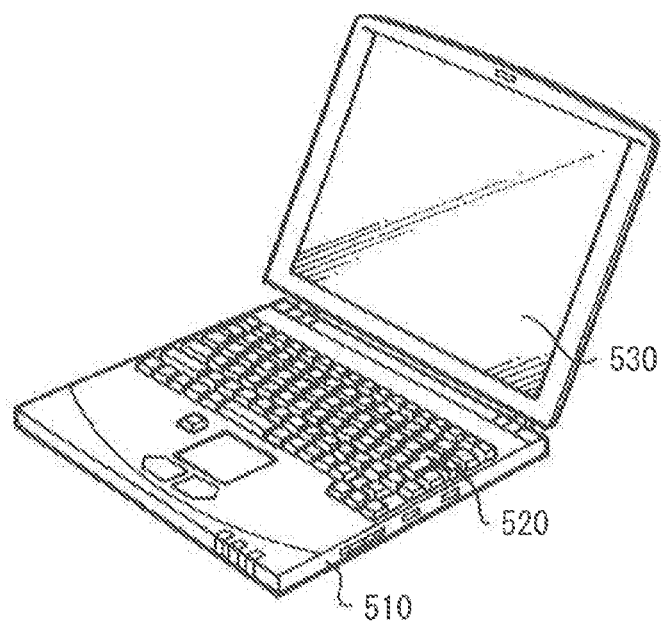
[ FIG. 57 ]
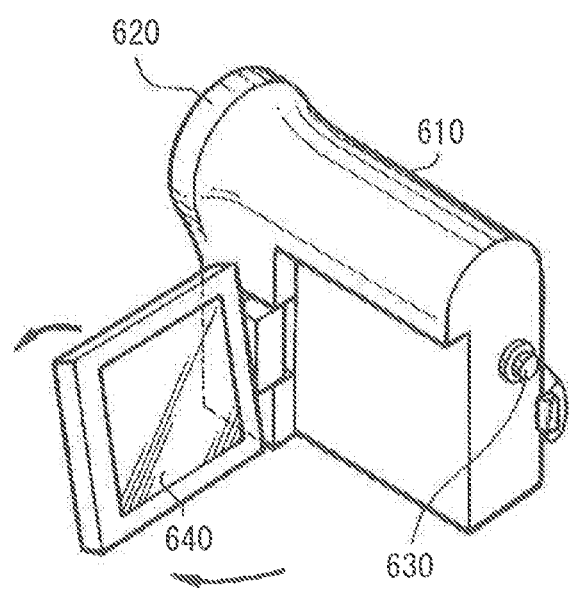

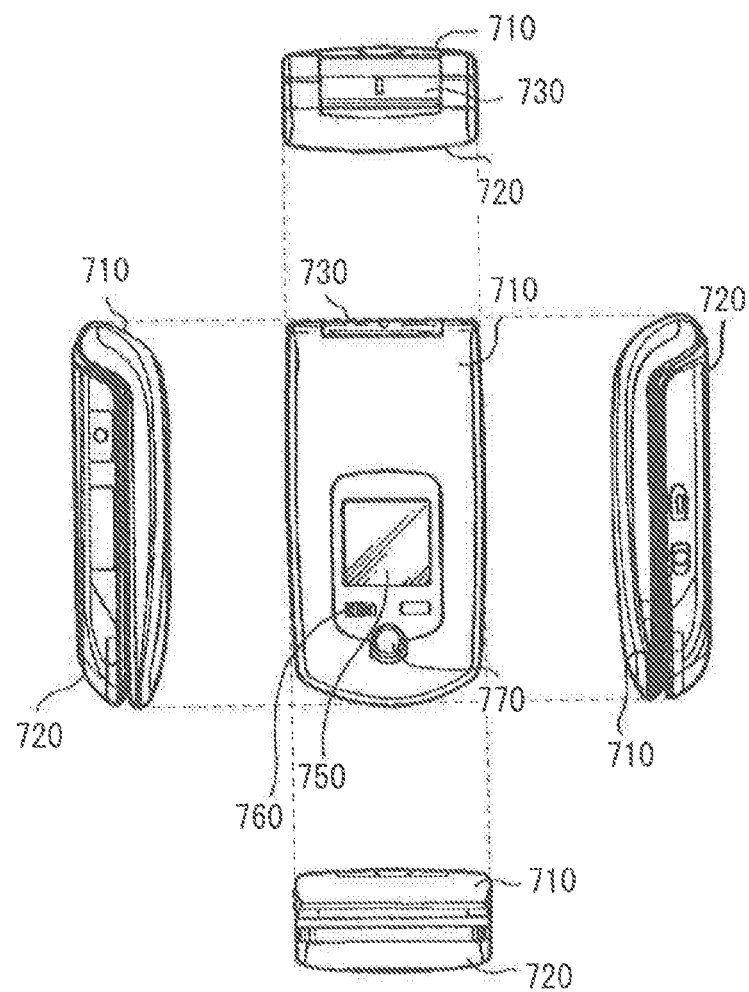
[FIG. 58A]

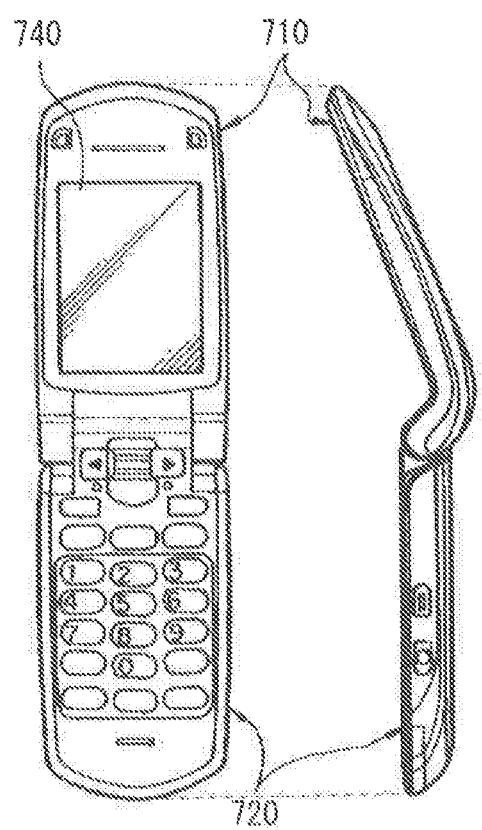
[ FIG. 58B ]

[FIG. 59]
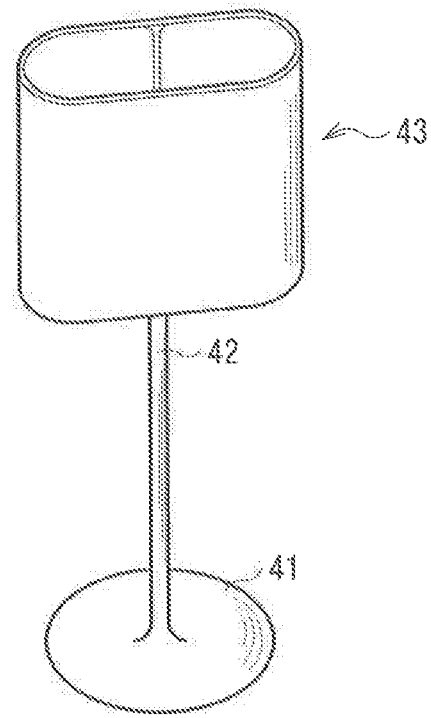
[FIG. 60]
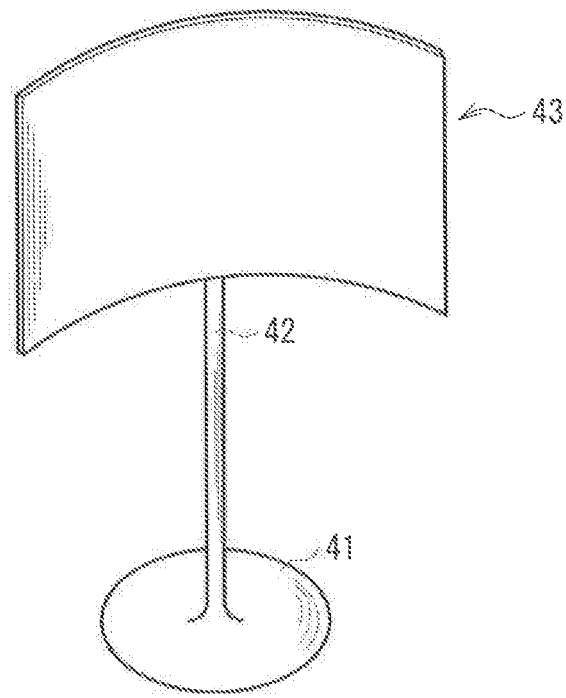

[FIG. 61]
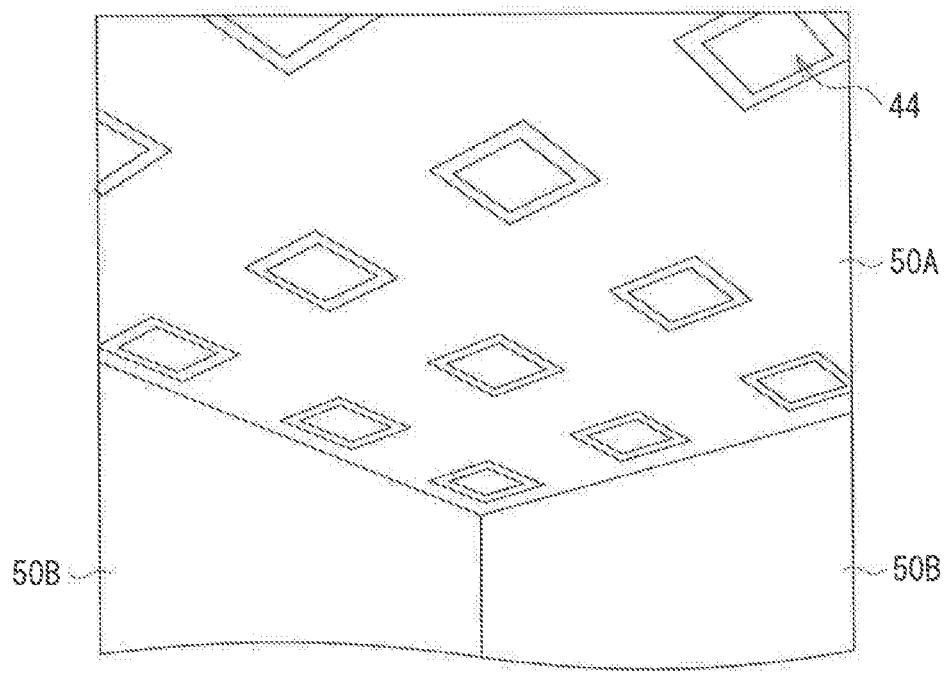

METHOD FOR MANUFACTURING ORGANIC LIGHT-EMITTING DEVICE AND METHOD OF MANUFACTURING DISPLAY UNIT

CROSS REFERENCES TO RELATED APPLICATIONS

The present application is a national stage of International Application No. PCT/JP2014/073180 filed on Sep. 3, 2014 and claims priority to Japanese Patent Application No. 2013-194362 filed on Sep. 19, 2013, the disclosure of which is incorporated herein by reference.

BACKGROUND

The technology relates to a method of manufacturing an organic light-emitting device using, for example, a printing method, and a method of manufacturing a display unit using the same.

In recent years, a method of forming an organic layer of an organic EL (electroluminescence) device by a printing method has been proposed. The printing method holds promise because of, for example, lower process cost than that in a vacuum evaporation method and easy upsizing.

The printing method is broadly divided into a non-contact system and a contact system as printing systems. Examples of the non-contact system may include an ink-jet method and a nozzle printing method. Examples of the contact system may include a flexographic printing method, a gravure offset printing method, and a reverse offset printing method.

In the reverse offset printing method, after a film of an ink is uniformly formed on a surface of a blanket, the blanket is pressed against a plate to remove a non-printing portion, and then a pattern remaining on the blanket is transferred to a printing target. The surface of the blanket may be formed of, for example, silicon rubber. The reverse offset printing method is considered as a promising method for application to an organic EL device, since the method makes it possible to form a film with a uniform thickness and to perform high-definition patterning (for example, refer to Patent Literature 1).

CITATION LIST

Patent Literature

Patent Literature 1: Japanese Unexamined Patent Application Publication No. 2010-158799

SUMMARY

It is desirable to form such an organic EL device without decreasing, for example but not limited to, light emission efficiency, and light emission lifetime.

Therefore, it is desirable to provide a method of manufacturing an organic light-emitting device that makes it possible to prevent deterioration, and a method of manufacturing a display unit using the same.

A method of manufacturing an organic light-emitting device according to an embodiment (A) of the technology includes: forming a first organic material layer on a substrate; and forming a mask in a first region on the first organic material layer, and then selectively removing the first organic material layer to form a first organic layer in the first region.

A method of manufacturing an organic light-emitting device according to an embodiment (B) of the technology includes: forming a liquid-repellent mask having an aperture in a first region on a substrate; and thereafter forming a first organic layer in the first region.

A method of manufacturing a display unit according to an embodiment (A) of the technology uses the method of manufacturing the organic light-emitting device according to the embodiment (A) of the technology.

A method of manufacturing a display unit according to an embodiment (B) of the technology uses the method of manufacturing the organic light-emitting device according to the embodiment (B) of the technology.

In the methods of manufacturing the organic light-emitting device or the methods of manufacturing the display unit according to the embodiments (A) and (B) of the technology, the first organic layer is formed in the first region by the mask on the substrate. Therefore, a process of forming a pattern of the organic layer on a blanket in advance by, for example but not limited to, a reverse offset printing method is unnecessary.

According to the methods of manufacturing the organic light-emitting device and the methods of manufacturing the display unit according to the embodiments (A) and (B) of the technology, the mask is used on the substrate; therefore, this makes it possible to form the first organic layer in a desired region (the first region) without bringing the blanket and the organic layer into contact with each other. This makes it possible to prevent entry of impurities from, for example, but not limited to, the blanket to the first organic layer and to suppress deterioration of the organic light-emitting device. It is to be noted that effects of the embodiments of the technology are not limited to effects described here, and may include any effect described in this description.

Additional features and advantages are described herein, and will be apparent from the following Detailed Description and the figures.

BRIEF DESCRIPTION OF THE FIGURES

FIG. 1 is a sectional view of a configuration of a main part of a display unit manufactured by a method according to a first embodiment of the technology.

FIG. 2 is a diagram of the entire display unit illustrated in FIG. 1.

FIG. 3 is a diagram of an example of a pixel drive circuit.

FIG. 4 is a diagram of a flow of the method of manufacturing the display unit illustrated in FIG. 1.

FIG. 5A is a sectional view of a process of the method of manufacturing the display unit illustrated in FIG. 1.

FIG. 5B is a sectional view of a process following FIG. 5A.

FIG. 5C is a sectional view of a process following FIG. 5B.

FIG. 5D is a sectional view of a process following FIG. 5C.

FIG. 6A is a sectional view of an example of a method of forming a mask illustrated in FIG. 5C.

FIG. 6B is a sectional view of a process following FIG. 6A.

FIG. 6C is a sectional view of a process following FIG. 6B.

FIG. 7A is a sectional view of a process following FIG. 6C.

FIG. 7B is a sectional view of a process following FIG. 7A.

FIG. 7C is a sectional view of a process following FIG. 7B.

FIG. 7D is a sectional view of a process following FIG. 7C.

FIG. 8A is a sectional view of a process following FIG. 5D.

FIG. 8B is a sectional view of a process following FIG. 8A.

FIG. 8C is a sectional view of a process following FIG. 8B.

FIG. 8D is a sectional view of a process following FIG. 8C.

FIG. 9A is a sectional view of a process following FIG. 8D.

FIG. 9B is a sectional view of a process following FIG. 9A.

FIG. 9C is a sectional view of a process following FIG. 9B.

FIG. 10A is a sectional view of a process of a method of forming a light-emitting layer according to a comparative example.

FIG. 10B is a sectional view of a process following FIG. 10A.

FIG. 10C is a sectional view of a process following FIG. 10B.

FIG. 10D is a sectional view of a process following FIG. 10C.

FIG. 11 is a sectional view of a main part of a display unit manufactured by a method according to Modification Example 1.

FIG. 12A is a sectional view of a process of the method of manufacturing the display unit illustrated in FIG. 11.

FIG. 12B is a sectional view of a process following FIG. 12A.

FIG. 12C is a sectional view of a process following FIG. 12B.

FIG. 13A is a sectional view of a process following FIG. 12C.

FIG. 13B is a sectional view of a process following FIG. 13A.

FIG. 13C is a sectional view of a process following FIG. 13B.

FIG. 14A is a sectional view of a process of a method of manufacturing a display unit according to a second embodiment of the technology.

FIG. 14B is a sectional view of a process following FIG. 14A.

FIG. 14C is a sectional view of a process following FIG. 14B.

FIG. 15A is a sectional view of a process following FIG. 14C.

FIG. 15B is a sectional view of a process following FIG. 15A.

FIG. 15C is a sectional view of a process following FIG. 15B.

FIG. 16A is a sectional view of a process following FIG. 15C.

FIG. 16B is a sectional view of a process following FIG. 16A.

FIG. 16C is a sectional view of a process following FIG. 16B.

FIG. 17A is a sectional view of a process of a method of manufacturing a display unit according to Modification Example 2.

FIG. 17B is a sectional view of a process following FIG. 17A.

FIG. 17C is a sectional view of a process following FIG. 17B.

FIG. 18A is a sectional view of a process following FIG. 17C.

FIG. 18B is a sectional view of a process following FIG. 18A.

FIG. 18C is a sectional view of a process following FIG. 18B.

FIG. 19 is a sectional view of a configuration of a main part of a display unit manufactured by a method according to Modification Example 3.

FIG. 20A is a sectional view of an example of a process of forming a light-emitting layer illustrated in FIG. 19.

FIG. 20B is a sectional view of a process following FIG. 20A.

FIG. 20C is a sectional view of a process following FIG. 20B.

FIG. 20D is a sectional view of a process following FIG. 20C.

FIG. 21 is a sectional view of a configuration of a main part of a display unit manufactured by a method according to Modification Example 4.

FIG. 22A is a sectional view of an example (Modification Example 4-2) of a process of forming a light-emitting layer illustrated in FIG. 21.

FIG. 22B is a sectional view of a process following FIG. 22A.

FIG. 23A is a sectional view of an example (Modification Example 4-3) of the process of forming the light-emitting layer illustrated in FIG. 21.

FIG. 23B is a sectional view of a process following FIG. 23A.

FIG. 24A is a sectional view of an example (Modification Example 4-4) of the process of forming the light-emitting layer illustrated in FIG. 21.

FIG. 24B is a sectional view of a process following FIG. 24A.

FIG. 24C is a sectional view of a process following FIG. 24B.

FIG. 24D is a sectional view of a process following FIG. 24C.

FIG. 25A is a sectional view of a process following FIG. 24D.

FIG. 25B is a sectional view of a process following FIG. 25A.

FIG. 25C is a sectional view of a process following FIG. 25B.

FIG. 25D is a sectional view of a process following FIG. 25C.

FIG. 26A is a sectional view of an example (Modification Example 4-5) of the process of forming the light-emitting layer illustrated in FIG. 21.

FIG. 26B is a sectional view of a process following FIG. 26A.

FIG. 26C is a sectional view of a process following FIG. 26B.

FIG. 27 is a sectional view of a configuration of a main part of a display unit manufactured by a method according to Modification Example 5.

FIG. 28A is a sectional view of an example of a process of forming a hole transport layer illustrated in FIG. 27.

FIG. 28B is a sectional view of a process following FIG. 28A.

FIG. 28C is a sectional view of a process following FIG. 28B.

FIG. 28D is a sectional view of a process following FIG. 28C.

FIG. 29A is a sectional view of another example of the process of forming the hole transport layer illustrated in FIG. 27.

FIG. 29B is a sectional view of a process following FIG. 29A.

FIG. 29C is a sectional view of a process following FIG. 29B.

FIG. 29D is a sectional view of a process following FIG. 29C.

FIG. 30 is a sectional view of a configuration of a main part of a display unit manufactured by a method according to Modification Example 6.

FIG. 31 is a sectional view of a configuration of a main part of a display unit manufactured by a method according to Modification Example 7.

FIG. 32 is a sectional view of a configuration of a main part of a display unit manufactured by a method according to Modification Example 8.

FIG. 33A is a sectional view of an example of the method of manufacturing the display unit illustrated in FIG. 32.

FIG. 33B is a sectional view of a process following FIG. 33A.

FIG. 33C is a sectional view of a process following FIG. 33B.

FIG. 33D is a sectional view of a process following FIG. 33C.

FIG. 34A is a sectional view of a process following FIG. 33D.

FIG. 34B is a sectional view of a process following FIG. 34A.

FIG. 34C is a sectional view of a process following FIG. 34B.

FIG. 35A is a sectional view of a process following FIG. 34C.

FIG. 35B is a sectional view of a process following FIG. 35A.

FIG. 35C is a sectional view of a process following FIG. 35B.

FIG. 36A is a sectional view of another example of the method of manufacturing the display unit illustrated in FIG. 32.

FIG. 36B is a sectional view of a process following FIG. 36A.

FIG. 36C is a sectional view of a process following FIG. 36B.

FIG. 37A is a sectional view for describing a method of manufacturing a display unit according to a third embodiment of the technology.

FIG. 37B is a sectional view of another example illustrated in FIG. 37A.

FIG. 37C is a sectional view of still another example illustrated in FIG. 37A.

FIG. 38 is a sectional view of a configuration of a main part of a display unit manufactured by a method according to Modification Example 9.

FIG. 39A is a sectional view of an example of the method of manufacturing the display unit illustrated in FIG. 38.

FIG. 39B is a sectional view of a process following FIG. 39A.

FIG. 39C is a sectional view of a process following FIG. 39B.

FIG. 40A is a sectional view of a process following FIG. 39C.

FIG. 40B is a sectional view of a process following FIG. 40A.

FIG. 40C is a sectional view of a process following FIG. 40B.

FIG. 41A is a sectional view of a process following FIG. 40C.

FIG. 41B is a sectional view of a process following FIG. 41A.

FIG. 41C is a sectional view of a process following FIG. 41B.

FIG. 42 is a sectional view of a configuration of a main part of a display unit manufactured by a method according to Modification Example 10.

FIG. 43A is a sectional view of an example of the method of manufacturing the display unit illustrated in FIG. 42.

FIG. 43B is a sectional view of a process following FIG. 43A.

FIG. 43C is a sectional view of a process following FIG. 43B.

FIG. 44A is a sectional view of a process following FIG. 43C.

FIG. 44B is a sectional view of a process following FIG. 44A.

FIG. 44C is a sectional view of a process following FIG. 44B.

FIG. 45A is a sectional view of a process following FIG. 44C.

FIG. 45B is a sectional view of a process following FIG. 45A.

FIG. 45C is a sectional view of a process following FIG. 45B.

FIG. 46 is a sectional view of a configuration of a main part of a display unit manufactured by a method according to Modification Example 11.

FIG. 47A is a sectional view of an example of the method of manufacturing the display unit illustrated in FIG. 46.

FIG. 47B is a sectional view of a process following FIG. 47A.

FIG. 47C is a sectional view of a process following FIG. 47B.

FIG. 48A is a sectional view of a process following FIG. 47C.

FIG. 48B is a sectional view of a process following FIG. 48A.

FIG. 48C is a sectional view of a process following FIG. 48B.

FIG. 49A is a sectional view of a process following FIG. 48C.

FIG. 49B is a sectional view of a process following FIG. 49A.

FIG. 49C is a sectional view of a process following FIG. 49B.

FIG. 50 is a sectional view of a configuration of a main part of a display unit manufactured by a method according to Modification Example 12.

FIG. 51 is a sectional view for describing resolution.

FIG. 52A is a sectional view of an example of a state in which a mask illustrated in FIG. 50 is removed.

FIG. 52B is a sectional view of another example of FIG. 52A.

FIG. 52C is a sectional view of still another example of FIG. 52A.

FIG. 53 is a plan view of a schematic configuration of a module including the display unit manufactured by one of the foregoing embodiments and other examples.

FIG. 54 is a perspective view of an appearance of Application Example 1 of the display unit manufactured by one of the foregoing embodiments and other examples.

FIG. 55A is a perspective view of an appearance viewed from a front side of Application Example 2.

FIG. 55B is a perspective view of an appearance viewed from a back side of Application Example 2.

FIG. 56 is a perspective view of an appearance of Application Example 3.

FIG. 57 is a perspective view of an appearance of Application Example 4.

FIG. 58A is a diagram of a state in which Application Example 5 is closed.

FIG. 58B is a diagram of a state in which Application Example 5 is opened.

FIG. 59 is a perspective view of an appearance of an example of an illumination unit to which an organic light-emitting device illustrated in FIG. 1 and other drawings is applied.

FIG. 60 is a perspective view of an appearance of another example of the illumination unit.

FIG. 61 is a perspective view of an appearance of still another example of the illumination unit.

DETAILED DESCRIPTION

Some embodiments of the technology will be described in detail below with reference to the accompanying drawings. It is to be noted that description will be given in the following order.

1. First Embodiment (A method of manufacturing a display unit including a light-emitting layer in each device: an example in which the light-emitting layer is patterned into the same shape as that of a mask)
2. Modification Example 1 (An example in which a liquid-repellent partition wall is formed)
3. Second Embodiment (An example in which a liquid-repellent mask is used)
4. Modification Example 2 (An example in which a region from a front surface to a side surface of an organic layer is covered with a mask)
5. Modification Example 3 (An example including a light-emitting layer shared by devices)
6. Modification Example 4 (An example including a connection layer)
7. Modification Example 5 (An example including a hole transport layer in each device)
8. Modification Examples 6 to 8 (Examples in which a predetermined device includes a hole transport layer)
9. Third Embodiment (An example in which an organic layer is formed with use of an evaporation method)
10. Modification Example 9 (An example including a hole injection layer and a hole transport layer in each device)
11. Modification Example 10 (An example including an electron transport layer and an electron injection layer in each device)
12. Modification Example 11 (An example in which all organic layers are formed in each device)
13. Modification Example 12 (An example in which organic layers of adjacent devices are formed to overlap each other)

First Embodiment

Configuration of Display Unit 1

FIG. 1 illustrates a sectional configuration of a display unit (a display unit 1) manufactured by a method according to a first embodiment of the technology that will be described later. This display unit 1 is an organic EL (Electroluminescence) display unit, and may include, for example, a red organic EL device 10R, a green organic EL device 10G, and a blue organic EL device 10B on a substrate 11 with a TFT (Thin Film Transistor) layer 12 and a planarization layer 13 in between.

(Entire Configuration)

FIG. 2 illustrates an entire configuration of this display unit 1. A plurality of red organic EL devices 10R, a plurality of green organic EL devices 10G, and a plurality of blue organic EL devices 10B are provided in a display region 110 in a central region of the substrate 11, and are arranged in a matrix. A signal line drive circuit 120 and a scanning line drive circuit 130 as drivers for image display are provided around the display region 110.

A pixel drive circuit 140 for driving of the red organic EL devices 10R, the green organic EL devices 10G, and the blue organic EL devices 10B is provided in the display region 110 together with the red organic EL devices 10R, the green organic EL devices 10G, and the blue organic EL devices 10B. FIG. 3 illustrates an example of the pixel drive circuit 140. The pixel drive circuit 140 is an active drive circuit formed in a layer (for example, the TFT layer 12) below a lower electrode 14 that will be described later. In other words, this pixel drive circuit 140 includes a driving transistor Tr1, a writing transistor Tr2, a capacitor (a retention capacitor) Cs between these transistors Tr1 and Tr2, and the red organic El device 10R (or the green organic EL device 10G or the blue organic EL device 10B) connected in series to the driving transistor Tr1 between a first power supply line (Vcc) and a second power supply line (GND). Each of the driving transistor Tr1 and the writing transistor Tr2 may be configured of a typical thin film transistor (TFT), and may have, for example, but not exclusively, an inverted stagger configuration (a so-called bottom gate configuration) or a stagger configuration (a top gate configuration).

In the pixel drive circuit 140, a plurality of signal lines 120A are provided along a column direction, and a plurality of scanning lines 130A are provided along a row direction. An intersection of each signal line 120A and each scanning line 130A corresponds to one of the red organic EL device 10R, the green organic EL device 10G, and the blue organic EL device 10B. Each of the signal lines 120A is connected to the signal line drive circuit 120, and an image signal is supplied from the signal line drive circuit 120 to a source electrode of the writing transistor Tr2 through the signal line 120A. Each of the scanning lines 130A is connected to the scanning line drive circuit 130, and a scanning signal is sequentially supplied from the scanning line drive circuit 130 to a gate electrode of the writing transistor Tr2 through the scanning line 130A.

The signal line drive circuit 120 is configured to supply a signal voltage of an image signal according to luminance information supplied from a signal supply source (not illustrated) to the selected red organic EL device 10R, the selected green organic EL device 10G, or the selected blue organic EL device 10B through the signal line 120A. The scanning line drive circuit 130 may be configured of, for example but not limited to, a shift register configured to sequentially shift (transfer) a start pulse in synchronization with an inputted clock pulse. The scanning line drive circuit 130 is configured to scan pixels 10 row by row upon writing of an image signal to each of the pixels 10 and sequentially supply a scanning signal to each of the scanning lines 130A. The signal voltage from the signal line drive circuit 120 and the scanning signal from the scanning line drive circuit 130 are supplied to the signal line 120A and the scanning line 130A, respectively.

(Main-Part Configuration of Display Unit 1)

Next, referring again to FIG. 1, specific configurations of, for example but not limited to, the substrate 11, the TFT layer 12, the planarization layer 13, the organic EL devices (the red organic EL devices 10R, the green organic EL devices 10G, and the blue organic EL devices 10B) will be described below.

The substrate 11 is a supporting body with a flat surface on which the red organic EL devices 10R, the green organic EL devices 10G, and the blue organic EL devices 10G are formed in an array. For example, known materials such as quartz, glass, metal foil, and a film or a sheet made of a resin may be used. In particular, quartz or glass may be preferably used. In a case where the film or the sheet made of the resin is used, as the resin, for example but not limited to, methacrylate resins typified by poly(methyl methacrylate) (PMMA), polyesters such as polyethylene terephthalate (PET), polyethylene naphthalate (PEN), and polybutylene naphthalate (PBN), and a polycarbonate resin may be used; however, in this case, to suppress water permeability and gas permeability, the substrate 11 may preferably have a laminate configuration, and may be preferably subjected to surface treatment.

As described above, the pixel drive circuit 140 is formed in the TFT layer 12, and the driving transistor Tr1 is electrically connected to the lower electrode 14. The planarization layer 13 is configured to planarize a surface of the substrate 11 (the TFT layer 12) on which the pixel drive circuit 140 is formed, and may be preferably made of a material with high pattern accuracy, since a fine connection hole (not illustrated) allowing the driving transistor Tr1 and the lower electrode 14 to be connected to each other is formed in the planarization layer 13. Examples of the material of the planarization layer 13 may include an organic material such as polyimide and an inorganic material such as silicon oxide ($SiO_2$).

Each of the red organic EL devices 10R, the green organic EL devices 10G, and the blue organic EL devices 10B includes the lower electrode 14 as an anode, a partition wall 15, an organic layer 16, and an upper electrode 17 as a cathode in this order from the substrate 11. The organic layer 16 includes a hole injection layer 161, a hole transport layer 162, a light-emitting layer 163, an electron transport layer 164, and an electron injection layer 165 in this order from the lower electrode 14. The light-emitting layer 163 is configured of a red light-emitting layer 163R, a green light-emitting layer 163G, and a blue light-emitting layer 163B, and the red light-emitting layer 163R, the green light-emitting layer 163G, and the blue light-emitting layer 163B are provided for the red organic EL device 10R, the green organic EL device 10G, and the blue organic EL device 10B, respectively.

The lower electrode 14 is provided on the planarization layer 13 for each of the red organic EL devices 10R, the green organic EL devices 10G, and the blue organic EL devices 10B, and may be made of, for example, a transparent material of a simple substance or an alloy of a metal element such as chromium (Cr), gold (Au), platinum (Pt), nickel (Ni), copper (Cu), tungsten (W), or silver (Ag). Alternatively, the lower electrode 14 may be configured of a laminate configuration of the foregoing metal film and a transparent conductive film. Examples of the transparent conductive film may include an oxide of indium and tin (ITO), indium-zinc oxide (InZnO), and an alloy of zinc oxide (ZnO) and aluminum (Al). In a case where the lower electrode 14 is used as an anode, the lower electrode 14 may be preferably made of a material with high hole injection properties; however, even if a material with an insufficient work function such as an aluminum alloy is used, the lower electrode 14 may function as an anode by providing the appropriate hole injection layer 161.

The partition wall 15 is configured to secure insulation between the lower electrode 14 and the upper electrode 17 and to form a light emission region into a desired shape, and has an aperture corresponding to the light emission region. Layers above the partition wall 15, i.e., layers from the hole injection layer 161 to the upper electrode 17 may be provided not only on the aperture but also on the partition wall 15; however, light is emitted only from the aperture. The partition wall 15 may be made of, for example, an inorganic insulating material such as silicon oxide. The partition wall 15 may be configured by laminating a photosensitive resin such as positive photosensitive polybenzoxazole or positive photosensitive polyimide on an inorganic insulating material.

The hole injection layer 161 is shared by the red organic EL devices 10R, the green organic EL devices 10G, and the blue organic EL devices 10B, and is configured to enhance hole injection efficiency and to have a function as a buffer layer configured to prevent leakage. The hole injection layer 161 may be formed preferably with, for example, a thickness of 5 nm to 100 nm both inclusive, and more preferably with a thickness of 8 nm to 50 nm both inclusive.

Examples of the material of the hole injection layer 161 may include polyaniline and a derivative thereof, polythiophene and a derivative thereof, polypyrrole and a derivative thereof, polyphenylene and a derivative thereof, polythienylene vinylene and a derivative thereof, polyquinoline and a derivative thereof, polyquinoxaline and a derivative thereof, a conductive polymer such as a polymer including an aromatic amine structure in a main chain or a side chain, metal phthalocyanine (such as copper phthalocyanine), and carbon, and the material of the hole injection layer 161 may be appropriately selected, depending on a relationship with the material of an electrode or a layer adjacent thereto.

In a case where the hole injection layer 161 is made of a polymer material, the weight-average molecular weight (Mw) of the polymer material may be, for example, from about 2000 to about 300000 both inclusive, and may be preferably from about 5000 to about 200000 both inclusive. When the Mw is less than 5000, there is a possibility that the polymer material is dissolved when the hole transport layer 162 and layers thereabove are formed, and when the Mw exceeds 300000, film formation may be difficult due to gelation of the material.

Examples of a typical polymer material used for the hole injection layer 161 may include polyaniline and/or oligoaniline, and polydioxythiophene such as poly(3,4-ethylenedioxythiophene) (PEDOT). More specifically, for example but not limited to, Nafion (trademark) and Liquion (trademark) manufactured by H.C. Starck GmbH, ELsource (trademark) manufactured by Nissan Chemical Industries. Ltd., or a conductive polymer called Verazol manufactured by Soken Chemical & Engineering Co., Ltd. may be used.

In a case where the lower electrode 14 is used as an anode, the lower electrode 14 may be preferably formed of a material with high hole injection properties. However, for example, even a material with a relatively small work function value such as an aluminum alloy may be used as the material of the anode by providing the appropriate hole injection layer 161.

The hole transport layer 162 is configured to enhance hole transport efficiency to the light-emitting layer 163, and is provided on the hole injection layer 161 to be shared by the red organic EL devices 10R, the green organic EL devices 10G, and the blue organic EL devices 10B.

Depending on an entire device configuration, a thickness of the hole transport layer 162 may be, preferably from 10 nm to 200 nm both inclusive, and more preferably from 15 nm to 150 nm both inclusive. As a polymer material forming the hole transport layer 162, a light-emitting material soluble in an organic solvent, for example but not limited to, polyvinylcarbazole and a derivative thereof, polyfluorene and a derivative thereof, polyaniline and a derivative thereof, polysilane and a derivative thereof, a polysiloxane derivative having an aromatic amine in a side chain or a main chain, polythiophene and a derivative thereof, and polypyrrole may be used.

A weight-average molecular weight (Mw) of the polymer material may be preferably from about 50000 to about 300000 both inclusive, and may be specifically preferably from about 100000 to about 200000 both inclusive. In a case where the Mw is less than 50000, upon formation of the light-emitting layer, a low-molecular-weight component in the polymer material is lost to cause a dot in a hole injection/transport layer; therefore, initial performance of the organic EL device may be degraded, or deterioration of the device may be caused. On the other hand, in a case where the Mw exceeds 300000, film formation may be difficult due to gelation of the material.

It is to be noted that the weight-average molecular weight (Mw) is a value determined by gel permeation chromatography (GPC) using polystyrene standards with use of tetrahydrofuran as a solvent.

The light-emitting layer 163 is configured to emit light by the recombination of electrons and holes in response to the application of an electric field. The red light-emitting layer 163R may be made of, for example, a light-emitting material having one or more peaks in a wavelength range of 620 nm to 750 nm both inclusive, the green light-emitting layer 163G may be made of, for example, a light-emitting material having one or more peaks in a wavelength range of 495 nm to 570 nm both inclusive, and the blue light-emitting layer 163B may be made of, for example, a light-emitting material having one or more peaks in a wavelength range of 450 nm to 495 nm both inclusive. Depending on the entire device configuration, a thickness of the light-emitting layer 163 may be preferably, for example, from 10 nm to 200 nm both inclusive, and more preferably from 15 nm to 100 nm both inclusive.

For the light-emitting layer 163, for example, a mixed material in which a low-molecular-weight material (a monomer or an oligomer) is added to a polymer (light-emitting) material may be used. Examples of the polymer material forming the light-emitting layer 163 may include a polyfluorene-based polymer derivative, a (poly)paraphenylene vinylene derivative, a polyphenylene derivative, a polyvinylcarbazole derivative, a polythiophene derivative, a perylene-based pigment, a coumarin-based pigment, a rhodamine-based pigment, and the foregoing polymer material doped with an organic EL material. As a doping material, for example, rubrene, perylene, 9,10-diphenylanthracene, tetraphenyl butadiene, nile red, or Coumarin6 may be used.

The electron transport layer 164 is configured to enhance electron transport efficiency to the light-emitting layer 163, and is provided as a common layer shared by the red organic EL devices 10R, the green organic EL devices 10G, and the blue organic EL devices 10B. For example, quinoline, perylene, phenanthroline, phenanthrene, pyrene, bisstyryl, pyrazine, triazole, oxazole, fullerene, oxadiazole, fluorenone, anthracene, naphthalene, butadiene, coumarin, acridine, stilbene, derivatives thereof, and metal complexes thereof, for example, tris(8-hydroxyquinoline) aluminum (Alq3 for short) may be used as the material of the electron transport layer 164.

The electron injection layer 165 is configured to enhance electron injection efficiency, and is provided as a common layer on an entire surface of the electron transport layer 164. As the material of the electron injection layer 165, for example, lithium oxide ($Li_2O$) which is an oxide of lithium (Li), cesium carbonate ($Cs_2CO_3$) which is a complex oxide of cesium, or a mixture thereof may be used. Moreover, as the material of the electron injection layer 165, a simple substance or an alloy of an alkali-earth metal such as calcium (Ca) or barium (Ba), an alkali metal such as lithium or cesium, or a metal with a small work function such as indium (In) or magnesium (Mg) may be used, and alternatively, oxides, complex oxides, and fluorides of the metals, and a mixture thereof may be used.

The upper electrode 17 is provided on an entire surface of the electron injection layer 165 in a state in which the upper electrode 17 is insulated from the lower electrode 14. In other words, the upper electrode 17 is a common electrode shared by the red organic EL devices 10R, the green organic EL devices 10G, and the blue organic EL devices 10B. The upper electrode 17 may be formed of, for example, aluminum (Al) with a thickness of 200 nm.

The red organic EL devices 10R, the green organic EL devices 10G, and the blue organic EL devices 10B may be covered with, for example, a protective layer (not illustrated), and a sealing substrate (not illustrated) made of glass or the like is further bonded onto an entire surface of the protective layer with an adhesive layer (not illustrated) made of a thermosetting resin, an ultraviolet curable resin, or the like in between.

The protective layer may be made of one of an insulating material and a conductive material, and may be formed with, for example, a thickness of 2 μm to 3 both inclusive. For example, an inorganic amorphous insulating material such as amorphous silicon (α-silicon), amorphous silicon carbide (α-SiC), amorphous silicon nitride ($\alpha$-$Si_{1-x}N_x$), or amorphous carbon (α-C) may be used. Since such a material does not form grains, the material has low water permeability, and forms a favorable protective film.

The sealing substrate is disposed close to the upper electrode 17 of the red organic EL devices 10R, the green organic EL devices 10G, and the blue organic EL devices 10B, and is configured to seal, together with the adhesive layer, the red organic EL devices 10R, the green organic EL devices 10G, and the blue organic EL devices 10B.

In the display unit 1, light from the red organic EL devices 10R, the green organic EL devices 10G, and the blue organic EL devices 10B may be extracted from either the substrate 11 or the sealing substrate, and the display unit 1 may be a bottom emission display unit or a top emission display unit. In a case where the display unit 1 is a bottom emission display unit, a color filter (not illustrated) may be provided between the red organic EL devices 10R, the green organic EL devices 10G, and the blue organic EL devices 10B, and the substrate 11. In a case where the display unit 1 is a top emission display unit, the color filter may be provided between the red organic EL devices 10R, the green organic EL devices 10G, and the blue organic EL devices 10B, and the sealing substrate.

The color filter includes a red filter, a green filter, and a blue filter facing each of the red organic EL devices 10R, each of the green organic EL devices 10G, and each of the blue organic EL devices 10B, respectively. Each of the red filter, the green filter, and the blue filter is made of a resin including a pigment, and appropriate selection of the pigment makes it possible to adjust the red filter, the green filter, and the blue filter so as to have high light transmittance in a wavelength range of target red, green, or blue and low light transmittance in other wavelength ranges.

In the color filter, a light-shielding film is provided as a black matrix together with the red filter, the green filter, and the blue filter. By the light-shielding film, light generated in the red organic EL devices 10R, the green organic EL devices 10G, and the blue organic EL devices 10B is extracted, and outside light reflected by the red organic EL devices 10R, the green organic EL devices 10G, the blue organic EL devices 10B, and wiring lines therebetween is absorbed, thereby obtaining high contrast. The light-shielding film may be configured of, for example, a black resin film that contains a black colorant and has optical density of 1 or more, or a thin film filter using interference of a thin film. In particular, the light-shielding film may be preferably configured of the black resin film, since the black resin film makes it possible to form the light-shielding film easily at low cost. The thin film filter may include, for example, one or more thin films made of a metal, a metal nitride, or a metal oxide, and is configured to attenuate light with use of interference of the thin film. Specifically, a thin film filter configured by alternately laminating chromium (Cr) and chromium oxide ($Cr_2O_3$) may be used.

[Method of Manufacturing Display Unit 1]

FIG. 4 illustrates a flow of the method of manufacturing the display unit according to this embodiment. The method will be described below step by step (FIGS. 5A to 9C).

(Process of Forming Lower Electrode 14)

First, the TFT layer 12 and the planarization layer 13 are formed in this order on the substrate 11 made of the foregoing material. Next, for example, a transparent conductive film made of ITO is formed on an entire surface of the substrate 11, and the conductive film is patterned to from the lower electrode 14 (step S11). At this time, the lower electrode 14 is brought into conduction with a drain electrode of the driving transistor Tr1 (the TFT layer 12) through a connection hole.

(Process of Forming Partition Wall 15)

Subsequently, after a film of an inorganic insulating material such as $SiO_2$ is formed on the planarization layer 13 and the lower electrode 14 by, for example, CVD (Chemical Vapor Deposition), a photosensitive resin is laminated on the film, and patterning is performed on the photosensitive resin to form the partition wall 15 (step S12).

After the partition wall 15 is formed, a front surface, i.e., a surface where the lower electrode 14 and the partition wall 15 are formed of the drive substrate 11 is subjected to oxygen plasma treatment to remove contaminants such as an organic matter adhered to the surface, thereby improving wettability (step S13). More specifically, the substrate 11 is heated at a predetermined temperature, for example, from about 70° C. to about 80° C. both inclusive, and then is subjected to plasma treatment using oxygen as reactant gas ($O_2$ plasma treatment) under atmospheric pressure.

(Process of Forming Hole Injection Layer 161 and Hole Transport Layer 162)

After oxygen plasma treatment is performed, as illustrated in FIG. 5A, the hole injection layer 161 and the hole transport layer 162 are formed to be shared by the red organic EL devices 10R, the green organic EL devices 10G, and the blue organic EL devices 10B (steps S14 and S15). A film of the foregoing material of the hole injection layer 161 is formed on the lower electrode 14 and the partition wall 15 by, for example, a spin coating method, and then is baked for one hour in the air to form the hole injection layer 161. After the hole injection layer 161 is formed, a film is formed by a spin coating method in a similar manner, and then is baked for one hour at 180° C. under a nitrogen ($N_2$) atmosphere to form the hole transport layer 162.

(Process of Forming Light-Emitting Layer 163)

After the hole transport layer 162 is provided, the red light-emitting layer 163R, the green light-emitting layer 163G, and the blue light-emitting layer 163B are formed for the red organic EL devices 10R, the green organic EL devices 10G, and the blue organic EL devices 10B, respectively (step S16). In this embodiment, the light-emitting layer 163 (the red light-emitting layer 163R, the green light-emitting layer 163G, and the blue light-emitting layer 163B) is formed with use of masks (masks 21R, 21G, and 21B that will be described later). As will be described in detail later, this makes it possible to suppress deterioration of the red organic EL devices 10R, the green organic EL devices 10G, and the blue organic EL devices 10B during manufacturing processes.

The light-emitting layer 163 may be formed, for example, in order of the red light-emitting layer 163R, the green light-emitting layer 163G, and the blue light-emitting layer 163B. More specifically, first, as illustrated in FIG. 5B, an entire surface of the hole transport layer 162 is coated with an ink including the foregoing material of the red light-emitting layer 163R with use of, for example, a slit coating method to form a red material layer 163RA (a first organic material layer). As the ink, an ink in which the material of the red light-emitting layer 163R is dissolved in a solvent is used. The surface of the hole transport layer 162 may be coated with the ink by, for example but not limited to, a spin coating method, or an ink-jet method. In FIG. 5B, the substrate 11, the TFT layer 12, the planarization layer 13, the lower electrode 14, and the partition wall 15 are omitted. This applies to FIGS. 5C and 5D, and FIGS. 8A to 9C.

Subsequently, as illustrated in FIG. 5C, the mask 21R is selectively formed in a region (a first region) where the red organic EL device 10R is to be formed on the red material layer 163RA. The mask 21R is formed in contact with the red material layer 163RA. A thickness of the mask 21R may be, for example, 0.01 μm or more, preferably 0.1 μm or more. Thereafter, a portion exposed from the mask 21R of the red material layer 163RA is removed by, for example, wet etching (FIG. 5D). Thus, the red light-emitting layer 163R with the same planar shape as that of the mask 21R is formed. The portion exposed from the mask 21R of the red material layer 163RA may be removed by dry etching. The mask 21R may be formed with use of, for example, a reverse offset printing method. For example, the reverse offset printing for the mask 21R may be performed as follows.

First, as illustrated in FIG. 6A, a flat-shaped blanket 31 is fixed on a stage 30, and the blanket 31 is coated with an ink 21 with use of a slit coating head 33. Thus, a transfer layer 21A is formed on an entire surface of the blanket 31. The transfer layer 21A may be formed by a spin coating method instead of a slit coating method. The blanket 31 is made of a deformable material with high flexibility in order to obtain favorable contact with a printing target substrate (the substrate 11). More specifically, for example, the blanket used herein may be formed by forming a film of silicon rubber or a fluorine resin on a base made of, for example but not limited to, a resin film, glass, or metal by a spin coating method or a slit coating method and then firing the film. The ink 21 is prepared by mixing a material of the mask 21R with a solvent. Examples of the material of the mask 21R may include a fluorine-based resin, a water-soluble resin, and an alcohol-soluble resin. As the solvent, for example but not limited to, a fluorine-based solvent, water, or an alcohol-based solvent may be used.

Subsequently, as illustrated in FIG. 6B, after a reverse printing plate (a plate 34) having protrusions and recessions in a predetermined pattern and the blanket 31 face each other with a predetermined spacing in between, as illustrated in FIG. 6C, the transfer layer 21A is pressed against the plate 34. A process of bringing the plate 34 and the transfer layer 21A (the blanket 31) into contact with each other is performed by pressure compression, i.e., jetting compressed gas from a back surface of the blanket 31 to push out the compressed gas, thereby sequentially adhering them from a central portion to an end portion (a compressed gas pressurizing method). Thus, the plate 34 and the blanket 31 are adhered to each other without entry of air bubbles therebetween. As the plate 34, a plate with recessions corresponding to the pattern of the red light-emitting layer 163R is used.

Thereafter, when the blanket is separated from the plate 34 as illustrated in FIG. 7A, a non-printing portion 21B is transferred from the blanket 31 to the protrusions of the plate 34, and at the same time, a transfer layer 21C having a pattern corresponding to the recessions of the plate 34 is formed.

Subsequently, after the transfer layer 21C of the blanket 31 and the substrate 11 face each other to be aligned as illustrated in FIG. 7B, they are brought into contact with each other as illustrated in FIG. 7C. The contact between the blanket 31 and the substrate 11 (the red material layer 163RA) is performed by the foregoing pressure compression.

After the transfer layer 21C and the substrate 11 is brought into contact with each other, the transfer layer 21C may be transferred to the substrate 11 while being heated. When the transfer layer 21C is heated at, for example, a glass-transition temperature (Tg) of a resin material forming the transfer layer 21C or higher, viscoelasticity of the resin material is changed. In a case where the material of the mask 21R, i.e., the transfer layer 21C is rigid, heating the transfer layer 21C makes it easy to deform the transfer layer 21C along a shape with protrusions and recessions formed by the lower electrode 14 and other layers on the substrate 11.

Finally, when the blanket 31 is separated from the substrate 11 as illustrated in FIG. 7D, the transfer layer 21C (the mask 21R) is printed on the substrate 11 (the red material layer 163RA). Such a reverse offset printing method makes it possible to form the mask 21R in contact with the red material layer 163RA.

The mask 21R (and the masks 21G and 21B that will be described later) may be formed by, for example but not limited to, flexographic printing, gravure printing, gravure offset printing, offset printing, or screen printing instead of the reverse offset printing method. The mask 21R may be formed with use of, for example but not limited to, an ink-jet method, a nozzle printing method, or a laser transfer method.

For example, the green light-emitting layer 163G may be formed as follows. First, as illustrated in FIG. 8A, in a similar manner to the foregoing red material layer 163RA, a green material layer 163GA (a second organic material layer) made of the material of the green light-emitting layer 163G is formed on the hole transport layer 162 where the red light-emitting layer 163R is provided. At this time, a top of the mask 21R may be covered with the green material layer 163GA. Subsequently, after the mask 21G is formed in a region (a second region) where the green organic EL device 10G is to be formed on the green material layer 163GA as illustrated in FIG. 8B, a portion exposed from the mask 21G of the green material layer 163GA is removed (FIG. 8C). The mask 21G is formed in contact with the green material layer 163GA. Thus, the green light-emitting layer 163G with the same planar shape as that of the mask 21G is formed. The mask 21G may be formed by, for example, a reverse offset printing method in a similar manner to that described in the foregoing mask 21R.

For example, the blue light-emitting layer 163B may be formed as follows. First, as illustrated in FIG. 8D, in a similar manner to the foregoing red material layer 163RA, a blue material layer 163BA (a second organic material layer) made of the material of the blue light-emitting layer 162 is formed on the hole transport layer 162 where the red light-emitting layer 163R and the green light-emitting layer 163G are provided. At this time, tops of the masks 21R and 21G may be covered with the blue material layer 163BA. Subsequently, after the mask 21B is formed in a region (a second region) where the blue organic EL device 10B is to be formed on the blue material layer 163BA as illustrated in FIG. 9A, a portion exposed from the mask 21B of the blue material layer 163BA is removed (FIG. 9B). The mask 21B is formed in contact with the blue material layer 163BA. Thus, the blue light-emitting layer 163B is formed. The mask 21B may be formed by, for example, a reverse offset printing method in a similar manner to that described in the foregoing mask 21R. The red light-emitting layer 163R, the green light-emitting layer 163G, and the blue light-emitting layer 163B may be formed in any order, and, for example, they may be formed in order of the green light-emitting layer 163G, the red light-emitting layer 163R, and the blue light-emitting layer 163B.

After the light-emitting layer 163 (the red light-emitting layer 163R, the green light-emitting layer 163G, and the blue light-emitting layer 163B) is thus formed, the masks 21R, 21G, and 21B are dissolved in, for example, a solvent to be removed (FIG. 9C). The solvent may be selected according to the material of the mask 21R, 21G, and 21B, and as the solvent, a solvent allowing the masks 21R, 21G, and 21B to be dissolved therein and not allowing the light-emitting layer 163 to be dissolved therein may be preferably used. Examples of such a solvent may include a fluorine-based solvent, water, and an alcohol-based solvent.

(Process of Forming Electron Transport Layer 164, Electron Injection Layer 165, and Upper Electrode 17)

After the masks 21R, 21G, and 21B are removed, the electron transport layer 164, the electron injection layer 165, and the upper electrode 17 made of the foregoing materials are formed in this order on the light-emitting layer 163 by, for example, an evaporation method (steps S17, S18, and S19). The electron transport layer 164, the electron injection layer 165, and the upper electrode 17 may be successively formed in a same film formation apparatus.

After the upper electrode 17 is formed, a protective layer is formed by, for example, an evaporation method or a CVD method. At this time, a film formation temperature may be preferably set to room temperature in order to suppress a decline in luminance associated with deterioration of the light-emitting layer 163 and other layers, and film formation may be preferably performed under a condition that stress on a film is minimized in order to prevent peeling of the protective layer. The light-emitting layer 163, the electron transport layer 164, the electron injection layer 165, the upper electrode 17, and the protective layer may be preferably formed successively in a same film formation apparatus without being exposed to the air in order to suppress deterioration caused by atmospheric moisture.

After the protective layer is formed, the sealing substrate is bonded onto the protective layer with the adhesive layer in between. Thus, the display unit 1 is completed.

[Functions and Effects of Display Unit 1]

In the display unit 1, the scanning signal is supplied from the scanning line drive circuit 130 to each pixel through the gate electrode of the writing transistor Tr2, and the image signal supplied from the signal line drive circuit 120 is retained in the retention capacitor Cs through the writing transistor Tr2. In other words, on-off control of the driving transistor Tr1 is performed in response to the signal retained in the retention capacitor Cs, and a drive current Id is thereby injected into the red organic EL devices 10R, the green organic EL devices 10G, and the blue organic EL devices 10B to cause light emission by the recombination of holes and electrons.

At this time, the red organic EL devices 10R, the green organic EL devices 10G, and the blue organic EL devices 10B emit red light (with a wavelength from 620 nm to 750 nm both inclusive), green light (with a wavelength from 495 nm to 570 nm both inclusive), and blue light (with a wavelength from 450 nm to 495 nm both inclusive), respectively.

In the method of manufacturing the display unit 1 according to this embodiment, the red light-emitting layer 163R, the green light-emitting layer 163G, and the blue light-emitting layer 163B are patterned into the same shapes as the planar shapes of the masks 21R, 21G, and 21B provided on the substrate 11, respectively (FIGS. 5C to 9B). This makes it possible to suppress deterioration of the red light-emitting layer 163R, the green light-emitting layer 163G, and the blue light-emitting layer 163B. Description about this will be given below.

FIGS. 10A to 10D illustrate a method of manufacturing a display unit according to a comparative example in order. A light-emitting layer (a red light-emitting layer 1163R, a green light-emitting layer 1163G, and a blue light-emitting layer 1163B) of this display unit is formed as follows by a reverse offset printing method. First, an ink is prepared by dissolving a material of the red light-emitting layer 1163R in a solvent, and the entire surface of the blanket 31 is coated with this ink (refer to FIG. 6A). Subsequently, the red light-emitting layer 1163R is formed into a predetermined pattern on the blanket 31 with use of a plate (refer to FIGS. 6B to 7B). Thereafter, the blanket 31 and the hole transport layer 162 face each other (FIG. 10A), and they are brought into contact with each other to transfer the red light-emitting layer 1163R to the hole transfer layer 162 (the substrate) (FIG. 10B). The green light-emitting layer 1163G and the blue light-emitting layer 1163B are formed in a similar manner (FIGS. 10C and 10D).

In a process of forming the red light-emitting layer 1163R (the green light-emitting layer 1163G and the blue light-emitting layer 1163B) with use of such a reverse offset printing method, the red light-emitting layer 1163R is formed on the blanket 31. In other words, after the red light-emitting layer 1163R comes into contact with the blanket 31 (FIG. 10A), the red light-emitting layer 1163R is transferred to the hole transport layer 162. Impurities may be mixed into the light-emitting layer 1163R (or the green light-emitting layer 1163G or the blue light-emitting layer 1163B) due to this contact with the blanket 31 to cause deterioration in characteristics such as light emission efficiency and light emission lifetime. The impurities may include, but not limited to, silicon oil included in silicon rubber on the surface of the blanket 31, and siloxane. The silicon oil is one of compounding agents added to silicone polymer as a principal material. Siloxane is an unreacted material that remains without being polymerized upon manufacturing of silicon rubber.

Moreover, as the solvent used to prepare the ink, for example but not limited to, aromatic hydrocarbon may be used; however, since the solvent has high compatibility with the blanket 31 (such as silicon rubber on the surface), the entire surface of the blanket 31 may be impregnated with the ink. The ink (an ink 1163RE) having permeated the blanket 31 is also adhered to a portion other than the red light-emitting layer 1163R on the hole transport layer 162 (FIG. 10B). When the green light-emitting layer 1163G or the blue light-emitting layer 1163B is formed on the ink 1163RE, color mixture is caused to cause a decline in color purity. Inks 1163GE and 1163BE having permeated the blanket 31 when the green light-emitting layer 1163G and the blue light-emitting layer 1163B are formed may also cause color mixture in a similar manner (FIGS. 10C and 10D).

On the other hand, since the foregoing red light-emitting layer 163R, the foregoing green light-emitting layer 163G, and the foregoing blue light-emitting layer 163B are patterned with use of the shapes of the masks 21R, 21G, and 21B, patterning with use of the blanket 31 and the plate is unnecessary. In other words, the red light-emitting layer 163R, the green light-emitting layer 163G, and the blue light-emitting layer 163B are formed without contact with the blanket 31. This makes it possible to prevent entry of impurities from the blanket 31 to the red light-emitting layer 163R, the green light-emitting layer 163G, and the blue light-emitting layer 163B. Moreover, this makes it possible to prevent color mixture caused by permeation of the ink into the blanket 31. When the masks 21R, 21G, and 21B are transferred, the blanket 31 may come into contact with parts of the red material layer 163RA, the green material layer 163GA, and the blue material layer 163BA. However, the red material layer 163RA, the green material layer 163GA, and the blue material layer 163BA other than portions (portions that are to serve as the red light-emitting layer 163G, the green light-emitting layer 163G, and the blue light-emitting layer 163B) directly below the mask 211R, 21G, and 21B are removed. Therefore, a portion in contact with the blanket 31 does not have an influence on characteristics of each device.

Further, since the masks 21R, 21G, and 21B are formed by a printing method, compared to a metal mask, this makes it possible to form the masks 21R, 21G, and 21B with higher accuracy. Accordingly, this makes it possible to form a high-definition display. In addition, the printing method may be easily applicable to a large-size substrate process. Furthermore, since it is possible to perform the printing method under atmospheric pressure, facilities such as a large-size vacuum apparatus are unnecessary, and this makes it possible to reduce facility cost and power consumption.

In particular, in the reverse offset printing method in the printing method, high-precision printing with a printing line width of several μm to 10 μm and alignment accuracy of about several μm is possible; therefore, the reverse offset printing method is a suitable method for manufacturing of a high-definition organic EL display unit. For example, a display unit with 300 ppi or more (a pixel pitch of about 84 μm or less) may be manufactured with use of the reverse offset printing method.

Since, in this embodiment, the red light-emitting layer 163R, the green light-emitting layer 163G, and the blue light-emitting layer 163B are patterned with use of the masks 21R, 21G, and 21B in the foregoing manner, deterioration in characteristics such as light emission efficiency and light emission lifetime is preventable. Moreover, this makes it possible to mix inks of other emission colors into the red light-emitting layer 163R, the green light-emitting layer 163G, and the blue light-emitting layer 163B, thereby suppressing color mixture.

In a case where the masks 21R, 21G, and 21B are formed with use of flexographic printing, gravure printing, gravure offset printing, offset printing, screen printing, or any other printing, printing accuracy may be reduced, compared to the reverse offset printing method. However, in these methods, a plate cleaning process performed after every printing is unnecessary, and accordingly, cost reduction is possible. Moreover, an ink-jet method, a nozzle printing method, and a laser transfer method are methods allowing for printing without using a plate. Therefore, in a case where it is not necessary to form the masks 21R, 21G, and 21B with high accuracy, these printing methods may be used to reduce cost.

For example, when the masks 21R, 21G, and 21B are formed with use of gravure offset printing, a smooth printing roll may be used. Providing the partition wall 15 with a height of about 0.1 µm to about 0.3 µm both inclusive allows for formation of the masks 21R, 21G, and 21B by gravure offset printing. On the other hand, in a case where the masks 21R, 21G, and 21B are formed by the ink-jet method, the partition wall 15 prevents outflow of the ink; therefore, for example, the partition wall 15 with a height of about 2 µm is necessary. Thus, depending on the configuration of the display unit, the method of forming the masks 21R, 21G, and 21G may be selected. It is to be noted that, in, for example but not limited to, the gravure offset printing and the ink-jet method, it is difficult to form the masks 21R, 21G, and 21B with a uniform thickness; however, this is less likely to exert an influence on the organic layer 16 (the red light-emitting layer 163R, the green light-emitting layer 163G, and the blue light-emitting layer 163B). This is because as long as it is possible to protect the organic layer 16 during etching, the masks 21R, 21G, and 21G sufficiently fulfill their functions. For example, in the gravure offset printing, the masks 21R, 21G, and 21B are prone to have a sectional shape of which a central portion are raised, i.e., a protruded sectional shape because of fluidity of the ink and an influence of surface tension. Even in the ink-jet method, the thicknesses of the masks 21R, 21G, and 21B are less likely to be uniform due to creeping-up of an ink along the partition wall 15.

A portion exposed from the mask 21R (or the mask 21G or 21B) of the red material layer 163RA (or the green material layer 163GA or the blue material layer 163BA) may be removed by wet etching or dry etching depending on the situation. For example, in a case where there is a possibility that the light-emitting layer 163 and layers below the light-emitting layer 163 in the organic layer 16 are deteriorated, wet etching may be preferably used. On the other hand, in the dry etching, control of side etching is easy, and flexibility in design of the pattern of the light-emitting layer 163 is improved. Moreover, there are a large number of kinds of etchable materials, and it is possible to easily etch the light-emitting layer 163 made of various materials. Moreover, while, in wet etching, a process of drying an etching liquid is necessary, in dry etching, this process is unnecessary.

Modification examples of this embodiment and other embodiments will be described below, and in the following description, like components are denoted by like numerals as of the foregoing embodiment, and will not be further described.

Modification Example 1

FIG. 11 illustrates a sectional configuration of a main part of a display unit (a display unit 1A) manufactured by a method according to Modification Example 1 of the foregoing embodiment. A partition wall (a partition wall 15A) of the display unit 1A has liquid repellency. The display unit 1A has a similar configuration to that of the display unit 1 except for this point. In FIG. 11, the TFT layer 12, the planarization layer 13, the hole injection layer 161, the hole transport layer 162, the electron transport layer 164, the electron injection layer 165, and the upper electrode 17 (all of which are illustrated in FIG. 1) are omitted. This applies to FIGS. 12A to 13C that will be described later.

In a similar manner to that in the partition wall 15, the partition wall 15A is configured to secure insulation between the lower electrode 14 and the upper electrode 17 and to form a light emission region into a desired shape. The partition wall 15A may have a tapered shape, and an aperture size is increased from the lower electrode 14 toward the upper electrode 17. The partition wall 15A may have any shape, and the aperture size may be uniform. The partition wall 15A may be made of, for example, a liquid-repellent material. The partition wall 15A may be made of, for example, a fluorine-based resin material. The liquid repellency of the wall partition 15A may be enhanced by performing liquid-repellent treatment on, for example but not limited to, a polyimide resin. Examples of the liquid-repellent treatment may include fluorine plasma treatment such as tetrafluoromethane ($CF_4$) plasma treatment.

For example, the display unit 1A including such a partition wall 15A may be manufactured as follows (FIGS. 12A to 13C).

First, the TFT layer 12, the planarization layer 13, and the lower electrode 14 are formed in this order on the substrate 11 in a similar manner to that described in the foregoing display unit 1. Subsequently, after, for example, a polyimide resin is patterned, the polyimide resin is subjected to tetrafluoromethane plasma treatment to form the partition wall 15A. The partition wall 15A may be formed of a fluorine-based resin material. It is to be noted that inventors of the disclosure have confirmed that a contact angle of water with respect to the partition wall 15A made of the fluorine-based resin material is 95°, and a contact angle of water with respect to the partition wall 15A configured by performing tetrafluoromethane ($CF_4$) plasma treatment on the polyimide resin is 106°. At that time, a contact angle of water with respect to the polyimide resin was 77°.

After the partition wall 15A is formed, the hole injection layer 161 and the hole transport layer 162 are formed in this order. Subsequently, the light-emitting layer 163 is formed, for example, in order of the green light-emitting layer 163G, the red light-emitting layer 163R, and the blue light-emitting layer 163B. More specifically, first, the entire surface of the hole transport layer 162 is coated with an ink in which the material of the green light-emitting layer 163G is dissolved in a solvent to form the green material layer 163GA (FIG. 12A). At this time, while the solvent included in the green material layer 163GA is dried, the green material layer 163GA with which the surface of the partition wall 15A is coated is repelled by liquid repellency of the partition wall 15A to be moved between adjacent partition walls 15A (FIG. 12B). In other words, a side surface of the green material layer 163GA is covered with the partition wall 15A. The concentration of the material of the green light-emitting layer 163G in the ink may be, for example, from about 1% to about 3% both inclusive.

As the solvent allowing the material of the green light-emitting layer 163G to be dissolved therein, a solvent having a contact angle of 50° or more with respect to the partition wall 15A may be preferably used. Examples of such a solvent may include Anisole, Tetralin, 1,3-dimethoxy benzene, 2-tert-butylphenol, and 1-Methylnaphthalene. These solvents have a contact angle of 50° or more with respect to the partition wall 15A formed by performing tetrafluoromethane ($CF_4$) plasma treatment on the polyimide resin.

After the green material layer 163GA is moved between the partition walls 15A, as illustrated in FIG. 12C, the mask 21G is formed in a region where the green organic EL device 10G is to be formed with use of, for example, a reverse offset printing method. Subsequently, a portion other than the region where the mask 21G is provided of the green material layer 163GA is removed by, for example, etching to form the green light-emitting layer 163G (FIG. 13A).

Subsequently, the entire surface of the hole transport layer 162 is coated with an ink in which the material of the red light-emitting layer 163R is dissolved in a solvent in a state in which a top surface of the green light-emitting layer 163G is covered with the mask 21G to form the red material layer 163RA (FIG. 13B). In a similar manner to that in the green material layer 163GA, the red material layer 163RA is moved between adjacent partition walls 15A by liquid repellency of the partition wall 15A (FIG. 13C). Thereafter, in a similar manner to that in the foregoing green material layer 163GA, a portion except for the region where the red organic EL device 10R is to be formed of the red material layer 163RA is removed with use of the mask 21R (FIG. 5C) to form the red light-emitting layer 163R. The blue light-emitting layer 163B is formed with use of the mask 21B (FIG. 9A) in a similar manner, and the masks 21G, 21R, and 21B with which the top surfaces of the green light-emitting layer 163G, the red light-emitting layer 163R, and the blue light-emitting layer 163B are covered are removed. The green light-emitting layer 163G, the red light-emitting layer 163R, and the blue light-emitting layer 163B may be formed in any order, and, for example, they may be formed in order of the red light-emitting layer 163R, the green light-emitting layer 163G, and the blue light-emitting layer 163B.

After the light-emitting layer 163 is formed in such a manner, in a similar manner to that in the display unit 1, the electron transport layer 164, the electron injection layer 165, the upper electrode 17, and the protective layer are formed. Finally, the sealing substrate is bonded onto the substrate 11 where these layers are provided to complete the display unit 1A.

In the method of manufacturing the display unit 1A, since the partition wall 15A has liquid repellency, the green material layer 163GA (the red material layer 163RA and the blue material layer 163BA) is moved between adjacent partition walls 15A (FIG. 12B). Moreover, in a state in which the mask 21G (the masks 21R and 21B) is provided, the ink of the light-emitting layer that is to be subsequently formed is applied (FIG. 13B). In other words, the green light-emitting layer 163G is coated with an ink of the light-emitting layer (the red light-emitting layer 163R and the blue light-emitting layer 163B) in a next process in a state in which a side surface and a top surface of the green light-emitting layer 163G are coated with the partition wall 15A and the mask 21G, respectively. This applies to the red light-emitting layer 163R. This makes it possible to prevent the green light-emitting layer 163G from being dissolved in a solvent contained in this ink, thereby suppressing the occurrence of a pattern failure. Accordingly, the method of manufacturing the display unit 1A makes it possible to form the red light-emitting layer 163R, the green light-emitting layer 163G, and the blue light-emitting layer 163B into a precise pattern.

Second Embodiment

FIGS. 14A to 16C illustrate a method of manufacturing the display unit 1 according to a second embodiment of the technology. In FIGS. 14A to 16C, the substrate 11, the TFT layer 12, the planarization layer 13, the lower electrode 14, and the partition wall 15 (all of which are illustrated in FIG. 1) are not illustrated. In this method, the light-emitting layer 163 is formed with use of a liquid-repellent mask (masks 22R, 22G, and 22B). The display unit 1 is manufactured in a similar manner to that in the foregoing first embodiment except for this point.

First, the TFT layer 12, the planarization layer 13, the lower electrode 14, the partition wall 15, the hole injection layer 161, and the hole transport layer 162 are formed in this order on the substrate 11 in a similar manner to that in the display unit 1 according to the foregoing first embodiment. Subsequently, for example, the light-emitting layer 163 is formed in order of the red light-emitting layer 163R, the green light-emitting layer 163G, and the blue light-emitting layer 163B.

More specifically, first, the mask 22R having an aperture 22RM in a region (a first region) where the red organic EL device 10R is to be formed is formed on the hole transport layer 162 (FIG. 14A). The mask 22R is formed in contact with the hole transport layer 162 with use of, for example, a reverse offset printing method. The mask 22R (and the masks 22G and 22B that will be described later) may be formed by not only the reverse offset printing method but also, for example but not limited to, flexographic printing, gravure printing, gravure offset printing, offset printing, or screen printing. The mask 22R may be formed with use of, for example but not limited to, an ink-jet method, a nozzle printing method, or a laser transfer method. This mask 22R has liquid repellency, and may be formed in contact with the hole transport layer 162 with use of, for example, a fluorine-based resin. Although the mask 22R may be formed with use of, for example but not limited to, a water-soluble resin and an alcohol-soluble resin, in a case where the resin has low liquid repellency, the resin may be preferably subjected to liquid-repellent treatment such as fluorine plasma treatment. The mask 22R may be formed of a resist material.

After the mask 22R is formed, the hole transport layer 162 is coated with an ink in which the material of the red light-emitting layer 163R is dissolved in a solvent. At this time, the ink with which the mask 22R is coated is repelled by the liquid repellency of the mask 22R to be moved to a portion corresponding to the aperture 22RM of the mask 22R, i.e., the region where the red organic EL device 10R is to be formed. Thus, the red light-emitting layer 163R (a first organic layer) is formed (FIG. 14B).

Subsequently, as illustrated in FIG. 14C, the mask 22R is dissolved in, for example, a solvent to be removed. This solvent may be selected according to the material of the mask 22R, and a solvent allowing the mask 22R to be dissolved therein and not allowing the red light-emitting layer 163R to be dissolved therein may be preferably used. Examples of such a solvent may include a fluorine-based solvent, water, and an alcohol-based solvent. Even if the ink for formation of the red light-emitting layer 163R remains on the mask 22R, the ink is removed together with the mask 22R in this process. This applies to the masks 22G and 22B that will be described later.

After the mask 22R is removed, as illustrated in FIG. 15A, the liquid-repellent mask 22G having an aperture 22GM in a region where the green organic EL device 10G is to be formed is formed on the hole transport layer 162. The mask 22G is formed in contact with the hole transport layer 162, and is also formed on the red light-emitting layer 163R. The mask 22G is formed with use of a similar material to that of the foregoing mask 22R by, for example, a reverse offset printing method.

After the mask 22G is formed, the hole transport layer 162 is coated with an ink in which the material of the green light-emitting layer 163G is dissolved in a solvent. At this time, the ink with which the mask 22G is coated is repelled by the liquid repellency of the mask 22G to be moved in a portion corresponding to the aperture 22GM of the mask 22G, i.e., the region where the green organic EL device 10G is to be formed. Thus, the green light-emitting layer 163G (a second organic layer) is formed (FIG. 15B).

Subsequently, as illustrated in FIG. 15C, the mask 22G is dissolved in, for example, a solvent to be removed. As this solvent, a similar solvent to that used in the foregoing mask 22R may be used. After the mask 22G is removed, the mask 22B having an aperture 22BM in a region where the blue organic EL device 10B is to be formed is formed on the hole transport layer 162 (FIG. 16A). The mask 22B is formed in contact with the hole transport layer 162, and is also formed on the red light-emitting layer 163R and the green light-emitting layer 163G. The mask 22B is formed with use of a similar material to that of the foregoing mask 22R by, for example, a reverse offset printing method.

After the mask 22B is formed, the hole transport layer 162 is coated with an ink in which the material of the blue light-emitting layer 163B is dissolved in a solvent. At this time, the ink with which the mask 22B is coated is repelled by the liquid repellency of the mask 22B to be moved to a portion corresponding to the aperture 22BM of the mask 22B, i.e., the region where the blue organic EL device 10B is to be formed. Thus, the blue light-emitting layer 163B (the second organic layer) is formed to complete the light-emitting layer 163 (FIG. 16B). Thereafter, the mask 22B is dissolved in, for example, a solvent to be removed (FIG. 16C). As this solvent, a similar solvent to that used in the foregoing mask 22R may be used. The red light-emitting layer 163R, the green light-emitting layer 163G, and the blue light-emitting layer 163B may be formed in any order, and, for example, they may be formed in order of the green light-emitting layer 163G, the red light-emitting layer 163R, and the blue light-emitting layer 163B. After the light-emitting layer 163 is provided in such a manner, in a similar manner to that in the display unit 1 according to the foregoing first embodiment, the electron transport layer 164, the electron injection layer 165, the upper electrode 17, and the protective layer are formed. Finally, the sealing substrate is bonded onto the substrate 11 where these layers are provided to complete the display unit.

In this method of manufacturing the display unit 1, since the red light-emitting layer 163R, the green light-emitting layer 163G, and the blue light-emitting layer 163B are formed in selective regions (the apertures 22RM, 22GM, and 22BM of the masks 22R, 22G, and 22B) with use of the shapes of the liquid-repellent masks 22R, 22G, and 22B, patterning using the blanket and the plate (FIGS. 10A to 10D) is unnecessary. In other words, in a similar manner to that in the foregoing first embodiment, this makes it possible to prevent entry of impurities from the blanket 31 to the red light-emitting layer 163R, the green light-emitting layer 163G, and the blue light-emitting layer 163B. Accordingly, this makes it possible to prevent deterioration in characteristics such as light emission efficiency and light emission lifetime of the red organic EL device 10R, the green organic EL device 10G, and the blue organic EL device 10B. Moreover, this makes it possible to prevent color mixture caused by permeation of the ink into the blanket 31.

Modification Example 2

FIGS. 17A to 18C illustrate a method of manufacturing the display unit 1 according to Modification Example 2. In FIGS. 17A to 18C, the substrate 11, the TFT layer 12, the planarization layer 13, the lower electrode 14, and the partition wall 15 (all of which are illustrated in FIG. 1) are not illustrated. In this method, after a top surface and a side surface of the formed light-emitting layer (the red light-emitting layer 163R and the green light-emitting layer 163G) are covered with a mask (masks 23G and 23B), an ink for formation of the light-emitting layer (the green light-emitting layer and the blue light-emitting layer 163B) in the following process is applied. The display unit 1 is manufactured in a similar manner to that in the foregoing second embodiment except for this point.

First, in a similar manner to that in the display unit 1 according to the foregoing first embodiment, the TFT layer 12, the planarization layer 13, the lower electrode 14, the partition wall 15, the hole injection layer 161, and the hole transport layer 162 are formed in this order on the substrate 11. Subsequently, for example, the light-emitting layer 163 is formed in order of the red light-emitting layer 163R, the green light-emitting layer 163G, and the blue light-emitting layer 163B.

More specifically, first, in a similar manner to that described in the foregoing second embodiment, the red light-emitting layer 163R is formed (FIGS. 14A to 14C). Subsequently, as illustrated in FIG. 17A, the liquid-repellent mask 23G having an aperture 23GM in a region where the green organic EL device 10G is to be formed is formed on the hole transport layer 162. At this time, the mask 23G is formed to cover the top surface and the side surface of the red light-emitting layer 163R. The mask 23G is formed in contact with the hole transport layer 162 with use of a similar material to that described in the foregoing masks 22R, 22G, and 22B by a reverse offset printing method. The mask 23G (and the mask 23B that will be described later) may be formed by not only the reverse offset printing method but also, for example but not limited to, flexographic printing, gravure printing, gravure offset printing, offset printing, or screen printing. The mask 23G may be formed with use of, for example not limited to, an ink-jet method, a nozzle printing method, or a laser transfer method.

After the mask 23G is formed, as illustrated in FIG. 17B, the hole transport layer 162 is coated with an ink in which the material of the green light-emitting layer 163G is dissolved in a solvent to form the green light-emitting layer 163G. At this time, since the side surface of the red light-emitting layer 163R is covered with the mask 23G, this makes it possible to prevent entry of the ink into the red light-emitting layer 163R, thereby preventing side etching of the red light-emitting layer 163R by the ink. In particular, in a case where the solvent allowing the material of the green light-emitting layer 163G to be dissolved therein has high solvent power for a light-emitting material, use of such a mask 23G is effective as a method of preventing side etching of the red light-emitting layer 163R.

Subsequently, as illustrated in FIG. 17C, the mask 23G is dissolved in, for example, a solvent to be removed. As this solvent, a similar solvent to that described in the foregoing masks 22R, 22G, and 22B may be used.

After the mask 23G is removed, the liquid-repellent mask 23B having an aperture 23BM in a region where the blue organic EL device 10B is to be formed is formed on the hole transport layer 162 (FIG. 18A). The mask 23B is formed to cover the top surfaces and the side surfaces of the red light-emitting layer 163R and the green light-emitting layer 163G. The mask 23B is formed in contact with the hole transport layer 162 with use of a similar material to that described in the foregoing masks 22R, 22G, and 22B by, for example, a reverse offset printing method.

After the mask 23B is formed, the hole transport layer 162 is coated with an ink in which the material of the blue light-emitting layer 163B is dissolved in a solvent to form the blue light-emitting layer 163B (FIG. 18B). At this time, in a similar manner to that described in the mask 23G, the side surfaces of the red light-emitting layer 163R and the green light-emitting layer 163G are covered with the mask 23B; therefore, entry of the ink into the red light-emitting layer 163R and the green light-emitting layer 163G is suppressed.

Thereafter, as illustrated in FIG. 18C, the mask 23B is dissolved in, for example, a solvent to be removed. As this solvent, a similar solvent to that described in the foregoing masks 22R, 22G, and 22B may be used. After the light-emitting layer 163 is provided in such a manner, in a similar manner to that in the display unit 1 according to the foregoing first embodiment, the electron transport layer 164, the electron injection layer 165, the upper electrode 17, and the protective layer are formed. Finally, the sealing substrate is bonded onto the substrate 11 where these layers are provided to complete the display unit 1.

In this method of manufacturing the display unit 1, after the side surface of the red light-emitting layer 163R is covered with the mask 23G, an ink for formation of the green light-emitting layer 163G is applied. Moreover, after the side surfaces of the red light-emitting layer 163R and the green light-emitting layer 163G are covered with the mask 23B, an ink for formation of the blue light-emitting layer 163B is applied. Thus, this makes it possible to prevent entry of the ink from the side surface of the light-emitting layer in the following process.

In a case where only the top surface of the formed light-emitting layer is covered with a mask, an ink used in the following process may enter from the side surface of the light-emitting layer to cause side etching. When the masks 23G and 23B are formed to cover the side surfaces of the red light-emitting layers 163R and the green light-emitting layer 163G, this makes it possible to prevent side etching, thereby suppressing the occurrence of a pattern failure. Accordingly, this method of manufacturing the display unit 1 makes it possible to form the red light-emitting layer 163R, the green light-emitting layer 163G, and the blue light-emitting layer 163B into a precise pattern.

Modification Example 3

Modification Example 3-1

FIG. 19 illustrates a configuration of a display unit (a display unit 2) manufactured by a method according to Modification Example 3. This display unit 2 is a so-called hybrid organic EL display unit, in which a blue light-emitting layer (a blue light-emitting layer 263B) is provided to be shared by the red organic EL devices 10R, the green organic EL devices 10G, and the blue organic EL devices 10B. The display unit 2 has a similar configuration to that of the display unit 1 according to the foregoing first embodiment except for this point.

The light-emitting layer 263 of the display unit 2 is configured of the red light-emitting layer 163R of the red organic EL device 10R, the green light-emitting layer 163G of the green organic EL device 10G, and the common blue light-emitting layer 263B shared by all devices (the red organic EL devices 10R, the green organic EL devices 10G, and the blue organic EL devices 10B). The blue light-emitting layer 263B as a common layer is provided on the entire surface of the hole transport layer 162. In other words, the blue light-emitting layer 263B extends to regions of the red light-emitting layer 163R and the green light-emitting layer 163G, and each of the red light-emitting layer 163R and the green light-emitting layer 163G is provided between the hole transport layer 162 and the blue light-emitting layer 263B. In other words, the red light-emitting layer 163R and the green light-emitting layer 163G are covered with the blue light-emitting layer 263B. The blue light-emitting layer 263B may be formed, for example, by doping an anthracene compound as a host material with a blue or green fluorescence pigment as a guest material. As the guest material, an organic light-emitting material such as a metal complex may be used. The blue light-emitting layer 263B as a common layer may be formed by an evaporation method. This makes it possible to use a high-performance low-molecular-weight material for the blue light-emitting layer 263B, and to enhance characteristics of the display unit 2.

For example, the display unit 2 may be formed as follows.

First, in a similar manner to that in the display unit 1 according to the foregoing first embodiment, the TFT layer 12, the planarization layer 13, the lower electrode 14, the partition wall 15, the hole injection layer 161, and the hole transport layer 162 are formed in this order on the substrate 11. Subsequently, for example, in a similar manner to that described in the foregoing first embodiment, the red light-emitting layer 163R and the green light-emitting layer 163G are formed with use of the masks 21R and 21G (FIGS. 5B to 8C). After the masks 21R and 21G are removed, the blue light-emitting layer 263B is formed on the entire surface of the hole transport layer 162 by, for example, an evaporation method. After the light-emitting layer 263 is provided in such a manner, in a similar manner to that in the display unit 1 according to the foregoing first embodiment, the electron transport layer 164, the electron injection layer 165, the upper electrode 17, and the protective layer are formed. Finally, the sealing substrate is bonded onto the substrate 11 where these layers are provided to complete the display unit 2.

This method of manufacturing the display unit 2 makes it possible to form the blue light-emitting layer 263B by the evaporation method, thereby using the low-molecular-weight material for the blue light-emitting layer 263B, and enhancing characteristics of the display unit 2.

Modification Example 3-2

The red light-emitting layer 163R and the green light-emitting layer 163G may be formed with use of the masks 22R and 22G in a similar manner to that described in the foregoing second embodiment (FIGS. 14A to 15C).

Modification Example 3-3

The red light-emitting layer 163R and the green light-emitting layer 163G may be formed with use of the masks 22R and 23G in a similar manner to that described in the foregoing second embodiment and the foregoing Modification Example 2 (FIGS. 17A to 17C).

Modification Example 3-4

The red light-emitting layer 163R and the green light-emitting layer 163G may be formed by a combination of the method described in the foregoing first embodiment and the methods described in the foregoing second embodiment and the foregoing Modification Example 2 (FIGS. 20A to 20D). In FIGS. 20A to 20D, the substrate 11, the TFT layer 12, the planarization layer 13, the lower electrode 14, and the partition wall 15 (all of which are illustrated in FIG. 1) are not illustrated.

More specifically, first, in a similar manner to that described in the foregoing first embodiment, the red light-emitting layer 163R is formed with use of the mask 21R (FIG. 20A). Subsequently, in a similar manner to that described in the foregoing Modification Example 2, the mask 23G having the aperture 23GM in the region where the green organic EL device 10G is to be formed is formed (FIG. 20B). The mask 23G is formed to cover the top surface and the side surface of a laminate of the mask 21R and the red light-emitting layer 163R. Instead of the mask 23G, the mask 22G may be formed on the top surface of the mask 21R (FIG. 15A).

After the mask 23G is provided, an ink including the material of the green light-emitting layer 163G is applied to form the green light-emitting layer 163G (FIG. 20C). Thereafter, as illustrated in FIG. 20D, the masks 21R and 23G are removed. This method makes it possible to form the light-emitting layer 263 without forming the mask on the hole transport layer 126 of the green organic EL device 10G and forming the mask on the green light-emitting layer 163G. Thus, in the green organic EL device 10G, there is no possibility that a residue of a resin derived from the mask remains at an interface between the hole transport layer 126 and the green light-emitting layer 163G and an interface between the green light-emitting layer 163G and the electron transport layer 164, which makes it possible to improve characteristics of the green organic EL device 10G.

Modification Example 4

Modification Example 4-1

FIG. 21 illustrates a configuration of a display unit (a display unit 2A) manufactured by a method according to Modification Example 4. The display unit 2A includes a connection layer 266 between the hole transport layer 162 and the blue light-emitting layer 263B. The connection layer 266 is provided to be shared by the red organic EL devices 10R, the green organic EL devices 10G, and the blue organic EL devices 10B. The display unit 2A has a similar configuration to that of the display unit 2 according to the foregoing Modification Example 3 except for this point.

The connection layer 266 is provided between the red light-emitting layer 163R and the blue light-emitting layer 263B in the red organic EL device 10R and between the green light-emitting layer 163G and the blue light-emitting layer 263B in the green organic EL device 10G. The connection layer 266 is configured to confine triplet excitons formed in the red light-emitting layer 163R and the green light-emitting layer 163G within the red light-emitting layer 163R and the green light-emitting layer 163G and to improve hole injection efficiency to the blue light-emitting layer 263B. Depending on the entire device configuration, a thickness of the connection layer 266 may be preferably from 1 nm to 30 nm both inclusive, and more preferably from 1 nm to 15 nm both inclusive.

A material forming the connection layer 266 satisfies the following conditions. As a first condition, excitation triplet energy of the material forming the connection layer 266 is sufficiently larger than excitation triplet energy of the red light-emitting layer 163R and the green light-emitting layer 163G. This makes it possible to prevent the triplet excitons generated in the red light-emitting layer 163R and the green light-emitting layer 163G from being diffused into the blue light-emitting layer 263B, thereby obtaining high-efficient phosphorescent emission. As a second condition, the material has high hole transport performance in order to improve hole injection efficiency to the blue light-emitting layer 263B, and a large hole injection barrier is not formed between the hole transport layer 162 and the material. More specifically, when an energy difference between the ground state (S0H) of the connection layer 266 and the ground state (S0I) of the hole transport layer 162 is set to 0.4 eV or less, this makes it possible to maintain hole injection efficiency to the blue light-emitting layer 263B.

Moreover, since the connection layer 266 is formed with use of the evaporation method, a low-molecular-weight material, specifically a monomer may be preferably used. One reason for this is that there is a possibility that a polymerized molecule such as an oligomer and a polymer is decomposed during evaporation. It is to be noted that the low-molecular-weight material used for the connection layer 266 may be configured with use of a mixture or laminate of two or more kinds of materials with different molecular weights.

Examples of the low-molecular-weight material used for the connection layer 266 may include a phosphorescent host material. For the connection layer 266, for example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, or a derivative thereof, or a heterocyclic conjugated monomer or oligomer such as a vinylcarbazole-based compound, a thiophene-based compound, or an aniline-based compound may be used.

In the display unit 2A, providing such a connection layer 266 makes it possible to improve the characteristics of the display unit 2A. In the display unit 2A, in a similar manner to that described in the foregoing display unit 2, after the red light-emitting layer 163R and the green light-emitting layer 163G are formed, for example, the connection layer 266 may be formed. Thereafter, the blue light-emitting layer 263B is formed on an entire surface of the connection layer 266.

Modification Example 4-2

The red light-emitting layer 163R and the green light-emitting layer 163G of the display unit 2A may be formed with use of a combination of the method using the mask 21R (FIGS. 5B to 5D) and the reverse offset printing method (FIGS. 22A and 22B). In FIGS. 22A and 22B, the substrate 11, the TFT layer 12, the planarization layer 13, the lower electrode 14, and the partition wall 15 (all of which are illustrated in FIG. 21) are not illustrated.

First, as described in the foregoing first embodiment (FIGS. 5B to 5D), the red light-emitting layer 163R is formed on the hole transport layer 162 with use of the mask 21R. The green light-emitting layer 163G with a predetermined pattern is formed on the blanket 31 with use of the plate 34 (FIG. 6B).

Subsequently, the blanket 31 and the substrate 11 where the red light-emitting layer 163R is formed face each other (FIG. 22A). Subsequently, after they are brought into contact with each other to transfer the green light-emitting layer 163G to the hole transport layer 162 (FIG. 22B), the mask 21R is removed.

In such a method of forming the red light-emitting layer 163R and the green light-emitting layer 163G, since the pattern of the green light-emitting layer 163G is formed on the blanket 31, it is not necessary to coat the substrate with an ink for formation of the green light-emitting layer 163G (for example, refer to FIGS. 8A and 16B). Accordingly, there is no possibility that the red light-emitting layer 163R is dissolved in a solvent contained in the ink, and this makes it possible to form the red light-emitting layer 163R into a precise pattern. Moreover, since the mask 21G (FIG. 8B) is unnecessary, this makes it possible to reduce the number of processes necessary for manufacturing. It is to be noted that there is a possibility that the ink for formation of the green light-emitting layer 163G permeates the blanket 31 (an ink 163GE), and the ink 163GE is transferred to the region where the blue light-emitting device 10B is to be formed. However, in the display unit 2A, even if the ink 163GE is transferred, the connection layer 266 is formed in contact with the ink 163GE; therefore, the ink 163GE has a hole transport function. This makes it possible to obtain high display characteristics without causing color mixture even in the blue light-emitting device 10B.

After the green light-emitting layer 163G is formed with use of the mask 21G, the red light-emitting layer 163R may be formed by the reverse offset printing method.

Modification Example 4-3

The red light-emitting layer 163R and the green light-emitting layer 163G of the display unit 2A may be formed by a combination of the method using the mask 22R (FIGS. 14A to 14C) and the reverse offset printing method (FIGS. 23A and 23B). In FIGS. 23A and 23B, the substrate 11, the TFT layer 12, the planarization layer 13, the lower electrode 14, and the partition wall 15 (all of which are illustrated in FIG. 21) are not illustrated.

More specifically, first, as described in the foregoing second embodiment (FIGS. 14A to 14C), the red light-emitting layer 163R is formed on the hole transport layer 162 with use of the mask 22R. The green light-emitting layer 163G with a predetermined pattern is formed on the blanket 31 with use of the plate 34 (FIG. 6B).

Subsequently, the blanket 31 and the substrate where the red light-emitting layer 163R is formed face each other (FIG. 23A). Subsequently, they are brought into contact with each other to transfer the green light-emitting layer 163G to the hole transport layer 162 (FIG. 23B).

After the green light-emitting layer 163G is formed with use of the mask 22G, the red light-emitting layer 163R may be formed by the reverse offset printing method.

Modification Example 4-4

The red light-emitting layer 163R or the green light-emitting layer 163G may be formed with use of a step formation layer 33 on the substrate 11 (FIGS. 24A to 25D). A case where the green light-emitting layer 163G is formed with use of the mask (the mask 21G) and the red light-emitting layer 163R is formed with use of the step formation layer 33 will be described below. In FIGS. 24B to 25D, the substrate 11, the TFT layer 12, the lower electrode 14, and the partition wall 15 (all of which are illustrated in FIG. 21) are not illustrated.

First, as illustrated in FIG. 24A, the TFT layer 12 and the step formation layer 33 are formed in this order on the substrate 11. The step formation layer 33 has a protrusion 33A in the region where the red organic EL device 10R is to be formed, and the protrusion 33A is thicker by a height h than a portion other than the protrusion 33A of the step formation layer 33. The height his $\frac{1}{100}$ or more of a width of the portion (a recessed portion) other than the protrusion 33A, or 500 nm or more, and may be, for example, about 2 μm. For example, the step formation layer 33 may be formed as follows. First, after the entire surface of the substrate 11 is coated with, for example, a photosensitive polyimide resin, a connection hole for connection between the lower electrode (the lower electrode 14 in FIG. 1) and the TFT layer 12 is formed. Subsequently, a mask having an aperture in a portion other than the region where the red EL device 10R is to be formed is prepared, and half-exposure is performed with use of this mask. Thus, a part in a thickness direction of a portion corresponding to the aperture of the photosensitive polyimide resin is removed to from the step formation layer 33.

After the step formation layer 33 is provided, the lower electrode 14 and the partition wall 15 are formed. Subsequently, the hole injection layer 161 and the hole transport layer 162 are formed in this order on an entire surface of the step formation layer 33 (FIGS. 24B and 24C). Subsequently, the entire surface of the hole transport layer 162 is coated with an ink including the material of the green light-emitting layer 163G to form the green material layer 163GA (FIG. 24D).

Subsequently, as illustrated in FIG. 25A, the mask 2G is formed in the region where the green organic EL device 10G is to be formed by, for example, the reverse offset printing method. Thereafter, a portion exposed from the mask 21G of the green material layer 163GA is removed by, for example, wet etching or dry etching to form the green light-emitting layer 163G (FIG. 25B).

Subsequently, after the entire surface of the blanket (not illustrated) is coated with an ink including the material of the red light-emitting layer 163R, the blanket and the substrate 11 face each other. At this time, a portion in the region where the red organic EL device 10R is to be formed of the hole transport layer 162 is disposed closer to the blanket than the other portion of the hole transport layer 162 by the protrusion 33A of the step formation layer 33. Thereafter, when the blanket is pressed against the substrate 11, a portion on the protrusion 33A of the hole transport layer 162 is selectively brought into contact with the blanket to form the red light-emitting layer 163R (FIG. 25C). After the red light-emitting layer 163R is formed, the mask 21G is removed (FIG. 25D).

In this method, forming the step formation layer 33 makes it possible to selectively bring the ink including the material of the red light-emitting layer 163R applied to the blanket in a solid film form as described above into contact with the region where the red organic EL device 10R is to be formed. In other words, a process of forming a predetermined pattern on the blanket with use of the plate is unnecessary. This makes it possible to reduce the number of manufacturing processes and cost.

Modification Example 4-5

After the step formation layer 33 is formed, a liquid-repellent mask (the mask 22G) described in the second embodiment may be formed (FIGS. 26A to 26C). In FIGS. 26A to 26C, the substrate 11, the TFT layer 12, the lower electrode 14, and the partition wall 15 (all of which are illustrated in FIG. 21) are not illustrated.

More specifically, after the TFT layer 12, the step formation layer 33, the lower electrode 14, the partition wall 15, the hole injection layer 161, and the hole transport layer 162 are formed in this order on the substrate 11, the liquid-repellent mask 22G having the aperture 22GM in the region where the green organic EL device 10G is to be formed is provided (FIG. 26A). Subsequently, the ink including the material of the green light-emitting layer 163G is applied to form the green light-emitting layer 163G (FIG. 26B). Thereafter, the red light-emitting layer 163R is formed with use of the blanket (FIG. 26C).

Modification Example 5

Modification Example 5-1

FIG. 27 illustrates a configuration of a display unit (a display unit 3) manufactured by a method according to Modification Example 5. This display unit 3 includes hole transport layers 162R, 162G, and 162B separated for each red organic EL device 10R, each green organic EL device 10G, and each blue organic EL device 10B, respectively. The display unit 3 has a similar configuration to that of the display unit 1 according to the foregoing first embodiment except for this point.

The hole transport layer 162R, the hole transport layer 162G, and the hole transport layer 162B are provided in the red organic EL device 10R, the green organic EL device 10G, and the blue organic EL device 10B, respectively. Thicknesses of the hole transport layers 162R, 162G, and 162B may be equal to or different from one another. The thicknesses of the hole transport layers 162R, 162G, and 162B are adjustable according to respective devices (the red organic EL device 10R, the green organic EL device 10G, and the blue organic EL device 10B, respectively) by patterning the hole transport layer 162R, 162G, and 162B for the respective devices. For example, in a case where the display unit 3 is a top emission display unit, cavities of the red organic EL device 10R, the green organic EL device 10G, and the blue organic EL device 10B are adjustable by the thicknesses of the hole transport layers 162R, 162G, and 162B in addition to the thicknesses of the red light-emitting layer 163R, the green light-emitting layer 163G, and the blue light-emitting layer 163B. This makes it possible to improve display characteristics of the display unit 3.

For example, the hole transport layers 162R, 162G, and 162B may be formed as follows (FIGS. 28A to 28D). In FIGS. 28A to 28D, the substrate 11, the TFT layer 12, the planarization layer 13, the lower electrode 14, and the partition wall 15 (all of which are illustrated in FIG. 27) are not illustrated.

First, after layers to the hole injection layer 161 are formed, a hole transport material layer 162RA is formed on the entire surface of the hole injection layer 161. Subsequently, as illustrated in FIG. 28A, a mask 24R is selectively formed in a region where the red organic EL device 10R is to be formed on the hole transport material layer 162RA. In a similar manner to that in the mask 21R, the mask 24R may be formed of, for example but not limited to, a fluorine resin, a water-soluble resin, or an alcohol-soluble resin by the reverse offset printing method. The mask 24R (and a mask 24G that will be described later) may be formed by not only the reverse offset printing method but also, for example but not limited to, flexographic printing, gravure printing, gravure offset printing, offset printing, or screen printing. The mask 24R may be formed with use of, for example but not limited to, an ink-jet method, a nozzle printing method, or a laser transfer method. Subsequently, a portion exposed from the mask 24R of the hole transport material layer 162RA may be removed by, for example, wet etching or dry etching (FIG. 28B). Thus, the hole transport layer 162R is formed.

Subsequently, a hole transport material layer 162GA is formed on the hole injection layer 161 where the hole transport layer 162R are provided (FIG. 28C). The mask 24R may be covered with the hole transport material layer 162GA. The hole transport material layer 162GA may be made of the same material as that of the hole transport material layer 162RA, and may have a different thickness from the thickness of the hole transport material layer 162RA. Subsequently, as illustrated in FIG. 28D, after the mask 24G is formed in a region where the green organic EL device 10G is to be formed on the hole transport material layer 162GA, a portion exposed from the mask 24G of the hole transport material layer 162GA is removed (not illustrated). Thus, the hole transport layer 162G is formed. The hole transport layer 162B is formed in a similar manner. The hole transport layers 162R, 162G, and 162B may be formed in any order.

Modification Example 5-2

The hole transport layers 162R, 162G, and 162B may be formed with use of a liquid-repellent mask (masks 25R and 25G) (FIGS. 29A to 29D). In FIGS. 29A to 29D, the substrate 11, the TFT layer 12, the planarization layer 13, the lower electrode 14, and the partition wall 15 (all of which are illustrated in FIG. 27) are not illustrated.

More specifically, first, the liquid-repellent mask 25R having an aperture 25RM in a region where the red organic EL device 10R is to be formed is formed on the hole injection layer 161. In a similar manner to that in the mask 22R described in the foregoing second embodiment, the mask 25R may be formed of, for example, a fluorine-based resin with use of the reverse offset printing method (FIG. 29A). The mask 25R (and the mask 25G that will be described later) may be formed by not only the reverse offset printing method but also, for example but not limited to, flexographic printing, gravure printing, gravure offset printing, offset printing, or screen printing. The mask 25R may be formed with use of, for example but not limited to, an ink-jet method, a nozzle printing method, or a laser transfer method. The mask 25R may be formed by performing liquid-repellent treatment such as fluorine plasma treatment on a water-soluble resin or an alcohol-soluble resin. After the mask 25R is provided, the hole injection layer 61 is coated with the ink including the material of the hole transport layer 162R to form the hole transport layer 162R (FIG. 29B).

Subsequently, as illustrated in FIG. 29C, after the mask 25R is dissolved in, for example, a solvent to be removed, the liquid-repellent mask 25G having an aperture 25GM in a region where the green organic EL device 10G is to be formed is formed on the hole injection layer 161 (FIG. 29D). The mask 25G is formed in contact with the hole injection layer 161, and is also formed on the hole transport layer 162R. After the mask 25G is formed, the hole injection layer 161 is coated with an ink in which the material of the hole transport layer 162G is dissolved in a solvent to form the hole transport layer 162G (not illustrated). The hole transport layer 162B is formed in a similar manner.

Modification Example 6

As illustrated in FIG. 30, the blue light-emitting layer of the display unit 3 may be a common blue light-emitting layer 263B shared by the red organic EL devices 10R, the green organic EL devices 10G, and the blue organic EL devices 10B. The connection layer 266 may be formed between the blue light-emitting layer 263B and the hole transport layers 162R, 162G, and 162B.

In this display unit 3, the hole transport layers 162R, 162G, and 162B may be formed in a similar manner to that in the foregoing Modification Example 5. After the hole transport layers 162R, 162G, and 162B are provided, the red light-emitting layer 163R and the green light-emitting layer 163G are formed in a similar manner to that described in the foregoing Modification Examples 4-1 to 4-5. Thereafter, the connection layer 266 and the blue light-emitting layer 263B are formed in this order.

Modification Example 7

As illustrated in FIG. 31, the hole transport layer 162R and 162G may be formed in the red organic EL device 10R and the green organic EL device 10G, and the hole transport layer may be omitted in the blue organic EL device 10B. The hole transport function of the blue organic EL device 10B is maintained by forming the connection layer 266.

Modification Example 8

Modification Example 8-1

As illustrated in FIG. 32, the hole transport layer 162R may be formed only in the red organic EL device 10R, and the hole transport layers of the blue organic EL device 10B and the green organic EL device 10G may be omitted.

For example, the hole transport layer 162R, the red light-emitting layer 163R, and the green light-emitting layer 163G of the display unit 3 may be formed as follows in a similar manner to that described in the foregoing first embodiment (FIGS. 33A to 35C). In FIGS. 33A to 35C, the substrate 11, the TFT layer 12, the planarization layer 13, the lower electrode 14, and the partition wall 15 (all of which are illustrated in FIG. 32) are not illustrated.

First, after the hole transport layer 162 is provided on the entire surface the hole injection layer 161, the mask 24R is formed in a region where the red organic EL device 10R is to be formed on the hole transport layer 162 in the foregoing manner (FIG. 33A). Subsequently, a portion exposed from the mask 24R of the hole transport layer 162 is removed to form the hole transport layer 162R (FIG. 33B). Subsequently, after the mask 24R is removed (FIG. 33C), the entire surface of the hole injection layer 161 is coated with the ink including the material of the red light-emitting layer 163R to form the red material layer 163RA (FIG. 33D). At this time, the red material layer 163RA is formed to cover the hole transport layer 162R.

After the red material layer 163RA is provided, the mask 21R is formed in a region where the red organic EL device 10R is to be formed on the red material layer 163RA (FIG. 34A), and a portion exposed from the mask 21R of the red material layer 163RA is removed (FIG. 34B). Thus, the red light-emitting layer 163R is formed. Subsequently, the entire surface of the hole injection layer 161 is coated with the ink including the material of the green light-emitting layer 163G to form the green material layer 163GA (FIG. 34C). At this time, the mask 21R may be covered with the green material layer 163GA.

After the green material layer 163GA is provided, the mask 21G is formed in a region where the green organic EL device 10G is to be formed on the green material layer 163GA (FIG. 35A), and a portion exposed from the mask 21G of the green material layer 163GA is removed (FIG. 35B). Thus, the green light-emitting layer 163G is formed. Thereafter, the masks 21R and 21G are removed (FIG. 35C).

Modification Example 8-2

The hole transport layer 162R, the red light-emitting layer 163R, and the green light-emitting layer 163G may be formed by a combination of the method described in the foregoing first embodiment and the method described in the foregoing second embodiment (FIGS. 36A to 36D). In FIGS. 36A to 36D, the substrate 11, the TFT layer 12, the planarization layer 13, the lower electrode 14, and the partition wall 15 (all of which are illustrated in FIG. 32) are not illustrated.

After the red light-emitting layer 163R is formed with use of the mask 21R in the foregoing manner (FIG. 34B), the liquid-repellent mask 23G having an aperture in the region where the green organic EL device 10G is to be formed is formed (FIG. 36A). At this time, the mask 23G is formed to cover a top surface and a side surface of a laminate configured of the hole transport layer 162R, the red light-emitting layer 163R, and the mask 23R.

After the mask 23G is formed, the ink including the material of the green light-emitting layer 163G is provided on the hole injection layer 161 (FIG. 36B) to form the green light-emitting layer 163G (FIG. 36C). At this time, as described in the foregoing Modification Example 2, since the side surface of the red light-emitting layer 163R is covered with the mask 23G, this makes it possible to suppress entry of the ink into the red light-emitting layer 163R and to prevent side etching of the red light-emitting layer 163R.

Third Embodiment

In a method of manufacturing the display unit 1 according to a third embodiment of the technology, films of materials of at least second and following light-emitting layers 163 (for example, the green light-emitting layer 163G and the blue light-emitting layer 163B in FIGS. 8A to 9C) that are to be formed are formed with use of an evaporation method. As the evaporation method, for example, a vacuum evaporation method may be used. A film of one kind of material may be formed with use of the evaporation method, or films of a plurality of materials may be formed by co-evaporation. The display unit 1 is manufactured in a similar manner to that in the foregoing first embodiment except for this point.

In a case where the light-emitting layer 163 is formed with use of a coating method such as a slit coating method, a spin coating method, and an ink-jet method, states illustrated in FIGS. 37A to 37C may be caused. FIG. 37A illustrates a state in which a part of the red light-emitting layer 163R is dissolved in the solvent of the ink when the green material layer 163GA is applied after providing the red light-emitting layer 163R. There is a possibility that the pattern of the light-emitting layer 163 (the red light-emitting layer 163R) formed previously is impaired in such a manner when the ink (the green material layer 163GA) of the second and following light-emitting layers 163 is applied. FIG. 37B illustrates a state in which the green material layer 13GA is repelled by the mask 21R on the red light-emitting layer 163R. In this case, the green material layer 163GA is not allowed to be uniformly applied. FIG. 37C illustrates a creeping-up region 163GR formed when the green material layer 163GA is applied. A height difference is caused on the substrate 11 by providing the red light-emitting layer 163R and the mask 21R. The thickness of the green material layer 163GA is increased in proximity to this height difference to form the creeping-up region 163GR. Since there is a possibility that such a creeping-up region 163GR exerts an influence on light emission characteristics, it is necessary to form the green light-emitting layer 163G in a portion other than the creeping-up region 163GR.

However, in this embodiment, the films of the materials of at least the second and following light-emitting layers 163 that are to be formed are formed on the substrate 11 with use of the evaporation method; therefore, this makes it possible to avoid the states illustrated in FIGS. 37A to 37C. More specifically, since the evaporation method is used, the previously-formed light-emitting layer 163 (the red light-emitting layer 163R) is not dissolved in the solvent, thereby maintaining a pattern with the same planar shape as that of the mask 21R. Moreover, ink repellence caused by the mask 21R and the formation of the creeping-up region 163GR are preventable; therefore, the light-emitting layer 163 (the green light-emitting layer 163G) with a uniform film thickness is formed easily. Accordingly, this makes it possible to improve flexibility in pixel design. The light-emitting layer 163 with a uniform film thickness makes it possible to improve light emission characteristics. Moreover, the light-emitting layer 163 formed by the evaporation method is expected to achieve an improvement in device characteristics and device lifetime, compared to the light-emitting layer 163 formed with use of the coating method.

Since the foregoing creeping-up region 163GR is formed also by a height difference caused by respective components (for example but not limited to, the TFT layer and the partition wall) on the substrate 11, forming films of the materials of all of the light-emitting layers 163 with use of the evaporation method makes it possible to form the light-emitting layer 163 with a further uniform film thickness.

A light-emitting layer (the light-emitting layer 263) of a hybrid organic EL display unit (for example, the display unit 2 in FIG. 19 and the display unit 2A in FIG. 21) may be formed with use of the evaporation method. The hole transport layers 162R, 162G, and 162B in the foregoing Modification Example 5 (FIG. 27) may be formed with use of the evaporation method.

As described in the second embodiment (FIGS. 14A to 16C), after the liquid-repellent masks 22R, 22G, and 22B are formed, the film of the material of the light-emitting layer 163 may be formed with use of the evaporation method.

Modification Example 9

FIG. 38 illustrates a configuration of a display unit (a display unit 4) manufactured by a method according to Modification Example 9. The display unit 4 includes hole injection layers 161R, 161G, and 161B and the hole transport layers 162R, 162G, and 162B separated for each red organic EL device 10R, each green organic EL device 10G, and each blue organic EL device 10B, respectively. The display unit 4 has a similar configuration to that of the display unit 1 according to the foregoing first embodiment except for this point.

The hole injection layer 161R and the hole transport layer 162R are provided in the red organic EL device 10R, the hole injection layer 161G and the hole transport layer 162G are provided in the green organic EL device 10G, and the hole injection layer 161B and the hole transport layer 162B are provided in the blue organic EL device 10B. The thicknesses of the hole injection layers 161R, 161G, and 161B may be the same as or different from one another. The thicknesses of the hole transport layers 162R, 162G, and 162B may be the same as or different from one another. The thicknesses of the hole injection layers 161R, 161G, and 161B and the hole transport layers 162R, 162G, and 162B are adjustable according to respective devices (the red organic EL device 10R, the green organic EL device 10G, and the blue organic EL device 10B) by patterning the hole injection layers 161R, 161G, and 161B and the hole transport layers 162R, 162G, and 162B for the respective devices. For example, in a case where the display unit 4 is a top emission display unit, cavities of the red organic EL device 10R, the green organic EL device 10G, and the blue organic EL device 10B are adjustable by the thicknesses of the hole injection layer 161R, 161G, and 161B and the hole transport layers 162R, 162G, and 162B in addition to the thicknesses of the red light-emitting layer 163R, the green light-emitting layer 163G, and the blue light-emitting layer 163B. This makes it possible to improve display characteristics of the display unit 4.

For example, the hole injection layers 161R, 161G, and 161B and the hole transport layers 162R, 162G, and 162B may be formed as follows (FIGS. 39A to 41C). In FIGS. 39A to 41C, the partition wall 15 (illustrated in FIG. 38) is not illustrated.

First, after layers to the lower electrode 14 are formed in a similar manner to that in the display unit 1, a hole injection material layer 161RA, a hole transport material layer 162RA, and the red material layer 163RA are formed in this order on the entire surface of the substrate 11 (FIG. 39A). The hole injection material layer 161RA, the hole transport material layer 162RA, and the red material layer 163RA may be formed with use of a coating method (the first embodiment) or may be formed with use of an evaporation method (the third embodiment). Subsequently, as illustrated in FIG. 39B, the mask 21R is selectively formed in a region where the red organic EL device 10R is to be formed on the red material layer 163RA. Subsequently, portions exposed from the mask 21R of the hole injection material layer 161RA, the hole transport material layer 162RA, and the red material layer 163RA are removed by, for example, wet etching or dry etching (FIG. 39C). Thus, the hole injection layer 161R, the hole transport layer 162R, and the red light-emitting layer 163R are formed.

Subsequently, a hole injection material layer 161GA, the hole transport material layer 162GA, and the green material layer 163GA are formed in this order on the substrate 11 where the hole injection layer 161R, the hole transport layer 162R, and the red light-emitting layer 163R are provided (FIG. 40A). The mask 21R may be covered with the hole injection material layer 161GA, the hole transport material layer 162GA, and the green material layer 163GA. Subsequently, as illustrated in FIG. 40B, after the mask 21G is formed in a region where the green organic EL device 10G is to be formed on the green material layer 163GA, portions exposed from the mask 21G of the hole injection material layer 161GA, the hole transport material layer 162GA, and the green material layer 163GA are removed (FIG. 40C). Thus, the hole injection layer 161G, the hole transport layer 162G, and the green light-emitting layer 163G are formed.

Subsequently, a hole injection material layer 161BA, a hole transport material layer 162BA, and the blue material layer 163BA are formed in this order on the substrate 11 where the hole injection layer 161G, the hole transport layer 162G, and the green light-emitting layer 163G are provided (FIG. 41A). The masks 21R and 21G may be covered with the hole injection material layer 161BA, the hole transport material layer 162BA, and the blue material layer 163BA. Subsequently, as illustrated in FIG. 41B, after the mask 21B is formed in a region where the blue organic EL device 10B is to be formed on the blue material layer 163BA, portions exposed from the mask 21B of the hole injection material layer 161BA, the hole transport material layer 162BA, and the blue material layer 163BA are removed (FIG. 41C). Thus, the hole injection layer 161B, the hole transport layer 162B, and the blue light-emitting layer 163B are formed. The red organic EL device 10R, the green organic EL device 10G, and the blue organic EL device 10B may be formed in any order.

After the hole injection layers 161R, 161G, and 161B are provided, a common hole transport layer shared by the red organic EL devices 10R, the green organic EL devices 10G, and the blue organic EL devices 10B may be formed.

The hole injection layers 161R, 161G, and 161B, the hole transport layer 162R, 162G, and 162B, the red light-emitting layer 163R, the green light-emitting layer 163G, and the blue light-emitting layer 163B may be formed with use of a liquid-repellent mask (the masks 22R, 22G, and 22B).

Modification Example 10

FIG. 42 illustrates a configuration of a display unit (a display unit 5) manufactured by a method according to Modification Example 10. The display unit 5 includes electron transport layers 164R, 164G, and 164B and electron injection layers 165R, 165G, and 165B separated for each red organic EL device 10R, each green organic EL device 10G, and each blue organic EL device 10B, respectively. The display unit 5 has a similar configuration to that of the display unit 1 according to the foregoing first embodiment except for this point.

The electron transport layer 164R and the electron injection layer 165R are provided in the red organic EL device 10R, the electron transport layer 164G and the electron injection layer 165G are provided in the green organic EL device 10G, and the electron transport layer 164B and the electron injection layer 165B are provided in the blue organic EL device 10B. Thicknesses of the electron transport layers 164R, 164G, and 164B may be the same as or different from one another. Thicknesses of the electron injection layers 165R, 165G, and 165B may be the same as or different from one another. Thus, the thicknesses of the electron transport layers 164R, 164G, and 164B and the electron injection layers 165R, 165G, and 165B are adjustable according to respective devices (the red organic EL device 10R, the green organic EL device 10G, and the blue organic EL device 10B) by patterning the electron transport layers 164R, 164G, and 164B and the electron injection layers 165R, 165G, and 165B for the respective devices. For example, in a case where the display unit 5 is a top emission display unit, cavities of the red organic EL device 10R, the green organic EL device 10G, and the blue organic EL device 10B are adjustable by the thicknesses of the electron transport layers 164R, 164G, and 164B and the electron injection layers 165R, 165G, and 165B in addition to the thicknesses of the red light-emitting layer 163R, the green light-emitting layer 163G, and the blue light-emitting layer 163B. This makes it possible to improve display characteristics of the display unit 5.

For example, the electron transport layers 164R, 164G, and 164B and the electron injection layers 165R, 165G, and 165B may be formed as follows (FIGS. 43A to 45C). In FIGS. 43A to 44C, the partition wall 15 (illustrated in FIG. 42) is not illustrated.

First, after layers to the hole transport layer 162 are formed in a similar manner to that in the display unit 1, the red material layer 163RA, the electron transport material layer 164RA, and the electron injection material layer 165RA are formed in this order on the entire surface of the hole transport layer 162 (FIG. 43A). The red material layer 163RA, the electron transport material layer 164RA, and the electron injection material layer 165RA may be formed with use of a coating method (the first embodiment), or may be formed with use of an evaporation method (the third embodiment). Subsequently, as illustrated in FIG. 43B, a mask 26R is selectively formed in a region where the red organic EL device 10R is to be formed on the electron injection material layer 165RA. The mask 26R is formed of a similar material to that described in the foregoing masks 21R, 21G, and 21B by, for example, a reverse offset printing method to be in contact with the electron injection material layer 165RA. The mask 26R (and masks 26G and 26B that will be describe later) may be formed by not only the reverse offset printing method but also, for example but not limited to, flexographic printing, gravure printing, gravure offset printing, offset printing, or screen printing. The mask 26R may be formed with use of, for example but not limited to, an ink-jet method, a nozzle printing method, or a laser transfer method. Subsequently, portions exposed from the mask 26R of the red material layer 163RA, the electron transport material layer 164RA, and the electron injection material layer 165RA are removed by, for example, wet etching or dry etching (FIG. 43C). Thus, the red light-emitting layer 163R, the electron transport layer 164R, and the electron injection layer 165R are formed.

Subsequently, the green material layer 163GA, the electron transport material layer 164GA, and the electron injection material layer 162GA are formed in this order on the hole transport layer 162 where the red light-emitting layer 163R, the electron transport layer 164R, and the electron injection layer 165R are provided (FIG. 44A). Subsequently, as illustrated in FIG. 44B, the mask 26G is formed in a region where the green organic EL device 10G is to be formed on the electron injection material layer 165GA. Subsequently, portions exposed from the mask 26G of the green material layer 163GA, the electron transport material layer 164GA, and the electron injection material layer 165GA are removed (FIG. 44C). Thus, the green light-emitting layer 163G, the electron transport layer 164G, and the electron injection layer 165G are formed.

Subsequently, the blue material layer 163BA, the electron transport material layer 164BA, and the electron injection material 165BA are formed in this order on the hole transport layer 162 where the green light-emitting layer 163G, the electron transport layer 164G, and the electron injection layer 165G are provided (FIG. 45A). Subsequently, as illustrated in FIG. 45B, the mask 26B is formed in a region where the blue organic EL device 10B is to be formed on the electron injection material layer 165BA. Subsequently, portions exposed from the mask 26B of the blue material layer 163BA, the electron transport material layer 164BA, and the electron injection material layer 165BA are removed (FIG. 45C). Thus, the blue light-emitting layer 163B, the electron transport layer 164B, and the electron injection layer 165B are formed. The red organic EL device 10R, the green organic EL device 10G, and the blue organic EL device 10B may be formed in any order.

In this modification example, after other organic material layers (the electron transport material layers 164RA, 164GA, and 164BA and the electron injection material layers 165RA, 165GA, and 165BA) are provided on the red material layer 163RA, the green material layer 163GA, and the blue material layer 163BA, the masks 26R, 26G, and 26B are formed. This makes it possible to prevent the materials of the masks 26R, 26G, and 26B from remaining on the red material layer 163RA, the green material layer 163GA, and the blue material layer 163BA (the red light-emitting layer 163R, the green light-emitting layer 163G, and the blue light-emitting layer 163B). Moreover, this also makes it possible to prevent the surfaces of the red light-emitting layer 163R, the green light-emitting layer 163G, and the blue light-emitting layer 163B from being dissolved when the masks 26R, 26G, and 26B are removed. Accordingly, this makes it possible to maintain light emission characteristics of the red light-emitting layer 163R, the green light-emitting layer 163G, and the blue light-emitting layer 163B.

The electron injection layer shared by the red organic EL devices 10R, the green organic EL devices 10G, and the blue organic EL devices 10B may be formed after the electron transport layers 164R, 164G, and 164B are provided. The electron transport layer may be formed of a laminate configuration including a plurality of layers, and some of the layers of the electron transport layer may be formed for each of the red organic EL devices 10R, the green organic EL devices 10G, and the blue organic EL devices 10B.

The red light-emitting layer 163R, the green light-emitting layer 163G, the blue light-emitting layer 163B, the electron transport layers 164R, 164G, and 164B, and the electron injection layers 165R, 165G, and 165B may be formed with use of a liquid-repellent mask (the masks 22R, 22G, and 22B).

Modification Example 11

FIG. 46 illustrates a configuration of a display unit (a display unit 6) manufactured by a method according to Modification Example 11. In this display unit 6, all organic layers 16 are separated for each of the red organic EL devices 10R, the green organic EL devices 10G, and the blue organic EL devices 10B. The display unit 6 has a similar configuration to that of the display unit 1 according to the foregoing first embodiment except for this point.

In the red organic EL device 10R, the hole injection layer 161R, the hole transport layer 162R, the red light-emitting layer 163R, the electron transport layer 164R, and the electron injection layer 165R are provided as the organic layer 16, in the green organic EL device 10G, the hole injection layer 161G, the hole transport layer 162G, the green light-emitting layer 163G, the electron transport layer 164G, and the electron injection layer 165G are provided as the organic layer 16, and in the blue organic EL device 10B, the hole injection layer 161B, the hole transport layer 162B, the blue light-emitting layer 163B, the electron transport layer 164B, and the electron injection layer 165B are provided as the organic layer 16.

For example, the organic layer 16 separated for respective devices may be formed as follows (FIGS. 47A to 49C). In FIGS. 47A to 49C, the partition wall 15 (illustrated in FIG. 46) is not illustrated.

First, after layers to the lower electrode 14 are formed in a similar manner to that in the display unit 1, the hole injection material layer 161RA, the hole transport material layer 162RA, the red material layer 163RA, the electron transport material layer 164RA, and the electron injection material layer 164RA are formed in this order on the entire surface of the substrate 11 (FIG. 47A). The hole injection material layer 161RA, the hole transport material layer 162RA, the red material layer 163RA, the electron transport material layer 164RA, and the electron injection material layer 165RA may be formed with use of a coating method (the first embodiment), or may be formed with use of an evaporation method (the third embodiment). Subsequently, as illustrated in FIG. 47B, after the mask 26R is selectively formed in a region where the red organic EL device 10R is to be formed on the electron injection material layer 165RA, portions exposed from the mask 26R of the hole injection material layer 161RA, the hole transport material layer 162RA, the red material layer 163RA, the electron transport material layer 164RA, and the electron injection material layer 165RA are removed by, for example, wet etching or dry etching (FIG. 47C). Thus, the hole injection layer 161R, the hole transport layer 162R, the red light-emitting layer 163R, the electron transport layer 164R, and the electron injection layer 165R are formed.

Subsequently, the hole injection material layer 161GA, the hole transport material layer 162GA, the green material layer 163GA, the electron transport material layer 164GA, and the electron injection material layer 165GA are formed in this order on the substrate 11 where the hole injection layer 161R, the hole transport layer 162R, the red light-emitting layer 163R, the electron transport layer 164R, and the electron injection layer 165R are provided (FIG. 48A). The mask 26R may be covered with the hole injection material layer 161GA, the hole transport material layer 162GA, the green material layer 163GA, the electron transport material layer 164GA, and the electron injection material layer 165GA. Subsequently, as illustrated in FIG. 48B, the mask 26G is formed in a region where the green organic EL device 10G is to be formed on the electron injection material layer 165GA. Subsequently, portions exposed from the mask 26G of the hole injection material layer 161GA, the hole transport material layer 162GA, the green material layer 163GA, the electron transport material layer 164GA, and the electron injection material layer 165GA are removed (FIG. 48C). Thus, the hole injection layer 161G, the hole transport layer 162G, the green light-emitting layer 163G, the electron transport layer 164G, and the electron injection layer 165G are formed.

Subsequently, the hole injection material layer 161BA, the hole transport material layer 162BA, the blue material layer 163BA, the electron transport material layer 164BA, and the electron injection material layer 165BA are formed in this order on the substrate 11 where the hole injection layer 161G, the hole transport layer 162G, the green light-emitting layer 163G, the electron transport layer 164G, and the electron injection layer 165G are provided (FIG. 49A). The masks 26R and 26G may be covered with the hole injection material layer 161BA, the hole transport material layer 162BA, the blue material layer 163BA, the electron transport material layer 164BA, and the electron injection material layer 165BA. Subsequently, as illustrated in FIG. 49B, after the mask 26B is formed in a region where the blue organic EL device 10B is to be formed on the electron injection material layer 165BA, portions exposed from the mask 26B of the hole injection material layer 161BA, the hole transport material layer 162BA, the blue material layer 163BA, the electron transport material layer 164BA, and the electron injection material layer 165BA are removed (FIG. 49C). Thus, the hole injection layer 161B, the hole transport layer 162B, the blue light-emitting layer 163B, the electron transport layer 164B, and the electron injection layer 165B are formed. The red organic EL device 10R, the green organic EL device 10G, and the blue organic EL device 10B may be formed in any order.

The hole injection layers 161R, 161G, and 161B, the hole transport layer 162R, 162G, and 162B, the red light-emitting layer 163R, the green light-emitting layer 163G, the blue light-emitting layer 163B, the electron transport layers 164R, 164G, and 164B, and the electron injection layers 165R, 165G, and 165B may be formed with use of a liquid-repellent mask (the masks 22R, 22G, and 22B).

Modification Example 12

A part of the organic layer 16 provided separately for each device may overlap a part of the organic layer 16 in a device adjacent thereto (Modification Example 12).

FIG. 50 illustrates a state in which a part of the red light-emitting layer 163R is formed to overlap a part of the green light-emitting layer 163G. In FIG. 50, the substrate 11, the TFT layer 12, the planarization layer 13, the lower electrode 14, and the partition wall 15 (all of which are illustrated in FIG. 1) are omitted. Thus, providing parts of the light-emitting layers 163 in adjacent devices to overlap each other makes it possible to improve resolution. Description about this will be given below.

As illustrated in FIG. 51, the red light-emitting layer 163R, the green light-emitting layer 163G, and the blue light-emitting layer 163B are formed to allow their widths to extend by a distance MA from an end of an aperture of the partition wall 15. One reason for this is that an error upon manufacturing is caused by, for example but not limited to, displacement between the position of the aperture of the partition wall 15 and the position where the light-emitting layer 163 is formed, and a difference between the size of the aperture of the partition wall 15 and the size of the light-emitting layer 163. The distance MA is determined with consideration of straightness of an end (a planar view) of the light-emitting layer 163, and variation in a side etching amount of the light-emitting layer 63 in addition to this. Moreover, during etching of the light-emitting layer 163, a portion with a nonuniform film thickness is formed at the end of the light-emitting layer 163, and the distance MA is determined with consideration of this portion as well.

A distance MB is a distance between an end of the red light-emitting layer 163R, the green light-emitting layer 163G, or the blue light-emitting layer 163B and a light emission region (the aperture of the partition wall 15) of a device adjacent thereto. Providing the distance MB makes it possible to reduce an influence of the red light-emitting layer 163R, the green light-emitting layer 163G, or the blue light-emitting layer 163B on light emission of the device adjacent thereto. In order to improve a pixel pitch, i.e., resolution, it is necessary to minimize the distance MA and the distance MB. Since the distance MA and the distance MB are reduced by allowing the parts of the light-emitting layers 163 of adjacent devices to overlap each other within a range where the light emission regions of the adjacent devices are not affected, an improvement in resolution is achievable.

FIGS. 52A to 52C illustrate states in which the masks 21R, 21G, and 21G illustrated in FIG. 50 are removed. As illustrated in FIG. 52A, the mask 21R may remain in a portion where the red light-emitting layer 163R and the green light-emitting layer 163G overlap each other. As illustrated in FIG. 52B, the red light-emitting layer 163R and the green light-emitting layer 163G may overlap each other, and the mask 21 may be completely removed. As illustrated in FIG. 52C, a portion overlapping the red light-emitting layer 163R of the green light-emitting layer 163G may be removed.

States of the red light-emitting layer 163R, the green light-emitting layer 163G, and the blue light-emitting layer 163B after the masks 21R, 21G, and 21B are removed depend on, for example but not limited to, the material of the light-emitting layer 163, the materials of the masks 21R, 21G, and 21B, the kinds of the solvents of the masks 21R, 21G, and 21B, and dissolving conditions for the masks 21R, 21G, and 21B. For example, in a case where a material with a large intermolecular bonding force is used for the light-emitting layer 163, the light-emitting layer 163 is prone to be turned to the state illustrated in FIG. 52A or 52B. In a case where a material with a small intermolecular bonding force is used for the light-emitting layer 163, a portion overlapping the red light-emitting layer 163R of the green light-emitting layer 163 is easily removed. In other words, the light-emitting layer 163 is easily turned into the state illustrated in FIG. 52C. In a case where a solvent with high solubility and high permeability is used as the solvent of the masks 21R, 21G, and 21B, the light-emitting layer 163 is prone to be turned to a state in which the mask 21R is completely removed (the state illustrated in FIG. 52B or FIG. 52C).

In FIGS. 50 to 52C, the state in which the light-emitting layers 163 of adjacent devices are formed to overlap each other in part is described; however, the organic layers 16, other than the light-emitting layer 163, provided separately for each device (for example but not limited to, the hole injection layer, the hole transport layer, the electron transport layer, and the electron injection layer) may overlap the organic layers 16 other than the light-emitting layer 163 of a device adjacent thereto.

Module and Application Examples

Application Examples of the display units 1, 2, 2A, 3, 4, 5, and 6 described in the foregoing embodiments and the foregoing modification examples will be described below. The display units according to the foregoing embodiments and other examples are applicable to display units of electronic apparatuses, in any fields, that display an image signal inputted from outside or an image signal produced inside as an image or a picture, such as televisions, digital still cameras, notebook personal computers, mobile terminal units such as mobile phones, and video cameras.

(Module)

The display units according to the foregoing embodiments and other examples may be incorporated as, for example, a module illustrated in FIG. 53 into various electronic apparatuses such as Application Examples 1 to 5 that will be described later. This module may be configured, for example, by providing a region 210 exposed from the protective film and a sealing substrate 18 on one side of the substrate 11 and extending wiring lines of the signal line drive circuit 120 and the scanning line drive circuit 130 to form an external connection terminal (not illustrated) in the exposed region 210. A flexible printed circuit (FPC) 220 for signal input and output may be provided to the external connection terminal.

Application Example 1

FIG. 54 illustrates an appearance of a television to which one of the display units according to the foregoing embodiments and other examples is applied. This television may include, for example, an image display screen section 300 including a front panel 310 and a filter glass 320, and the image display screen section 300 is configured of one of the display units 1, 2, 2A, 3, 4, 5, and 6 according to the foregoing embodiments and other examples.

Application Example 2

FIGS. 55A and 55B illustrate appearances of a digital still camera to which one of the display units according to the foregoing embodiments and other examples is applied. This digital still camera may include, for example, a light-emitting section 410 for a flash, a display section 420, a menu switch 430, and a shutter button 440, and the display section 420 is configured of one of the display units 1, 2, 2A, 3, 4, 5, and 6 according to the foregoing embodiments and other examples.

Application Example 3

FIG. 56 illustrates an appearance of a notebook personal computer to which one of the display units according to the foregoing embodiments and other examples is applied. This notebook personal computer may include, for example, a main body 510, a keyboard 520 for operation of inputting, for example but not limited to, characters, and a display section 530 that displays an image, and the display section 530 is configured of one of the display units 1, 2, 2A, 3, 4, 5, and 6 according to the foregoing embodiments and other examples.

Application Example 4

FIG. 57 illustrates an appearance of a video camera to which one of the display units according to the foregoing embodiments and other examples is applied. This video camera may include, for example, a main body section 610, a lens 620 provided on a front side surface of the main body section 610 and for shooting an image of a subject, a shooting start and stop switch 630, and a display section 640, and the display section 640 is configured of one of the display units 1, 2, 2A, 3, 4, 5, and 6 according to the foregoing embodiments and other examples.

Application Example 5

FIGS. 58A and 58B illustrate appearances of a mobile phone to which one of the display units according to the foregoing embodiments and other examples is applied. This mobile phone may have a configuration in which, for example, a top-side enclosure 710 and a bottom-side enclosure 720 are connected together through a connection section (hinge section) 730, and the mobile phone may include a display 740, a sub-display 750, a picture light 760, and a camera 770. The display 740 or the sub-display 750 is configured of one of the display units 1, 2, 2A, 3, 4, 5, and 6 according to the foregoing embodiments and other examples.

(Illumination Unit)

An illumination unit may be configured of the red organic EL devices 10R, the green organic EL devices 10G, and the blue organic EL devices 10B described in the foregoing embodiments and the foregoing modification examples. FIGS. 43 and 44 illustrate appearances of a desk illumination unit configured by providing a plurality of red organic EL devices 10R, a plurality of green organic EL devices 10G, and a plurality of organic EL devices 10B. The illumination unit may include, for example, an illumination section 43 attached to a rod 42 provided on a base 41, and the illumination section 43 is configured of the red organic EL devices 10R, the green organic EL devices 10G, and the blue organic EL devices 10B in one of the foregoing embodiments and other examples. When the illumination section 43 uses a flexible substrate such as a resin substrate as the substrate 11, the illumination section 43 may have any shape such as a tubular shape illustrated in FIG. 59 or a curved shape illustrated in FIG. 60.

FIG. 61 illustrates an appearance of a room illumination unit to which the red organic EL devices 10R, the green organic EL devices 10G, and the blue organic EL devices 10B in one of the foregoing embodiments and other examples are applied. The illumination unit may include, for example, an illumination section 44 configured of the red organic EL devices 10R, the green organic EL devices 10G, and the blue organic EL devices 10B in one of the foregoing embodiments and other examples. The desired number of the illumination sections 44 are provided at desired intervals on a ceiling 50A of a building. It is to be noted that the illumination sections 44 may be disposed on any place such as a wall 50B or a floor (not illustrated) in addition to the ceiling 50A, depending on the intended use.

Although the technology is described referring to the embodiments and the modification examples, the technology is not limited thereto, and may be variously modified. For example, in the foregoing Modification Example 10, a case where the red light-emitting layer 163R, the green light-emitting layer 163G, and the blue light-emitting layer 163B, and the electron transport layers 164R, 164G, and 164B, and the electron injection layers 165R, 165G, and 165B are patterned is described; however, the electron injection layers 165R, 165G, and 165B may be formed after providing a common electron transport layer shared by the red organic EL devices 10R, the green organic EL devices 10G, and the blue organic EL devices 10B. The display units 4 and 5 according to Modification Examples 9 and 10 (FIGS. 38 and 42) may be hybrid organic EL display units (for example, the display unit 2 in FIG. 19 and the display unit 2A in FIG. 21).

Moreover, in the foregoing embodiments and other examples, a case where the organic layer 16 includes the hole injection layer 161, the hole transport layer 162, the light-emitting layer 163, the electron transport layer 164, and the electron injection layer 165 is described; however, layers other than the light-emitting layer 163 may be omitted if necessary.

Further, for example, in the foregoing embodiments and other examples, the active matrix display unit is described; however, a passive matrix display unit may be adopted.

Furthermore, for example, in the foregoing embodiments and other examples, a case where the first electrode 14 and the second electrode 17 serve as an anode and a cathode, respectively, is described; however, the first electrode 14 and the second electrode 17 may serve as a cathode and an anode, respectively.

In addition thereto, the material and thickness of each layer, the method and conditions of forming each layer are not limited to those described in the foregoing embodiments, and each layer may be made of any other material with any other thickness by any other method under any other conditions.

It is to be noted that the effects described in this description are merely examples; therefore, effects in the technology are not limited thereto, and the technology may have other effects.

It is to be noted that the technology may have following configurations.

(1) A method of manufacturing an organic light-emitting device including:
forming a first organic material layer on a substrate; and
forming a mask in a first region on the first organic material layer, and then selectively removing the first organic material layer to form a first organic layer in the first region.

(2) The method of manufacturing the organic light-emitting device according to (1), in which the mask is formed of one of a fluorine resin, a water-soluble resin, and an alcohol-soluble resin.

(3) The method of manufacturing the organic light-emitting device according to (1) or (2), in which after the first organic layer is formed, the mask is removed with use of a solvent not allowing the first organic layer to be dissolved therein.

(4) The method of manufacturing the organic light-emitting device according to any one of (1) to (3), in which the mask is formed by a reverse offset printing method.

(5) The method of manufacturing the organic light-emitting device according to any one of (1) to (4), further including forming one or a plurality of second organic layers after the first organic layer is formed.

(6) The method of manufacturing the organic light-emitting device according to (5), in which
a second organic material layer is formed on the substrate where the mask and the first organic layer are provided, and
after one other mask is formed in a second region on the second organic material layer, the second organic material layer is selectively removed to form the second organic layer in the second region.

(7) The method of manufacturing the organic light-emitting device according to (5) or (6), in which the first organic layer and the second organic layer each include a light-emitting layer.

(8) The method of manufacturing the organic light-emitting device according to (6), in which after the first organic layer and the second organic layer are formed, the mask and the other mask are removed.

(9) The method of manufacturing the organic light-emitting device according to (6), in which the second organic material layer is formed with use of an evaporation method.

(10) A method of manufacturing an organic light-emitting device including:
forming a liquid-repellent mask having an aperture in a first region on a substrate; and
thereafter forming a first organic layer in the first region.

(11) The method of manufacturing the organic light-emitting device according to (10), further including forming one or a plurality of second organic layers after the first organic layer is formed.

(12) The method of manufacturing the organic light-emitting device according to (11), in which after one other liquid-repellent mask having an aperture in a second region on the substrate is formed, the second organic layer is formed in the second region.

(13) The method of manufacturing the organic light-emitting device according to (12), in which the other mask is formed to cover a top surface and a side surface of the first organic layer.

(14) The method of manufacturing the organic light-emitting device according to (11), in which after the first organic layer is formed, the second organic layer is formed in the second region by a printing method.

(15) The method of manufacturing the organic light-emitting device according to (11), in which a step formation layer is formed on the substrate by allowing the second region to have a larger thickness than that of the first region, and the second organic layer is formed in the second region.

(16) The method of manufacturing the organic light-emitting device according to any one of (11) to (15), in which the first organic layer and the second organic layer each include a light-emitting layer.

(17) The method of manufacturing the organic light-emitting device according to claim (16), in which
a plurality of the second organic layers are formed, and
one or more of the second organic layers are formed in the second region, and one or more of the other second organic layers are formed to extend from the second region to the first region.

(18) The method of manufacturing the organic light-emitting device according to (17), in which
after the first organic layer is formed, a connection layer is formed, and
one or more of the other second organic layers are formed on an entire surface of the connection layer.

(19) A method of manufacturing a display unit including:
forming an organic light-emitting device, the forming of the organic light-emitting device including
forming a first organic material layer on a substrate, and
forming a mask in a first region on the first organic material layer, and then selectively removing the first organic material layer to form a first organic layer in the first region.

(20) A method of manufacturing a display unit including:
forming an organic light-emitting device, the forming of the organic light-emitting device including
forming a liquid-repellent mask having an aperture in a first region on a substrate, and
thereafter forming a first organic layer in the first region.

This application claims the benefit of Japanese Priority Patent Application JP 2013-194362 filed on Sep. 19, 2013, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A method of manufacturing an organic light-emitting device comprising:
    forming a first organic light-emitting material layer on a substrate;
    thereafter selectively forming a first mask in a first region on and in direct contact with a portion of the first light-emitting organic material layer, and then
    selectively removing the first organic light-emitting material layer which is not in the first region to form a first organic layer.

2. The method of manufacturing the organic light-emitting device according to claim 1, wherein the first mask includes one of a fluorine resin, a water-soluble resin, and an alcohol-soluble resin.

3. The method of manufacturing the organic light-emitting device according to claim 1, wherein after the first organic layer is formed, the first mask is removed with use of a solvent not allowing the first organic layer to be dissolved therein.

4. The method of manufacturing the organic light-emitting device according to claim 1, wherein the first mask is formed by a reverse offset printing method.

5. The method of manufacturing the organic light-emitting device according to claim 1, further comprising forming a second organic layer after the first organic layer is formed.

6. The method of manufacturing the organic light-emitting device according to claim 5, wherein
    a second organic light-emitting material layer is firstly formed on the first organic layer and the first organic material, and then
    a second mask is selectively formed in a second region on a portion of the second organic light-emitting material layer, the second region is different from the first region, and thereafter
    the second organic light-emitting material layer is selectively removed to form the second organic layer in the second region.

7. The method of manufacturing the organic light-emitting device according to claim 6, wherein after the first organic layer and the second organic layer are formed, the first mask and the second mask are removed.

8. The method of manufacturing the organic light-emitting device according to claim 6, wherein the second organic light-emitting material layer is formed with use of an evaporation method.

9. A method of manufacturing a display unit comprising:
    forming an organic light-emitting device, the forming of the organic light-emitting device including
    forming a first organic light-emitting material layer on a substrate;
    thereafter selectively forming a first mask in a first region on and in direct contact with a portion of the first organic light-emitting material layer, and then
    selectively removing the first organic light-emitting material layer which is not in the first region to form a first organic layer.

* * * * *